United States Patent [19]
Yamanouchi et al.

[11] Patent Number: 5,258,919
[45] Date of Patent: Nov. 2, 1993

[54] STRUCTURED LOGIC DESIGN METHOD USING FIGURES OF MERIT AND A FLOWCHART METHODOLOGY

[75] Inventors: Roy K. Yamanouchi, San Jose; D. Kevin Covey, Sunnyvale; Sandra G. Schneider, San Jose, all of Calif.

[73] Assignee: National Semiconductor Corporation, Santa Clara, Calif.

[21] Appl. No.: 546,376

[22] Filed: Jun. 28, 1990

[51] Int. Cl.$^5$ .............................................. G06F 15/60
[52] U.S. Cl. .................................... 364/489; 364/488
[58] Field of Search ................ 364/488, 489, 490, 491

[56] References Cited

U.S. PATENT DOCUMENTS

| | | | |
|---|---|---|---|
| 4,613,940 | 9/1986 | Shenton et al. | 364/490 |
| 4,703,435 | 10/1987 | Darringer et al. | 364/489 |
| 4,758,953 | 7/1988 | Morita et al. | 364/490 |
| 4,916,627 | 4/1990 | Hathaway | 364/490 |
| 4,922,432 | 5/1990 | Kobayashi et al. | 364/490 |

OTHER PUBLICATIONS

Minimization of Boolean Functions; F. J. Hill et al.; "Introduction to Switch Theory and Logical Design", 1973; pp. 79-116.
"Technology Adaptation in Logic Synthesis" by W. H. Joyner, Jr., IEEE 23rd Design Automation Conference, 1986, pp. 94-100.
"Automatic Generation of Digital System Schematic Diagrams" by A. Arya et al., IEEE 22nd Design Automation Conference, 1985, pp. 388-395.
"Cell Libraries and Assembly Tools for Analog/Digital CMOS and BiCMOS Application-Specific Integrated Circuit Design" by M. J. Smith et al., IEEE Journ. of Solid State Circuits, vol. 24, No. 5, Oct. 1989, pp. 1419-1432.
"Quality of Design from an Automatic Logic Generator (ALERT)" by T. D. Friedman et al., IEEE 7th Design Automation Conference, 1970, pp. 71-89.
"A New Look at Logic Synthesis" by J. A. Darringer et al., IEEE 17th Design Automation Conference, 1980, pp. 543-549.
"Hierarchical Logic Synthesis System for VLSI" by I. Matsumoto et al., IEEE Proceedings of ISCAS 1985, pp. 651-654.
N. Tredennick, "How to Flowchart for Hardware", Dec., 1981, IEEE, pp. 87-102.
Daisy Hardware Compiler, Daisy Computer Systems, Nov., 1986, pp. 9-20 to 9-58.

*Primary Examiner*—Vincent N. Trans
*Attorney, Agent, or Firm*—Limbach & Limbach

[57] ABSTRACT

The present invention provides a structured integrated circuit design methodology. The methodology is based on describing a two-phase logic function using a high level behavioral description flow chart, properly sizing devices to be used in the circuit for speed and reducing trial and error in circuit layout implementation using novel chip planning techniques. The methodology begins with the definition of signal types based on the circuit function that creates a particular signal and the type of input signal that feeds the circuit function. A rigid set of rules is then established for use of the signal types. Next the technical specification of the two-phase logic function is defined and utilized to create a behavioral flow chart using defined symbols. An associated database of corresponding Boolean equations is then created that defines the parameters of the various elements of the flow chart. The Boolean equations are then converted to a logic diagram either by coded state assignment or by direct implementation. The resulting logic diagram is then analyzed for speed utilizing a Figures of Merit technique for establishing device sizes. The resulting circuit design may then be carried through to layout utilizing conventional computer aided design (CAD) tools.

5 Claims, 34 Drawing Sheets

| ACCEPTABLE | NOT ACCEPTABLE | CIRCUITS | OUTPUT SIGNAL TYPES |
|---|---|---|---|
| 2L<br>1P | 2D<br>2S<br>2P<br>1L<br>1D<br>1S | 2a | 1L |
| 2L<br>1P | 2D<br>2S<br>2P<br>1L<br>1D<br>1S | 2b | 1D |
| 2L | 2D<br>2S<br>2P<br>1L<br>1D<br>1S<br>1P | | 1S |
| 2L | 2D<br>2S<br>2P<br>1L<br>1D<br>1S<br>1P | | 1P |
| 1L<br>1D | 2L<br>2D<br>2S<br>2P<br>1S<br>1P | | 1L |

FIG. 2A

| ACCEPTABLE | NOT ACCEPTABLE | CIRCUITS | OUTPUT SIGNAL TYPES |
|---|---|---|---|
| 1L<br>2P | 1D<br>1S<br>1P<br>2L<br>2D<br>2S | | 2L |
| 1L<br>2P | 1D<br>1S<br>1P<br>2L<br>2D<br>2S | 1D | 2D |
| 1L | 1D<br>1S<br>1P<br>2L<br>2D<br>2S<br>2P | | 2S |
| 1L | 1D<br>1S<br>1P<br>2L<br>2D<br>2S<br>2P | | 2P |
| 2L<br>2D | 1L<br>1D<br>1S<br>1P<br>2S<br>2P | 2j | 2L |

FIG. 2B

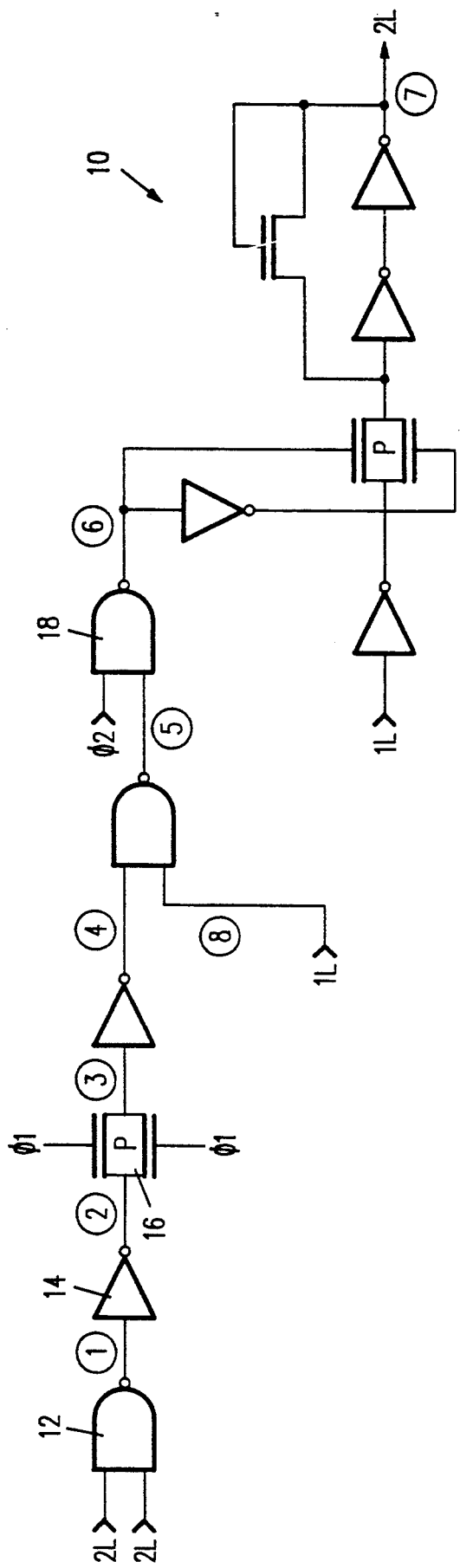
FIG. 4
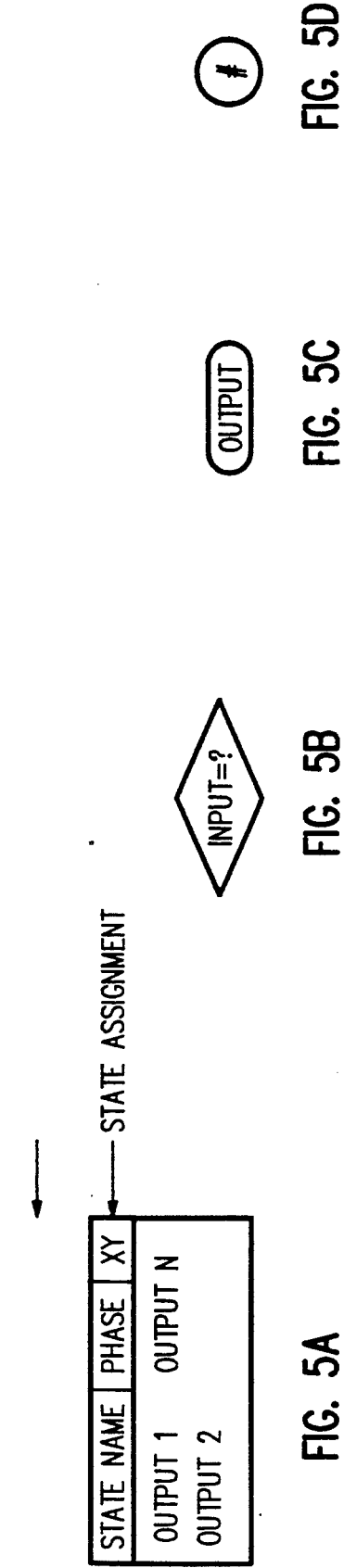
FIG. 5B
FIG. 5C
FIG. 5D
FIG. 5A

VARIABLE a

| TY,A/B,C | 0 0 | 0 1 | 1 1 | 1 0 |
|---|---|---|---|---|
| 0 0 | 0 | x | 0 | 0 |
| 0 1 | 1 | 1 | 1 | 1 |
| 1 1 | 1 | 1 | 1 | 1 |
| 1 0 | 0 | 0 | 0 | 0 |

| TY,A/B,C | 0 0 | 0 1 | 1 1 | 1 0 |
|---|---|---|---|---|
| 0 0 | 0 | 0 |   | 0 |
| 0 1 | 1 | 1 | 1 | 1 |
| 1 1 | 1 | 1 | 1 | 1 |
| 1 0 | 0 | 0 | 0 | 0 | a = A

| TY,A/B,C | 0 0 | 0 1 | 1 1 | 1 0 |
|---|---|---|---|---|
| 0 0 | 0 | 0 | 0 | 0 |
| 0 1 | 1 | 1 | 1 | 1 |
| 1 1 | 1 | 1 | 1 | 1 |
| 1 0 | 0 | 0 | 0 | 0 |

| TY,A/B,C | 0 0 | 0 1 | 1 1 | 1 0 |
|---|---|---|---|---|
| 0 0 | 0 | 0 | 0 | 0 |
| 0 1 | 1 | 1 | 1 | 1 |
| 1 1 | 1 | 1 | 1 | 1 |
| 1 0 | 0 | 0 | 0 | 0 |

| TY,A/B,C | 0 0 | 0 1 | 1 1 | 1 0 |
|---|---|---|---|---|
| 0 0 |   |   |   |   |
| 0 1 |   |   |   |   |
| 1 1 |   |   |   |   |
| 1 0 |   |   |   |   |

| TY,A/B,C | 0 0 | 0 1 | 1 1 | 1 0 |
|---|---|---|---|---|
| 0 0 |   |   |   |   |
| 0 1 |   |   |   |   |
| 1 1 |   |   |   |   |
| 1 0 |   |   |   |   | b = B

| TY,A/B,C | 0 0 | 0 1 | 1 1 | 1 0 |
|---|---|---|---|---|
| 0 0 |   |   |   |   |
| 0 1 |   |   |   |   |
| 1 1 |   |   |   |   |
| 1 0 |   |   |   |   |

| TY,A/B,C | 0 0 | 0 1 | 1 1 | 1 0 |
|---|---|---|---|---|
| 0 0 |   |   |   |   |
| 0 1 |   |   |   |   |
| 1 1 |   |   |   |   |
| 1 0 |   |   |   |   | c = C

FIG. 9A

VAR A

| TY,A/B,C | 0 0 | 0 1 | 1 1 | 1 0 |
|---|---|---|---|---|
| 0 0 | | | 1 | 1 |
| 0 1 | | | 1 | 1 |
| 1 1 | | | 1 | 1 |
| 1 0 | | | 1 | 1 |

| TY,A/B,C | 0 0 | 0 1 | 1 1 | 1 0 |
|---|---|---|---|---|
| 0 0 | | | 1 | 1 |
| 0 1 | | | 1 | 1 |
| 1 1 | | | 1 | 1 |
| 1 0 | | | 1 | 1 |

A = b

| TY,A/B,C | 0 0 | 0 1 | 1 1 | 1 0 |
|---|---|---|---|---|
| 0 0 | | | 1 | 1 |
| 0 1 | | | 1 | 1 |
| 1 1 | | | 1 | 1 |
| 1 0 | | | 1 | 1 |

| TY,A/B,C | 0 0 | 0 1 | 1 1 | 1 0 |
|---|---|---|---|---|
| 0 0 | | | 1 | 1 |
| 0 1 | | | 1 | 1 |
| 1 1 | | | 1 | 1 |
| 1 0 | | | 1 | 1 |

VAR B

| TY,A/B,C | 0 0 | 0 1 | 1 1 | 1 0 |
|---|---|---|---|---|
| 0 0 | 0 | | 1 | 1 |
| 0 1 | | | | |
| 1 1 | | | | |
| 1 0 | 0 | | 1 | 1 |

| TY,A/B,C | 0 0 | 0 1 | 1 1 | 1 0 |
|---|---|---|---|---|
| 0 0 | 1 | | 1 | 1 |
| 0 1 | | | | |
| 1 1 | | | | |
| 1 0 | 1 | | 1 | 1 |

| TY,A/B,C | 0 0 | 0 1 | 1 1 | 1 0 |
|---|---|---|---|---|
| 0 0 | 1 | | 1 | 1 |
| 0 1 | | | | |
| 1 1 | | | | |
| 1 0 | 1 | | 1 | 1 |

| TY,A/B,C | 0 0 | 0 1 | 1 1 | 1 0 |
|---|---|---|---|---|
| 0 0 | 1 | | 1 | 1 |
| 0 1 | | | | |
| 1 1 | | | | |
| 1 0 | 1 | | 1 | 1 |

FIG. 9B

VAR C

| TY,A/B,C | 0 0 | 0 1 | 1 1 | 1 0 |
|---|---|---|---|---|
| 0 0 |  |  | 1 |  |
| 0 1 |  |  | 1 |  |
| 1 1 |  |  | 1 |  |
| 1 0 |  |  | 1 |  |

| TY,A/B,C | 0 0 | 0 1 | 1 1 | 1 0 |
|---|---|---|---|---|
| 0 0 |  |  | 1 |  |
| 0 1 |  |  | 1 |  |
| 1 1 |  |  | 1 |  |
| 1 0 |  |  | 1 |  |

| TY,A/B,C | 0 0 | 0 1 | 1 1 | 1 0 |
|---|---|---|---|---|
| 0 0 |  |  | 1 |  |
| 0 1 |  |  | 1 |  |
| 1 1 |  |  | 1 |  |
| 1 0 | 1 |  | 1 |  |

| TY,A/B,C | 0 0 | 0 1 | 1 1 | 1 0 |
|---|---|---|---|---|
| 0 0 |  |  | 1 |  |
| 0 1 |  |  | 1 |  |
| 1 1 |  |  | 1 |  |
| 1 0 | 1 |  | 1 |  |

VAR RD

| TY,A/B,C | 0 0 | 0 1 | 1 1 | 1 0 |
|---|---|---|---|---|
| 0 0 |  |  | 1 |  |
| 0 1 |  | 1 | 1 |  |
| 1 1 |  |  |  |  |
| 1 0 |  |  |  |  |

| TY,A/B,C | 0 0 | 0 1 | 1 1 | 1 0 |
|---|---|---|---|---|
| 0 0 |  |  |  |  |
| 0 1 |  |  |  |  |
| 1 1 |  |  |  |  |
| 1 0 |  |  |  |  |

| TY,A/B,C | 0 0 | 0 1 | 1 1 | 1 0 |
|---|---|---|---|---|
| 0 0 |  |  |  |  |
| 0 1 |  |  |  |  |
| 1 1 |  |  |  |  |
| 1 0 |  |  |  |  |

| TY,A/B,C | 0 0 | 0 1 | 1 1 | 1 0 |
|---|---|---|---|---|
| 0 0 |  |  |  |  |
| 0 1 |  |  |  |  |
| 1 1 |  |  |  |  |
| 1 0 |  |  |  |  |

FIG. 9C

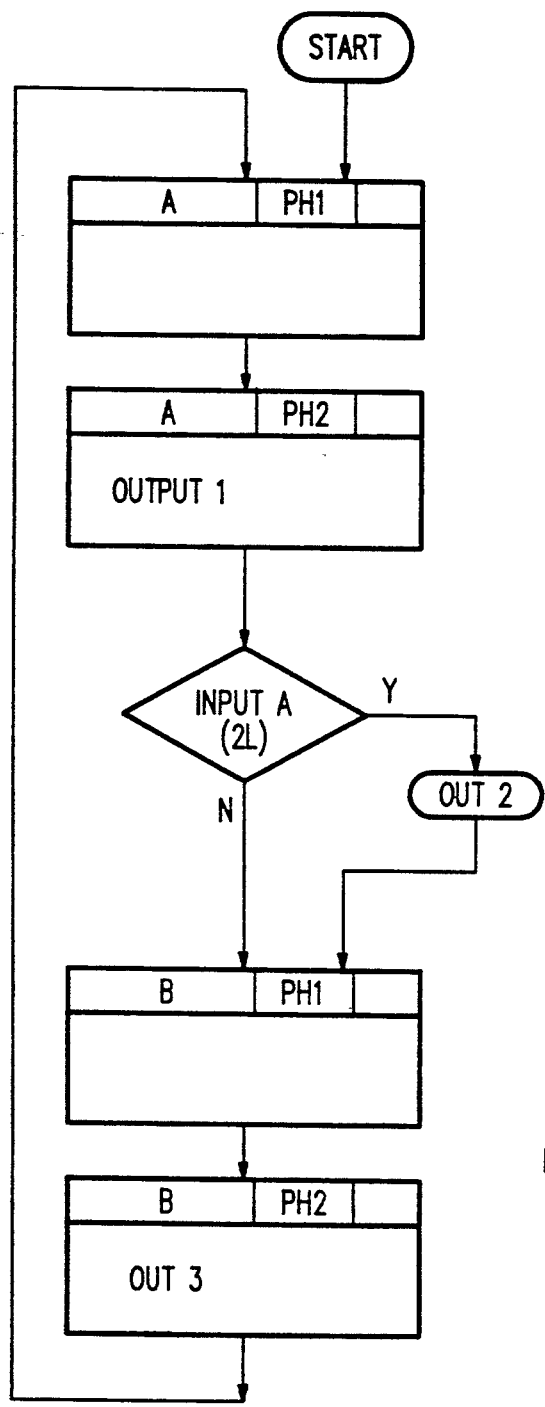
FIG. 12A
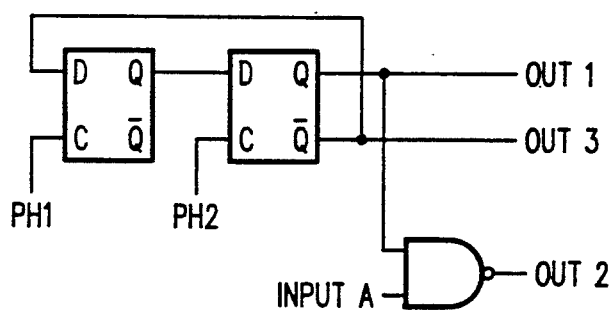
FIG. 12B
FIG. 12C

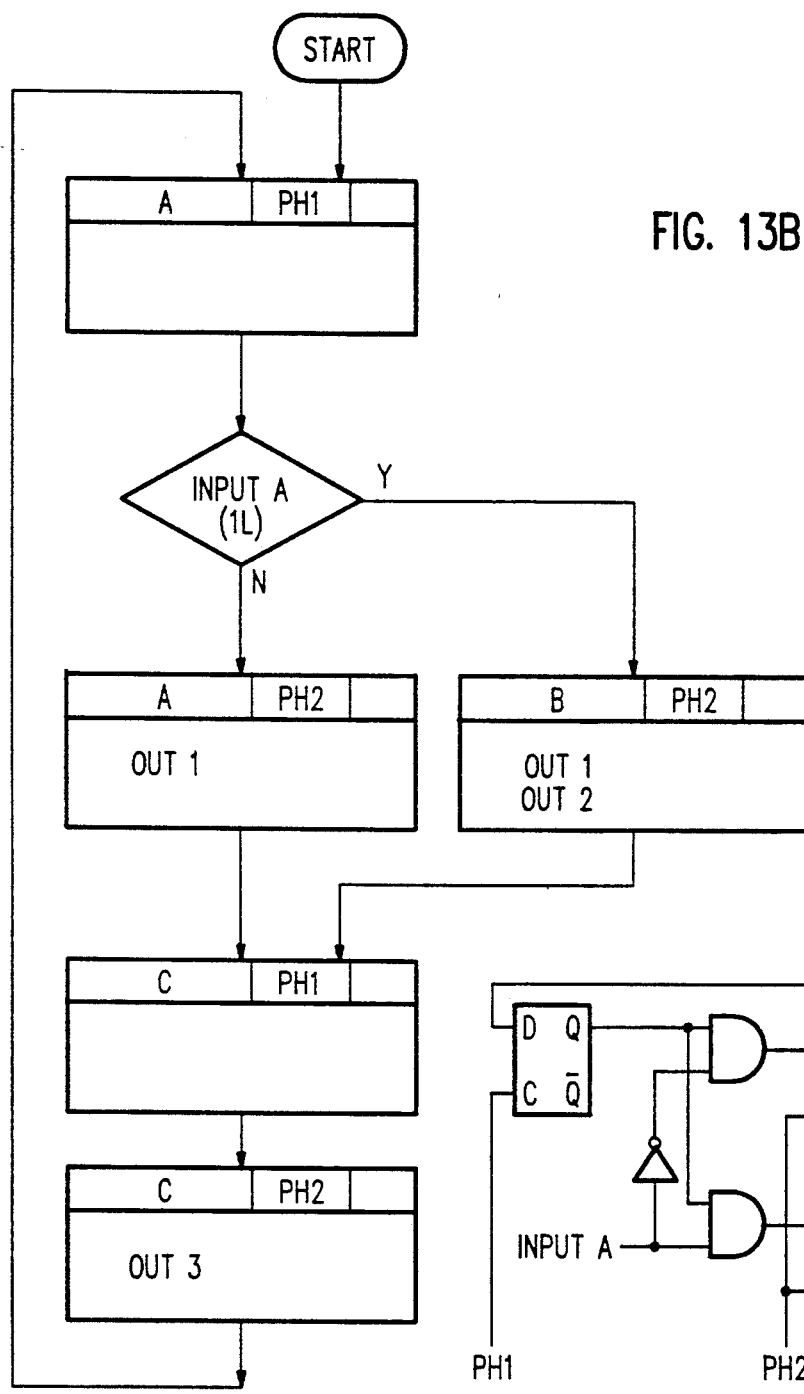
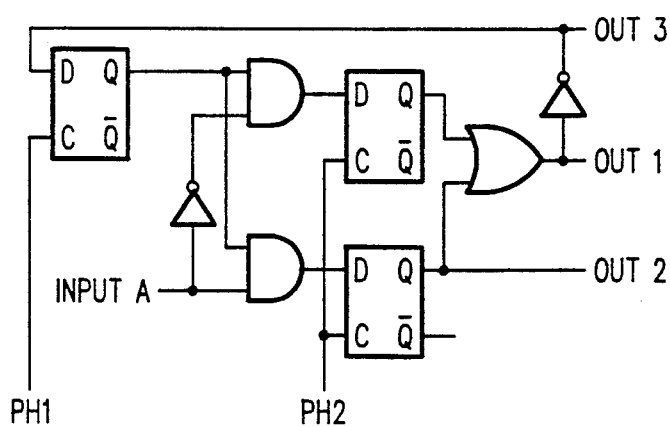
FIG. 13A    FIG. 13B    FIG. 13C

THE ABOVE CIRCUIT CAN BE APPROXIMATED BY THE DECOMPOSITION BELOW.

$$\Delta t = PC\left[\frac{C_M + C_D}{W} + \frac{C_R}{W} + \frac{C_G}{W}\right] + R \cdot C_G + \frac{R \cdot C_R}{2}$$

$$\boxed{\Delta t = PC\left[\frac{C_M + C_D}{W} + \frac{C_R}{W} + \frac{C_G}{W}\right] + R\left[C_G + \frac{C_R}{2}\right]}$$

COMPLETE NODE FOR ANALYSIS

COMPONENTS OF ABOVE NODE

SELF DELAY     TABLE

LOAD DELAY     TABLE

ROUTING DELAY     TABLE GRAPH 1

RC DELAY     TABLE GRAPH 2

STRUCTURED LOGIC DESIGN METHOD USING FIGURES OF MERIT AND A FLOWCHART METHODOLOGY

TECHNICAL FIELD

The present invention relates generally to methodologies for designing semiconductor integrated circuits and, in particular, to a structured integrated circuit design method based on describing a logic function using a high level behavioral description flowchart, properly sizing the devices to be used in the circuit for speed in a quick, reliable manner, and reducing trial and error in circuit layout implementation using novel chip planning techniques.

BACKGROUND

While less well-known than flowcharting techniques used for developing computer software, flowchart methods have also been used for designing electronic hardware systems.

Tredennick, for example, has described a "flowchart method" for designing the central processing unit (CPU) of a computer system (IEEE, December, 1981, pages 87–102).

Tredennick describes a procedure whereby a "principal of operation" definition for a computer processor is used to iteratively develop a corresponding hardware flowchart. The flowchart serves as a bridge between the English-language written technical definition of the processor and the people responsible for the final integrated circuit processor design.

The objective of Tredennick's procedure is to develop a flowchart that represents processor operation as the flow of simple processor actions or state changes, that is, a compact formal description of what the processor does. Tredennick's finalized flowchart specifies exactly how commands from the processor's instruction set are carried out by the processor's execution unit hardware.

More specifically, Tredennick's flowchart methodology begins with the development of trial the processor's instruction format and register set and a summary of those processor instructions applicable only to the execution unit. This "technical product definition" is used to generate a first iteration block diagram of the execution unit. This is done by first adopting a "register transfer" notation. Each statement of this notation defines a "task" that consists of transferring data from an identified source register within the processor's register set to an identified destination register via an identified bus.

The flow of execution unit states is depicted by boxes, one box for each state. Each execution unit state box contains one or more tasks. An execution unit "sequence" is defined as a succession of states.

First, a so-called "level one" flowchart, consisting of a full sequence of execution unit states, is defined for the execution unit. Then each task of each state is categorized as either an operational task or a housekeeping task. Operational tasks are transfers required to perform the instruction; operational tasks are transfers that must occur in a specific order and may be unique to a particular operation. Housekeeping tasks, such as incrementing the processor's program counter and fetching the next instruction, must also be performed for every instruction.

After the "level one" flowchart for the execution unit has been developed, housekeeping tasks are merged with operational tasks wherever possible to provide an optimized "level two" flowchart for the execution unit. This "level two" flowchart is used to modify the first version of the execution unit block diagram. This iterative process of flowchart generation and block diagram modification continues until a satisfactory execution unit block diagram is established.

The general procedure utilized to establish the execution unit block diagram is then applied broadly to generate a "level one" flowchart for the processor's controller section using the processor's entire instruction set.

Again, after developing the "level one" flowchart for the controller, housekeeping tasks are merged into operational tasks without, if possible, increasing the number of states in the operational task sequence. Descriptive information regarding the nature of a particular task is then added to the states identified in the "level two" processor flowchart.

After a minimization step, in which duplicate states are eliminated, the minimized "level two" processor flowchart is used to develop a processor design. The progression from the "level two" flowchart may be either to a microcoded version or to a combinational logic version of the processor.

The problem with the Tredennick flowchart methodology is that it is directed to system level applications, not to integrated circuits.

Another example of a hardware flowcharting technique is provided by the Daisy Computer Systems Hardware Compiler. The Hardware Compiler is a set of software programs that converts a high level logic description, such as a flow chart or text file, into a truth table.

The preliminary documentation for the Daisy Hardware Compiler (Nov. 0, 1986) describes a procedure that begins with development of a high level logic description in the form of a finite state machine chart. A finite state machine is a device in which the logic state of the device changes at every clock cycle based on the current state and the inputs to the state machine.

The drawing description of the finite state machine is consistent with the Mealy model and uses Christopher Clare's method of chart representation. First, an algorithmic state machine (ASM) chart is created. Each possible state and the transitions from state to state are diagrammed using three types of boxes: state boxes, decision boxes and conditional output boxes. After the components of the ASM chart have been assembled, parameters are assigned to each box and the associated information is linked with the boxes in a side file. Next, a finite state machine compiler translates the flow chart netlist, which consists of the side files associated with the ASM chart, to a computer aided design (CAD) netlist, essentially a truth table of the desired logic. A minimizer program then reduces the number of product terms in the truth table by combining any terms that are the same and by expanding some terms to cover others.

The minimized truth table generated by the Hardware Compiler may then be processed by conventional CAD tools to generate a circuit implementation.

The problem with the Hardware Compiler "flowchart" procedure is that it can be applied only to so-called single-phase of "edge-triggered" logic designs.

SUMMARY

The present invention provides a structured integrated circuit design methodology with particular applicability to two-phase logic design. The methodology is based on describing a logic function using a high level behavioral description flowchart, properly sizing devices to be used in the circuit for speed and reducing trial and error in circuit layout implementation using novel chip planning techniques. The methodology begins with the definition of signal types based on the circuit function that creates a particular signal and the type of input signal that feeds the circuit function. A rigid set of rules is then established for use of the signal types. Next the inputs and outputs of the logic function are defined and utilized to create a behavioral flowchart using defined symbols. An associated database is then created that defines the parameters of the various elements of the flowchart. The flowchart is then converted to a logic diagram either by coded state assignment or by direct implementation. The resulting logic diagram is then analyzed for speed utilizing a Figures of Merit technique for establishing device sizes. The resulting circuit design may then be carried through to layout utilizing conventional computer aided design (CAD) tools.

A better understanding of the features and advantages of the present invention will be obtained by reference to the following detailed description of the invention and accompanying drawings which set forth an illustrative embodiment in which the principles of the invention are utilized.

DESCRIPTION OF THE DRAWINGS

FIGS. 2A and 2B are tables, including schematic representations, of signal type definitions in accordance with the present invention.

FIG. 4 is a schematic diagram illustrating a circuit example of the use of the signal types defined in FIG. 2.

FIGS. 5A-5D illustrate symbols used in a hardware flowchart methodology in accordance with the present invention.

FIGS. 9A-9C provide logic equations associated with the FIG. 8 flowchart.

FIGS. 12A-12C illustrate a Mealy machine in flowchart form in accordance with the present invention with associated transition table and logic implementation.

FIGS. 13A-13C illustrate a Moore machine in flowchart form in accordance with the present invention with associated transition table and logic implementation.

DETAILED DESCRIPTION

I. Logic Flowcharting

The incentive to design logic by flowcharting is the same as that to flowchart for software programming. It is simpler to do because ideas are easier to formulate at a higher level. Further, at a higher level, a larger perspective is easier to achieve, thus making potential conceptual problems easier to detect. In addition, the ability of humans to solve problems by visual pattern recognition allows hardware flowcharting techniques to exploit the circuit designer's creativity.

The actual mechanics of creating hardware flowcharts which can be conveniently converted to logic diagrams, then to circuit diagrams and finally to chip layout will be the subject of the remainder of the detailed description of the invention.

The methodology which will be described is one which is specifically designed to work with another aspect of the present invention, the Figure of Merit (FOM) method of circuit design. As with the flowchart methodology, the FOM method is described for two phase circuits, although the concepts of the invention can be adapted to single or multiphase circuits. For both the flow charting method and the FOM method, the rules are rigid for the purpose of addressing commonly occurring failures.

A. Two-Phase Logic

Most MOS VLSI circuits are implemented using two phase logic.

Figure 1:
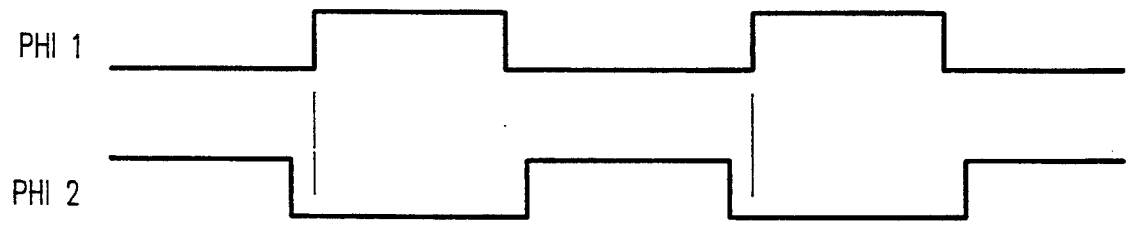
FIG. 1 is a timing diagram illustrating non-overlapping clock signals.

As shown in FIG. 1, signals PHI1 and PHI2 are non-overlapping clocks which can both be used individually as the clocking signal for memory elements and as a timing reference.

The immediately following discussion defines the characteristics of two-phase logic circuits and introduces a concept that comprises one aspect of the present invention, identifying signals by defined signal types.

B. Signal Types

The definition of signal types is based upon both the circuit function that creates a particular signal and the type of input signal that feeds the circuit function.

The signal types provide labels which categorize a signal by its timing characteristics relative to the phase signals PHI1 and PHI2 and, as stated above, by the circuit function that generates it. The objective in defining signal types is to create a signal "language" that uniquely distinguishes the output of a circuit and qualifies the circuit inputs so that only proper inputs and outputs can be connected together.

FIG. 2 shows the defined output signal types, as well as the circuits that generate these signal types and the inputs acceptable to the circuits. For example, the circuit 2a at the top of FIG. 2 generates an output of signal type 1L; the inputs acceptable to circuit 2a may be either a signal type 2L or a signal type 1P.

Figure 3:
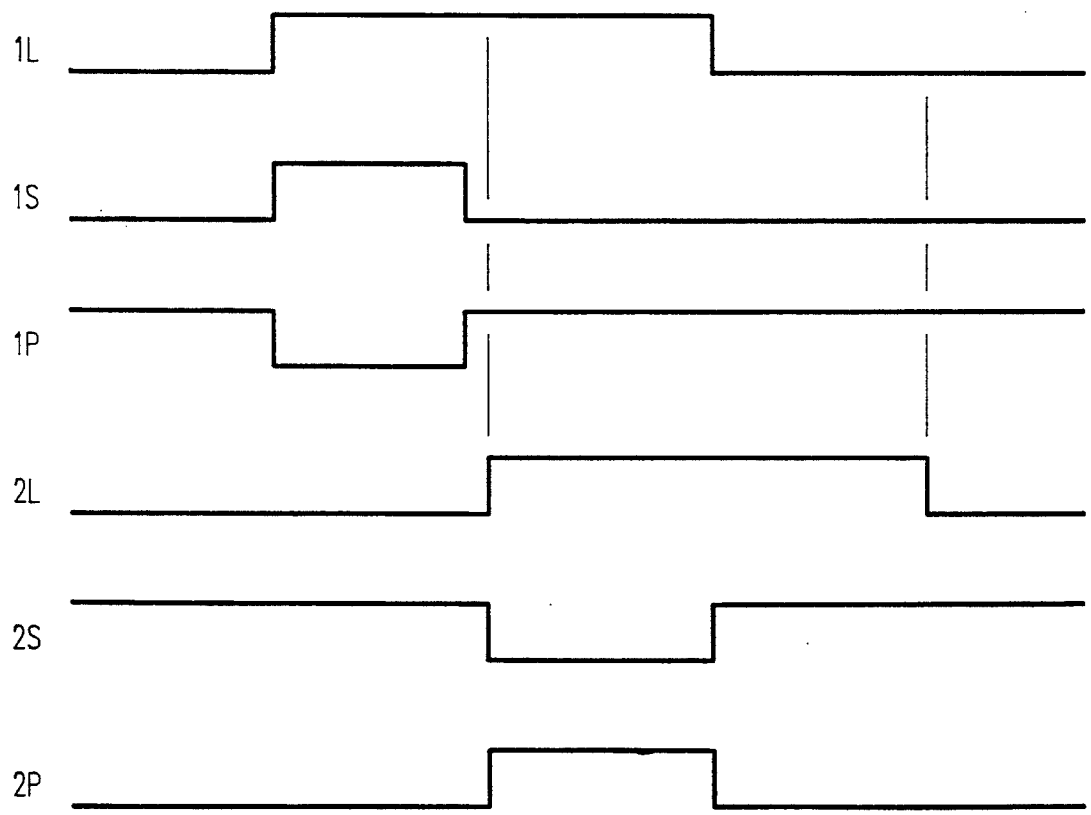
FIG. 3 is a timing diagram illustrating waveforms associated with the signal types defined in FIG. 2.

FIG. 3 shows the waveforms generated for the various signal types defined in FIG. 2.

An example of the use of the FIG. 2 signal type definitions is provided by the circuit 10 shown in FIG. 4. In the circuit 10, node 1 is driven by a NAND gate 12 which is in turn driven by 2L input signals. Therefore, as indicated by box 2j in FIG. 2, node 1 is a 2L signal. Node 1 feeds an inverter 14 the output of which is node 2. Therefore, node 2 is also a 2L signal. Node 3 is the output of a transmission gate 16 which is driven by a PHI1 clock. The input to transmission gate 16 is node 2, a 2L signal. Therefore, as indicated by box 2b in FIG. 2, the node 3 output of the transmission device 16 is a 1D signal. By similar reference to the FIG. 2 signal type definitions, nodes 4 and 5 are 1L signals and node 6 is a 2S signal to produce node 7 as a 2L signal.

If, however, the node 8 input to circuit 10 is a 2L signal, rather than the illustrated 1L signal, then node 5 would be required to be a 2L signal, which feeds the strobing NAND gate 18 driven by the PHI2 clock. Thus, output of NAND gate 18 becomes a 2S output signal. This result is inconsistent with the signal types defined in FIG. 2, which establishes that the circuit which generates a 2S signal must have a 1L signal as an input. Therefore, the FIG. 2 signal type definitions verify that a 2L signal type input at node 5 is not allowed.

C. Symbols and Definitions

Only five symbols are used in the flowchart technique: the state block, the decision rhombus, the output oval, the transition vector, and the continuation circle. FIGS. 5A–5D show the state block, decision rhombus, output oval and continuation circle symbols, respectively. The transition vector should be well known to those skilled in the art.

The state block, illustrated in FIG. 5A, represents a state of the machine and has the following characteristics:

1. The state lasts for one clock period of time.
2. The state must be a PHI1 or PHI2 state, and labeled as such.
3. The state block is labeled with a unique state name in the top left corner of the block.
4. The state variable assignments are given in the top right corner.
5. The output variables are assigned their value in the body of the state block.

The decision rhombus, illustrated in FIG. 1B, has the following characteristics:

1. This rhombus directs the selection of the next state for the following phase period.
2. The input variable is from a source external to the machine and is labeled within the rhombus.
3. Each input controls a binary selection.
4. The decision rhombus can be concatenated to achieve logical functions.

The output oval, illustrated in FIG. 5C, designates or contains output variables and has the following characteristics:

1. The output oval contains outputs which are dependent upon both the present state and input variable(s).
2. Both the state and input variable must be of the same signal type.
3. The input variable from another machine must not be from an output oval of that machine.

The continuation circle is shown in FIG. 5D, and is used as follows:

1. To join the transition vectors when the path is discontinuous at a page boundary.
2. To join transition vectors when there are too many outputs feeding a common point.
3. Merely as a convenience.

The transition vector is used to show the transition from state to state, through the decision rhombus if it exists.

D. Application of Flowcharting

The most common application of flowcharting a logic implementation occurs when implementing a state machine which must perform a function to control transfer conditions of registers used in data paths. Before generalizing the application to include control in general (including ROMs, linking multiple machines, and partitioning of structures), an example for a common application will be developed.

Consider a situation where a machine must be created to arbitrate the transactions of an I/O bus on a CPU. The requirements will be as follows:

1. Two requestors of the bus will exist.

2. Requestor #1 will do reading and writing and have priority over Requestor #2 should there be a contention. Further, Requestor #1 will flag its request for service by setting active a line labeled REQ#1 and indicates its desire by setting active the line called TYPE if the request is write, or having TYPE be inactive if the request is read.

3. Requestor #2 only does reading and will request service by setting to active, the line labeled REQ#2.

4. Outputs provided are, Read strobe (RD), Write strobe (WR), and Data direction (DDIR).

Figure 6A:
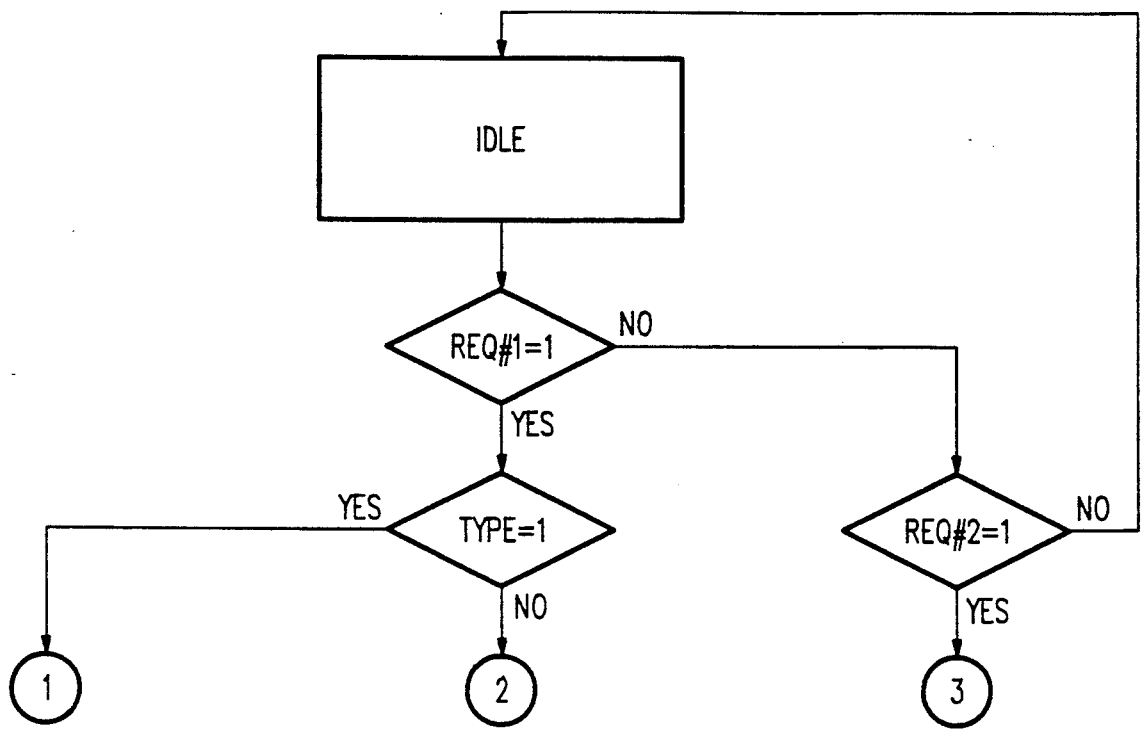
FIGS. 6A-6D provide a first iteration flowchart generated in accordance with a flowchart methodology in accordance with the present invention.

At this stage, it is time to begin flowcharting the definition of the machine. The easiest and recommended way to begin the process of flowcharting is to start with a simple (non-rigorous) model, then successively increase its complexity and rigidity to create a sound and implementable flowchart. Since, at this stage, the phase partitions are ambiguous, they should be disregarded and only the "ideas" should be implemented. As quickly as possible, a flowchart should be sketched to bring the ideas into Referring to FIG. 6A, start with a state block; call it Idle. From this block, draw an output vector to a decision rhombus for REQ#1. From this diamond, draw two output vectors labeling them YES and NO. Draw the NO vector to another decision rhombus for REQ#2 and emit two more vectors from this rhombus labeling them YES and NO. From the NO vector of REQ#2, create a vector that goes back to the Idle block. Draw the YES vector of REQ#1 to a decision rhombus TYPE=1. From the TYPE=1 rhombus, emit two vectors and label them YES and NO. Draw the YES vector of the TYPE=1 rhombus to a continuation circle and label it 1. Draw the NO vector to a continuation circle and label it 2. Draw the YES vector of the REQ#2 rhombus to a continuation circle and label it 3.

Figures 6B, 6C, 6D:
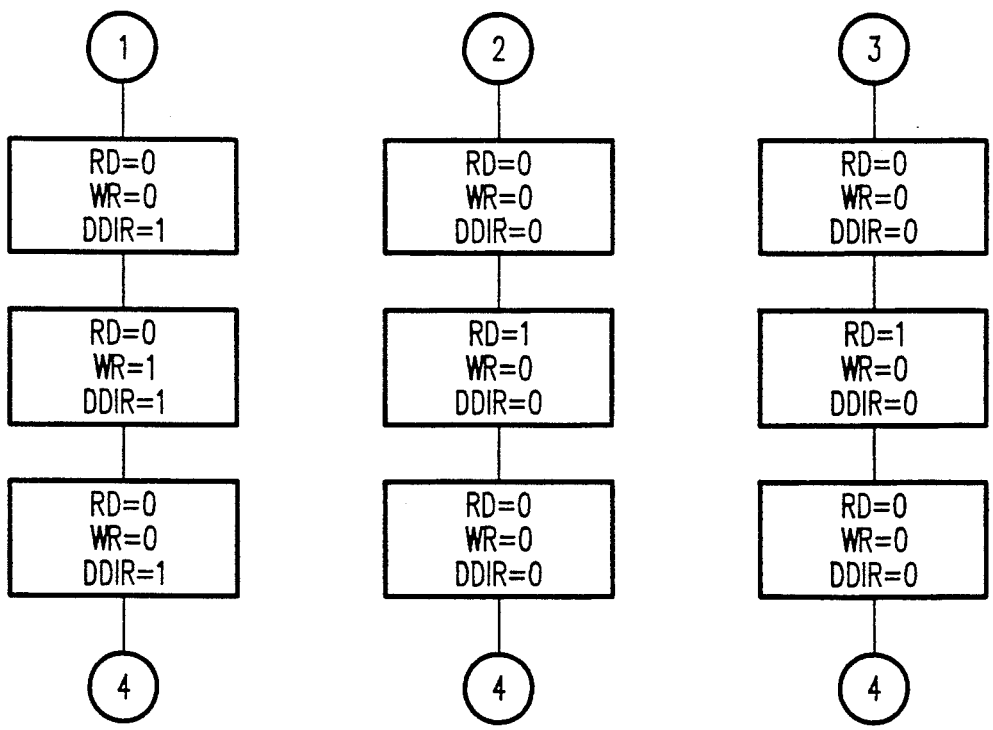

FIG. 6B constitutes the write cycle for data. The three outputs described earlier must be considered to create a proper data transfer. Note here that all of the details (such as address output, data being selected, etc.) are omitted from the chart for the sake of simplifying the example, but the essence of clarification by organization still retains its merit with the three selected outputs. Starting with the number 1 continuation circle, the vector goes directly to the first block of transfer where the direction of the bus is set. However, the WR is "given time" before being sent active in the next block. The third block inactivates WR, but holds DDIR to give it a hold time. It is important to note that the exact time or number of cycles which are allowed for the set-up and hold for the WR are not specified now, as a convenient latitude which may be useful later.

FIG. 6C shows the data read cycle with the same level of considerations as that for data write. FIG. 6D shows the instruction read cycle.

Both the data read cycle and instruction read cycle are identical and could be combined. However, they are left separated at this stage since detailed timing considerations have not yet been inserted. The signal which would intuitively be a function of this machine, the destination selection signal of instruction or data, has not been specified. Considerations such as this should be questioned and checked for accuracy, but these considerations are often predetermined at a higher level in the machine architecture.

The flowchart of FIG. 6A-6D is already descriptive enough to raise many questions. These questions and their answers should be documented such that the next iteration of the flowchart will be as accurate as possible. Again, however, this effort should not take so much time that it becomes a project in itself. Instead, the task of creating a more rigorous flowchart should answer many of the questions (and also create new questions). This will funnel more information to the designer in a shorter period of time, and thereby make the designer more productive.

The next step is to create a detailed flowchart which incorporates:

1. The timing in terms of the PHI1 and PHI2 clocks.
2. All inputs with proper signal types.
3. All outputs with proper signal types.

Figure 7A:
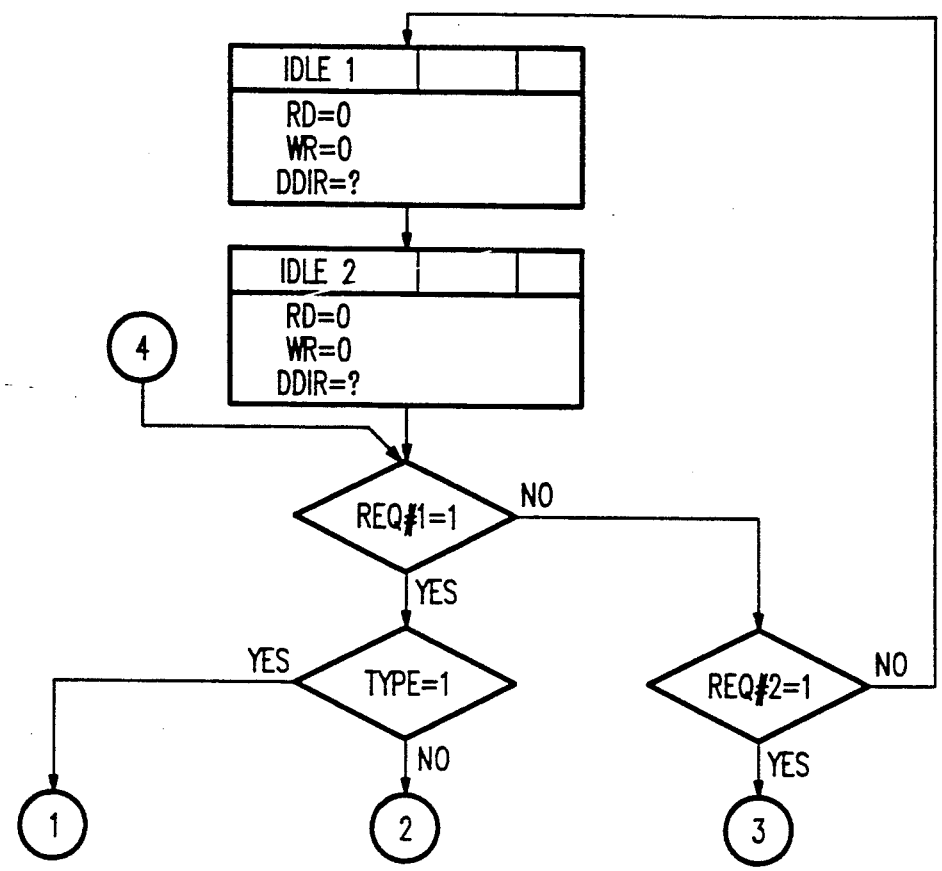
FIGS. 7A-7D provide a more detailed version of the FIG. 6A-6D flowchart.
Figures 7B, 7C, 7D:
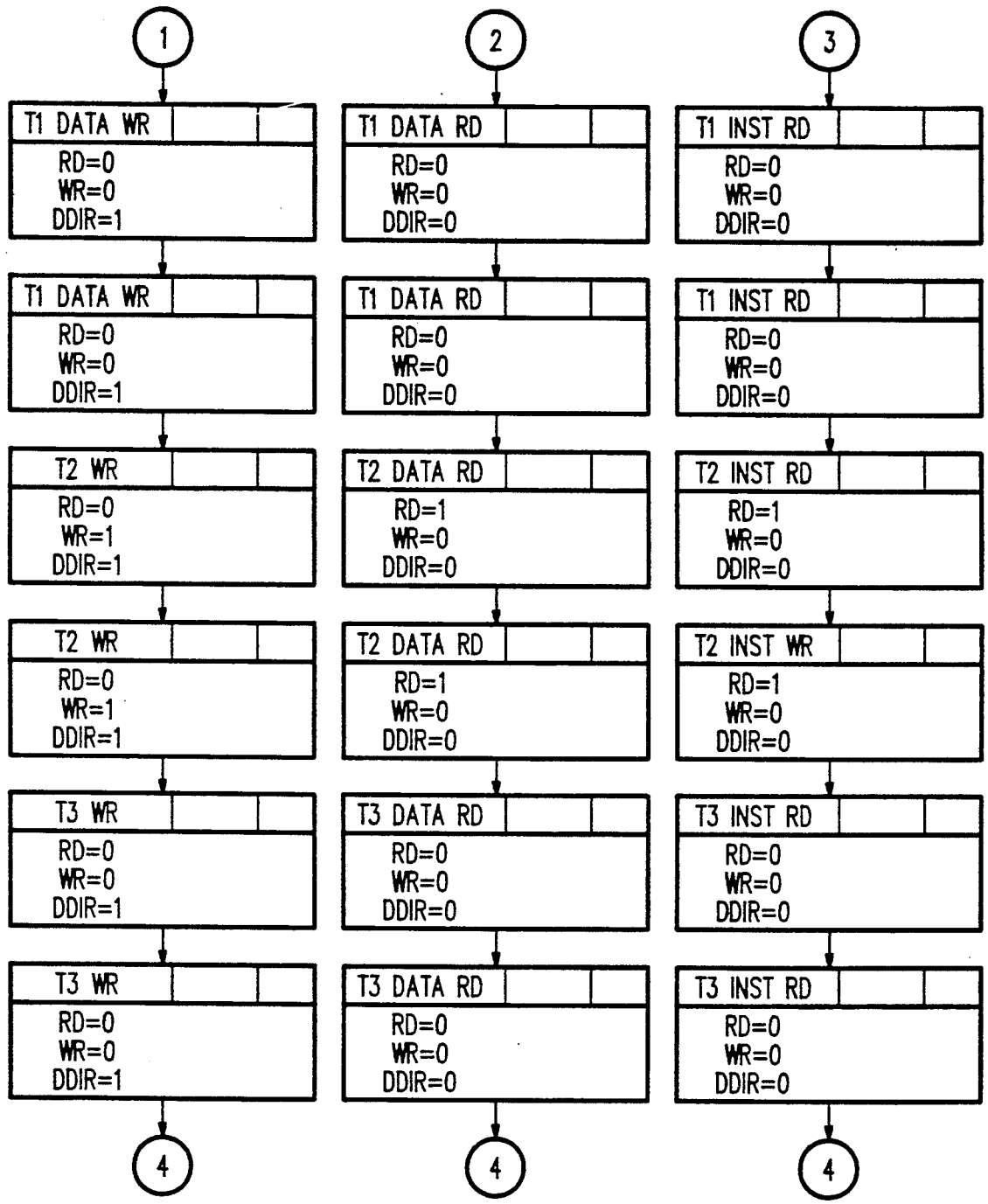

FIG. 7 illustrates the same machine as that shown in FIGS. 6A-6D, however in detailed form. As can be seen, the FIG. 7 implementation of the flowchart is much more rigorous, including the state names for each block, assigning the phase to each block, accounting for all of the outputs in each block, and being careful to see that each vector terminates at some state, as demonstrated by the addition of continuation circle 4 vectoring to the REQ#1 decision rhombus.

As this is done, many questions arise. Why are two states needed for each function? Won't this technique be too rigid for more complex functions? Some states look redundant, can they be deleted? Is a block diagram necessary to be able to relate to the real world? These and many other questions must be answered to make this a sound procedure. However, in an effort to keep this example on track, the discussion will progress by showing how this machine can be reduced to hardware.

To begin the implementation into hardware, the states forming the data read sequence will first be combined with the sequence forming the instruction read sequence. The two streams are indistinguishable, since they produce the same outputs as well as go to the same next state under similar conditions. This process is, of course, state reduction done intuitively. The result now alters the flow such that the sequence between continuation circles 3 and 4 is eliminated, and the vector from the REQ#2, YES now goes to continuation circle 2. This reduced flow now contains 14 states. However, the implementation can be accomplished with 3 bits of memory because there are two phases. For instance, one state in PHI1 time can have an assignment of 101; also, one in PHI2 time can have an assignment of 101.

Next, phases are assigned to the state blocks. Although done at random in this example, this can be a crucial step in most applications for the consideration of timing with inputs and outputs. This means that the signal type rules defined above must be followed.

Figure 8A:
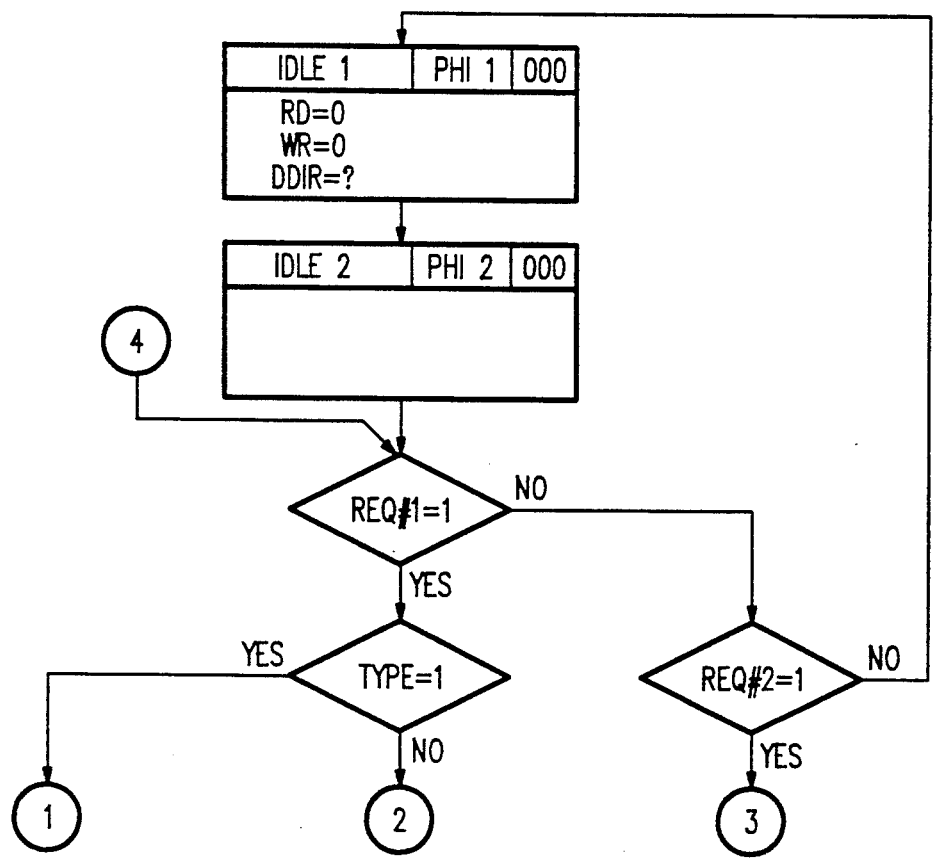
FIGS. 8A-8C provide a completed flowchart based on the FIG. 6A-6D, and FIG. 7 versions.
Figure 8B:
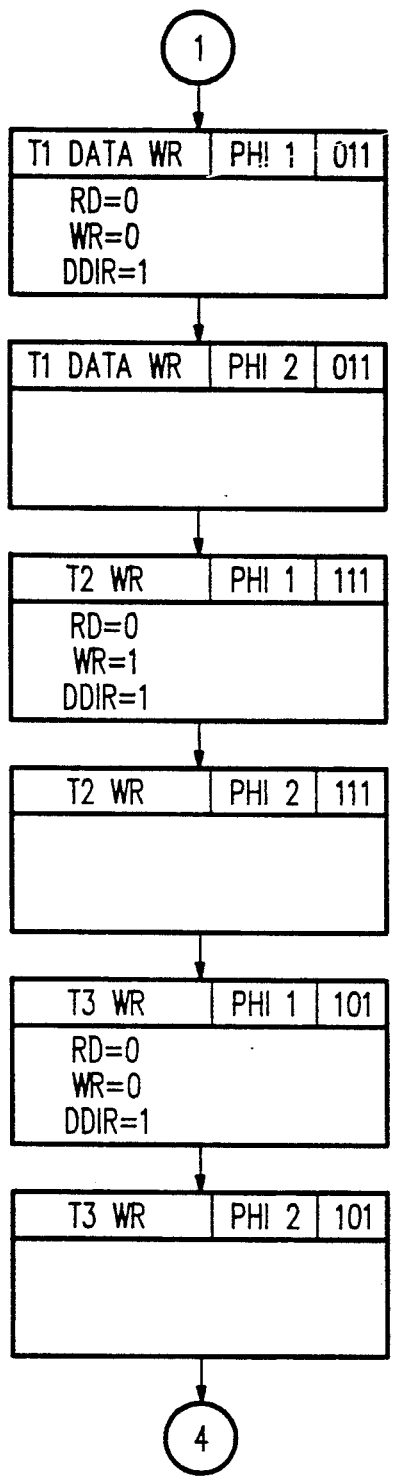
Figure 8C:
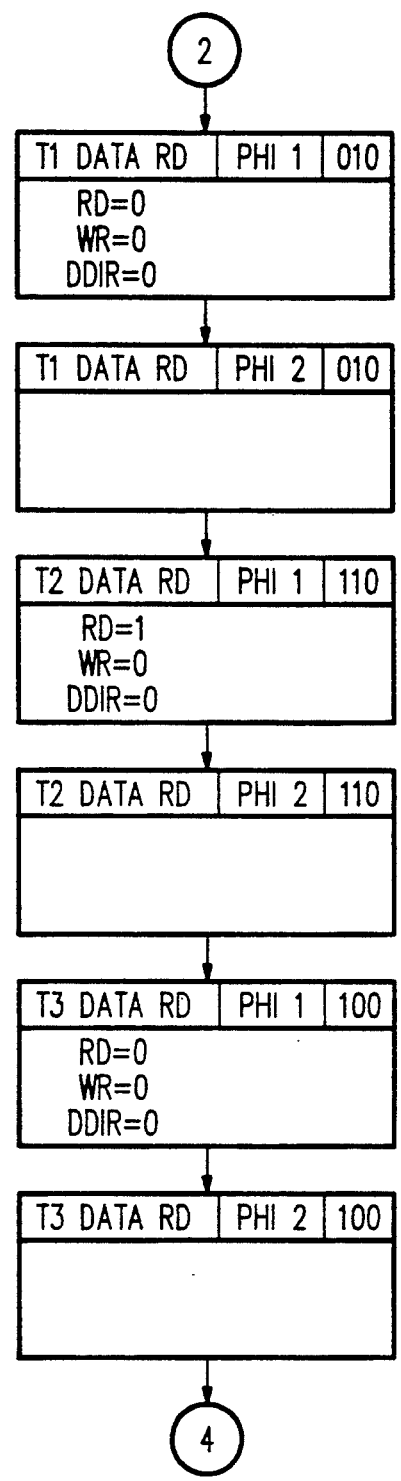

The state assignments are done with some intuitive concern, such that the outputs will not need too much decoding. Other than this the assignments are random. With this done, the flowchart now appears as shown in FIG. 8. This flowchart is now in its completed form.

The state transition and output table can now be created and is shown in Table 1 at the end of this detailed description. Note that two tables are created to show the PHI1 present state to PHI2 next state and PHI2 present state to PHI1 next state.

Using conventional techniques, the transition and output tables reduce to the equations shown in FIG. 9.

Figure 10:
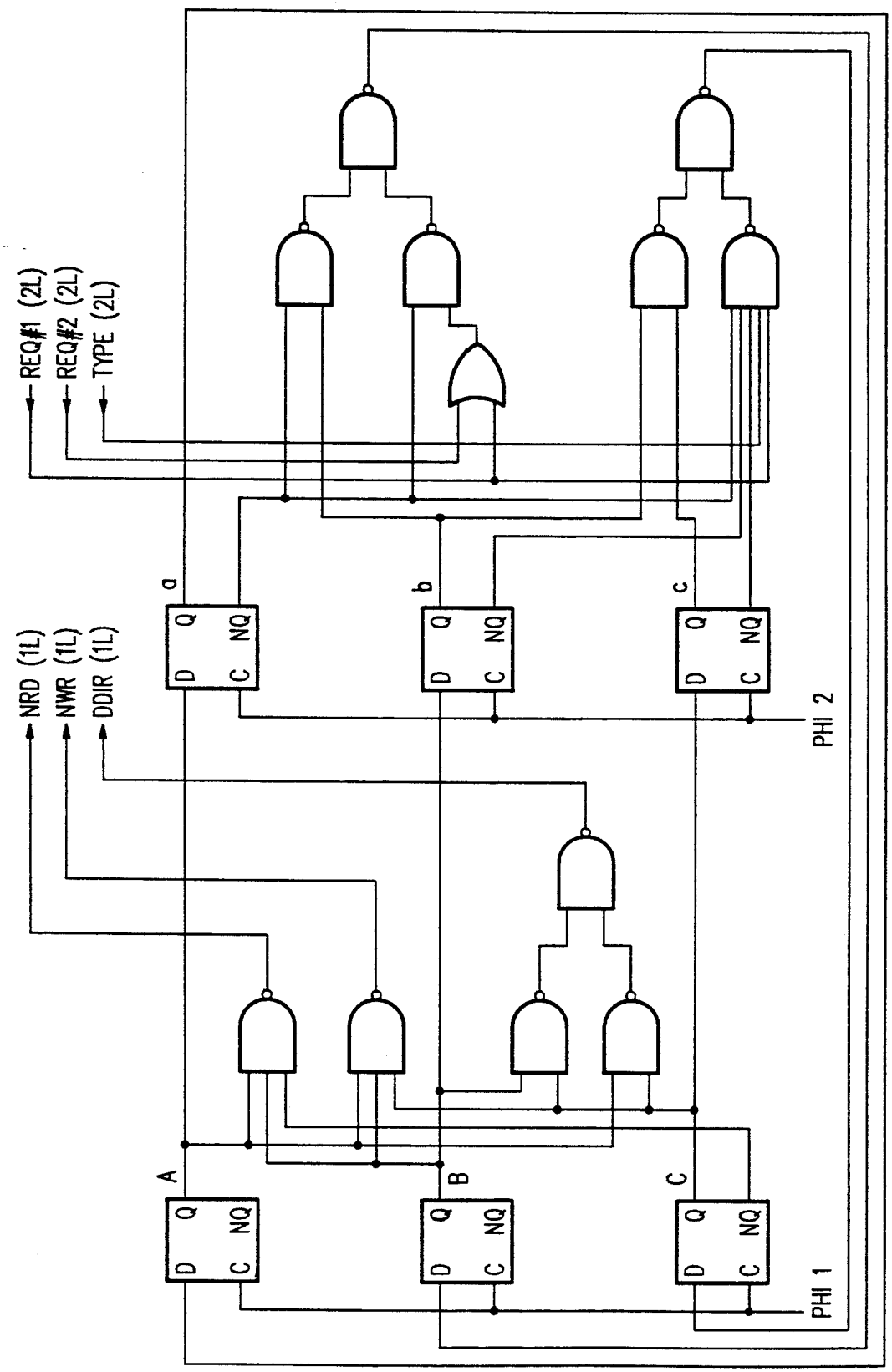
FIG. 10 is a logic diagram resulting from the FIG. 8 flowchart based on the FIG. 9 equations.

The corresponding logic implementation is then shown in FIG. 10.

With the logic implemented, the signal types are now labeled as shown in FIG. 10. Notice that the signal types are all consistent with the rules defined above. This will be true because, with this technique, one is able to "see through" the flowchart to take care of the signal types. Or it could be said that the signal types will be correct by design. With practice, or insight, even the circuit speeds can be "seen through" the flowchart. All this can be related back to sound principles of information theory and statistical data, and not gut feel. With the signal types checked, the methodology of the present invention has progressed to the point where FOM techniques described in detail below, will now serve the designer well in assigning device sizes.

In an effort to quickly demonstrate the flowchart method by example, many details have been left out. The most important of these, is the block diagram, which shows the physical relation of the block being designed, relative to the other blocks. It will also put into perspective, which blocks are controlled, which block do the controlling, which controlling blocks are subordinate to others, and how they link or interface with each other. The block diagram, together with the flowcharts, can provide a thorough description of the system being created.

Another detail of importance is the interface specifications of the integrated circuit which establishes the (electrical) boundary conditions of the chip. This is an important detail, often overlooked initially, which tends to impact the flow chart.

As opposed to the method demonstrated previously of reducing the number of states, then determining the minimum number of memory elements necessary for implementation followed by the transition table and solving for the minimum logic, there is a more direct approach. Referring back to FIG. 8, this flow chart can be implemented by replacing each state block by a D-latch, replacing each transition vector by a wire connection and replacing the decision rhombuses in the following way. Where more than one transition vector enters, an OR gate is issued to channel the vectors into one. Where there is a decision rhombus, an AND gate is used with the output connected to the output vector, where for the YES case the input transition vector is one input and the conditional input is the other. For the NO case, the input is the input transition vector and the inverse of the conditional input. With this done, an initialization scheme is created to set one state active, while deactivating the others. The outputs are created by ORing all of the states where they are listed.

E. Partitioning by Block Diagram

As eluded to during the example of flowcharting, questions are answered, as well as created by development of the flowchart. The block diagram clarifies the function and timing of some signals, while raising more questions to be answered as more of the diagram is shown. The important thing to realize is that when this is done early in the design cycle, it reduces surprises later on.

Reconsider the example of the machine which arbitrates the I/O bus. This time a block diagram will be created to aid in the description of the machine. The machine requirements are restated as follows:

Consider a situation where a machine must be created to arbitrate the transactions of an I/O bus on a CPU. The requirements are as follows:

1. Two requestors of the bus will exist
2. Requestor #1 will do reading and writing and have priority over Requestor #2 should there be a contention. Further, Requestor #1 will flag its request for service by setting active a line labeled REQ#1 and indicates its desire by setting active the line called TYPE if the request is write, or having TYPE be inactive if the request is read.
3. Requestor #2 only does reading and will request service by setting to active, the line labeled REQ #2.
4. Outputs provided are, Read strobe (RD), Write strobe (WR), and Data direction (DDIR).

Figure 11A:
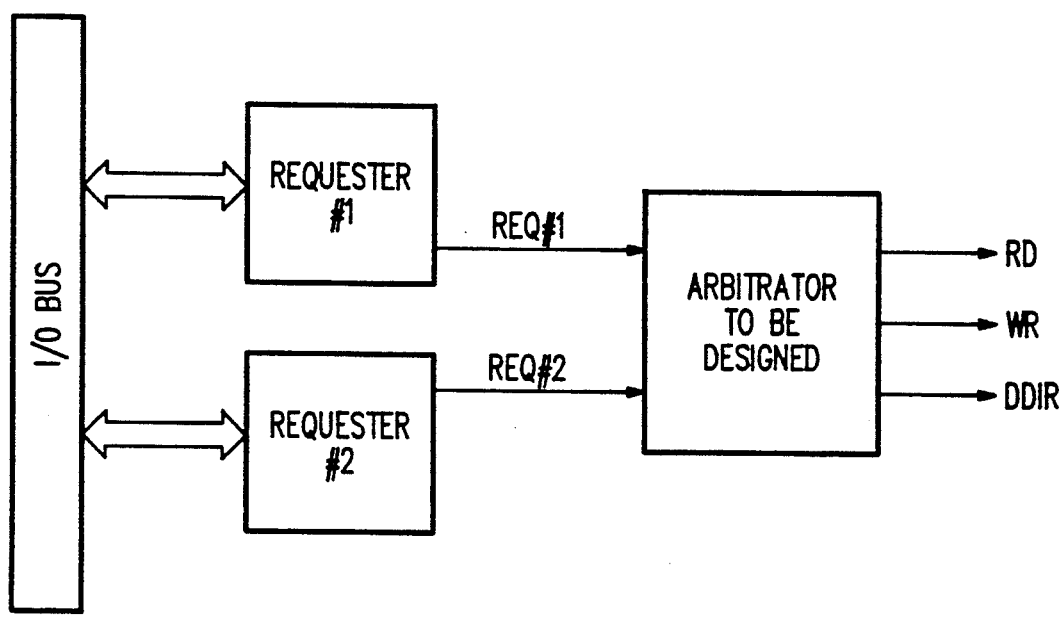
FIG. 11a is an initial iteration block diagram generated in accordance with a design methodology in accordance with the present invention.

From the description, try to visualize the configuration of the machine and begin to block out the sections as shown in FIG. 11A. The translation is done with a few assumptions as possible, and the goal is accurate translation. This simplest translation is valuable as a starting point and will serve as a reference.

The next order of consideration is the thoroughness of the details of the conception. Are any loose ends not covered? Are any necessary signals left out? Are there any self inconsistencies?

In this example there is an oversight. When the machine receives a request and determines the function and which machine will have the priority, it then sends outputs to be used to perform the transaction. These outputs are insufficient to perform the transaction, because there is no information sent out as to which machine has won the priority. This problem can easily be corrected by adding a single line which indicates Requestor 1 or 2.

Another alternative is to return acknowledge signals to each of the requesters. In either case, the problem is easier handled when caught early. The flowchart can be modified by adding this as an output criteria, which will cause the simplification from FIG. 7 to FIG. 8 to be invalid. This is a case where an oversight was brought to light by a different perspective (block diagram) of the structure.

The block diagram is also helpful in visualizing the physical relations which will likely exist in silicon area. As the flowchart develops, the block diagram can also develop in parallel, showing more details in terms of blocks and signals, as well as anticipating the number of memory elements (flip-flops) and amount of logic. These later items will aid in an early estimation of chip planning.

Figure 11B:
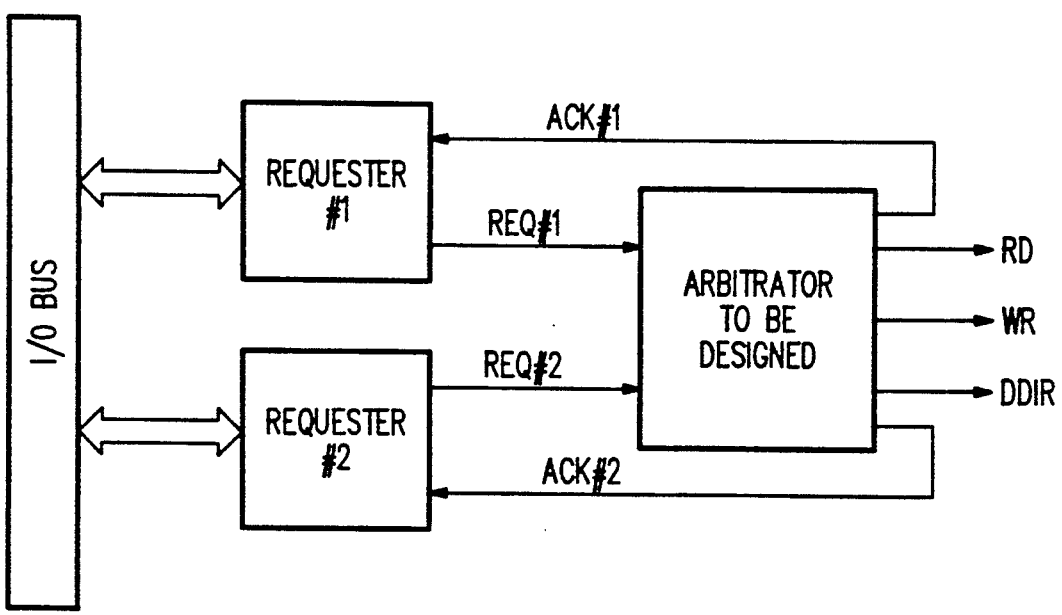
FIG. 11B is a modification of the FIG. 11A block diagram.

FIG. 11B shows the modified block diagram to correct the oversight. The flowchart can then be modified to reflect the change and the logic redone. The block diagram should also be developed in more detail as the design progresses with a parallelism to the flow charts and chip plan.

An additional factor which will be associated with the block diagram is accurately specifying the blocks to be controlled. Often the criteria imposed, such as the requirement that Signal A must be mutually exclusive to Signal B. This may be easily seen if the outputs are generated by a common machine. However, if they are generated by two separate machines, violations could be obscure.

The flowchart can be used as an aid to detect violations by aligning the blocks at the synchronizing signals and unfolding the flowcharts to see if the signals can clash from the separate machines. Though this method is not conclusive for all possible conditions, it does lend considerable insight into these possible contentions. Each block requiring inputs from other blocks should specify special restricting conditions if there are any. Examples of constraints are Counter A has inputs RESET 1 and LOAD. RESET 1 must be mutually exclusive to LOAD, and further must not precede load by at least two cycles. Another example would be Signal A to a block is an OR combination from two other blocks, but the resultant ORed signal must never be more than one clock period wide.

F. Successive Redefinition

The flow chart and the block diagrams can be defined very early in the design cycle. It is often started at a stage of the design where many factors are unclear. The amount of storage may be ambiguous, the function to be performed may be dependent upon who the customers are, and this in turn dependent upon the price and size of the part, which has yet to be determined. As these crude beginnings are formulated, many insights will be gained, as well as problems sighted. The errors will be corrected, ambiguities will be clarified, and the definition will progress. As these clarifications are done at a high level, some things will be developed further to a more detailed level (lower level). This process of clarifying, and redefining is the process of successive redefinition and if continued to a point where all blocks are brought to the lowest level, then the machine has been redefined to the point where the logic 'drops out'.

G. Mealy and Moore Machines

Mealy and Moore machines are used extensively and intuitively in most MOS circuits. The difference between the two machines is the dependency of the outputs upon the inputs. In the Moore machine, the output is dependent upon the state of the machine alone. In the Mealy machine, the output depends upon both inputs and state of the machine.

Regarding Mealy machines, though it is apparent that the use of the input conditional on outputs makes the machine more efficient in terms of reducing the number of states, the dangers of using it in a multi-machine environment could outweigh its advantages. Consider the linking of machines by use of the outputs conditioned by inputs from other machines. Should machine A output a signal conditioned by an input from machine B, then that output from machine A is used to condition the output of machine C, which in turn conditions machine D . . . . As can be seen, this situation could be perpetuated, which creates many stages of logic propagations without guidelines to protect the design. This situation could go unchecked far into the design cycle. A rule at this stage would resolve the problem. Possible rule 1 is not to use Mealy machines. Possible rule 2 is a conditional output from one machine must not be used to condition the output of another machine with a signal labeling convention at flow chart level, schematic level and logic simulation level.

Figure 14:
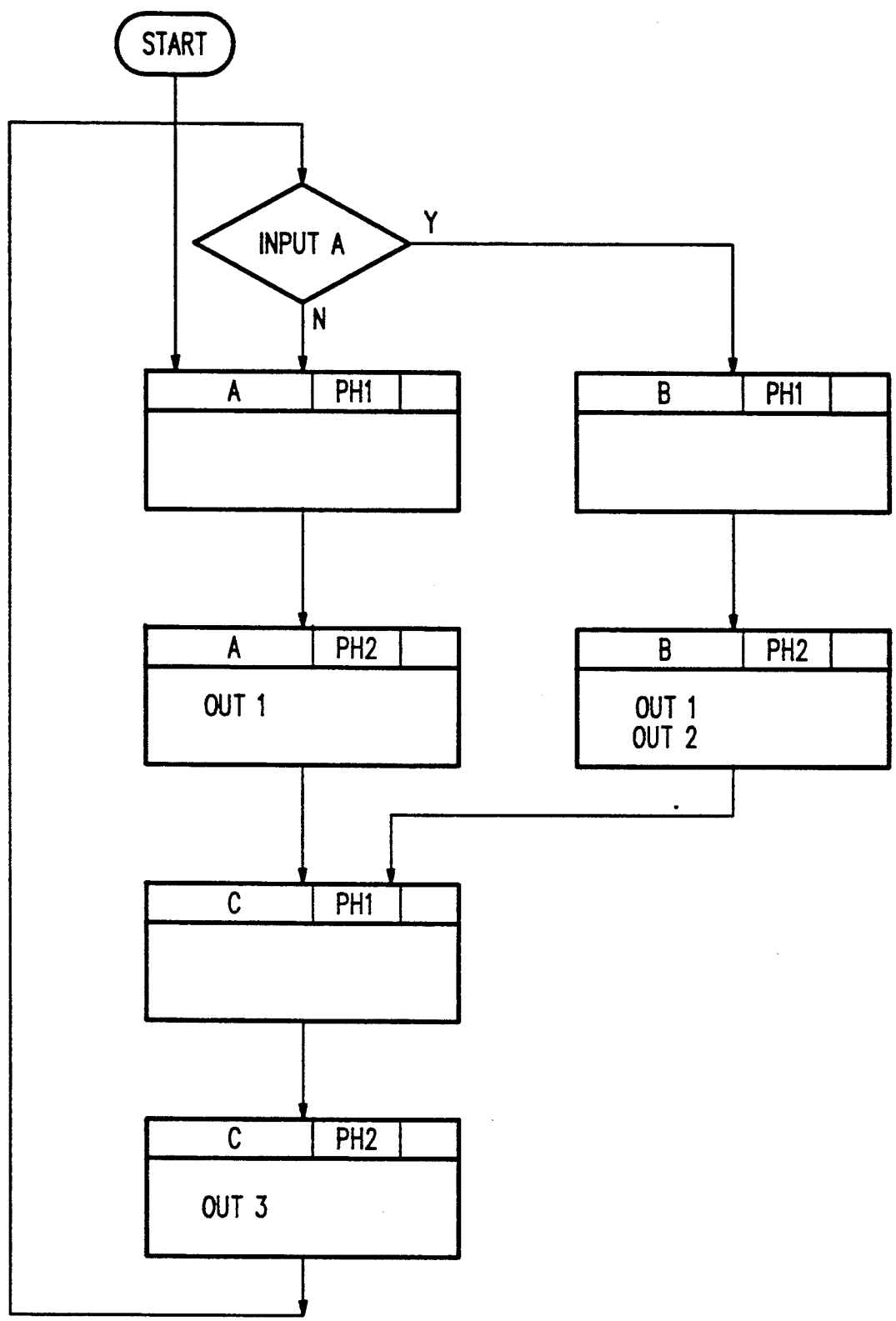
FIG. 14 illustrates the FIG. 13 Moore machine implemented in a master/slave Moore machine in flowchart form in accordance with the present invention.

FIG. 12 illustrates a Mealy machine in flowchart form with associated transition table and logic implementation. In contrast, FIG. 13 illustrates a Moore machine which accomplishes nearly the same operation with the exception of the input signal which is of a different 'type'. FIG. 14 illustrates the same function implemented in a master slave Moore machine.

It is significant to note that a subtle difference in the timing of the input signal has occurred between the first Mealy machine and the second Moore machine. This difference in timing tends to be a benefit in implementation for the Mealy machine, for the output can be given in the same cycle as the input. However, this flexibility may quickly turn into a detriment should it be used without restriction. Furthermore, it is generally the case that, if the larger system is considered, the use of the Mealy implementation is not a necessity.

Another interesting timing consideration is evident between the two implementations of the Moore machines. Here the timing difference is only a half phase, but this forces the implementation of the two phase technique. The alternative is of course to add redundant latches to the implementation, or to look at the larger system for a possible relief.

II. Logic Design

Many (CAD) tools have been developed for use in designing integrated circuits from manually-generated logic truth tables. Most of these CAD tools are targeted at techniques for implementing mid-range speed, medium complexity circuits. However, CAD design techniques have not kept pace with the sophistication of the fabrication processes that are available for implementing state-of-the-art high speed, high complexity integrated circuits.

The performance at these "very large scale integration" (VLSI) devices is typically limited by delays which may be generally categorized as follows:

(1) inherent delays;

(2) delays resulting from erroneously designed circuits;

(3) delays resulting from unforseen speed paths; and (4) delays resulting from the actual physical circuit layout being inconsistent with assumptions made by the circuit designer. Elimination of procedural design errors (2)–(4), which are often numerous and difficult to correct after a design has been implemented in silicon, is the focus of the integrated circuit design methodology provided by the present invention.

The design method described below is a technique by which a written functional specification for a VLSI integrated circuit is taken through the steps of logic design, circuit design, and layout in a regimented manner such that the final circuit implementation is virtually assured to be consistent with the logic design. In other words, according to the method of the present invention, if the logic is correct, then the circuit will function correctly and at the desired speed.

Although a CAD tool may ultimately be needed to check the many delay paths of the circuit, the logic will be implemented in a manner which allows the CAD tool to check the circuit's speed paths without assumptions or compromise.

Further, since the speeds of metal-oxide-semiconductor (MOS) circuits are a direct function of their physical layout, chip planning for MOS circuits is an essential element of design.

Thus, the design method of the present invention focuses on 1) a logic design technique that lends itself to easy speed checks, 2) a quick and easy method of assuring proper sizing of devices for speed, and 3) a common language, based on performance by which the circuit designer can communicate with the circuit layout function, be it a manual or a CAD implementation.

III. Previous Design Methods

Before discussing rules of logic implementation in accordance with the method of the present invention, it might be helpful to the reader to provide a review of some of the design problems that have led to development of the present method.

Many design problems are caused by poor logic implementation practices. This does not mean that the logic is wrong, but rather that it is a logic design that causes MOS circuits to be error prone. Among the more severe infractions is the combining of signals with consideration given to the functional content of the signals, but without regard for timing. Even more alarming is the possibility that there may not be a method available for detecting these errors and that there may be no documentation available to enable the tracking of this mix of signals.

Another area of logic implementation problems arises from the use of RS flip-flops in logic designs. Often, an alarming number of illegal conditions are used in a logic design without any documentation to indicate that a check was attempted. Again, the problem is not that the use of RS flip-flops is wrong; it merely lends itself to more errors.

Figure 15:
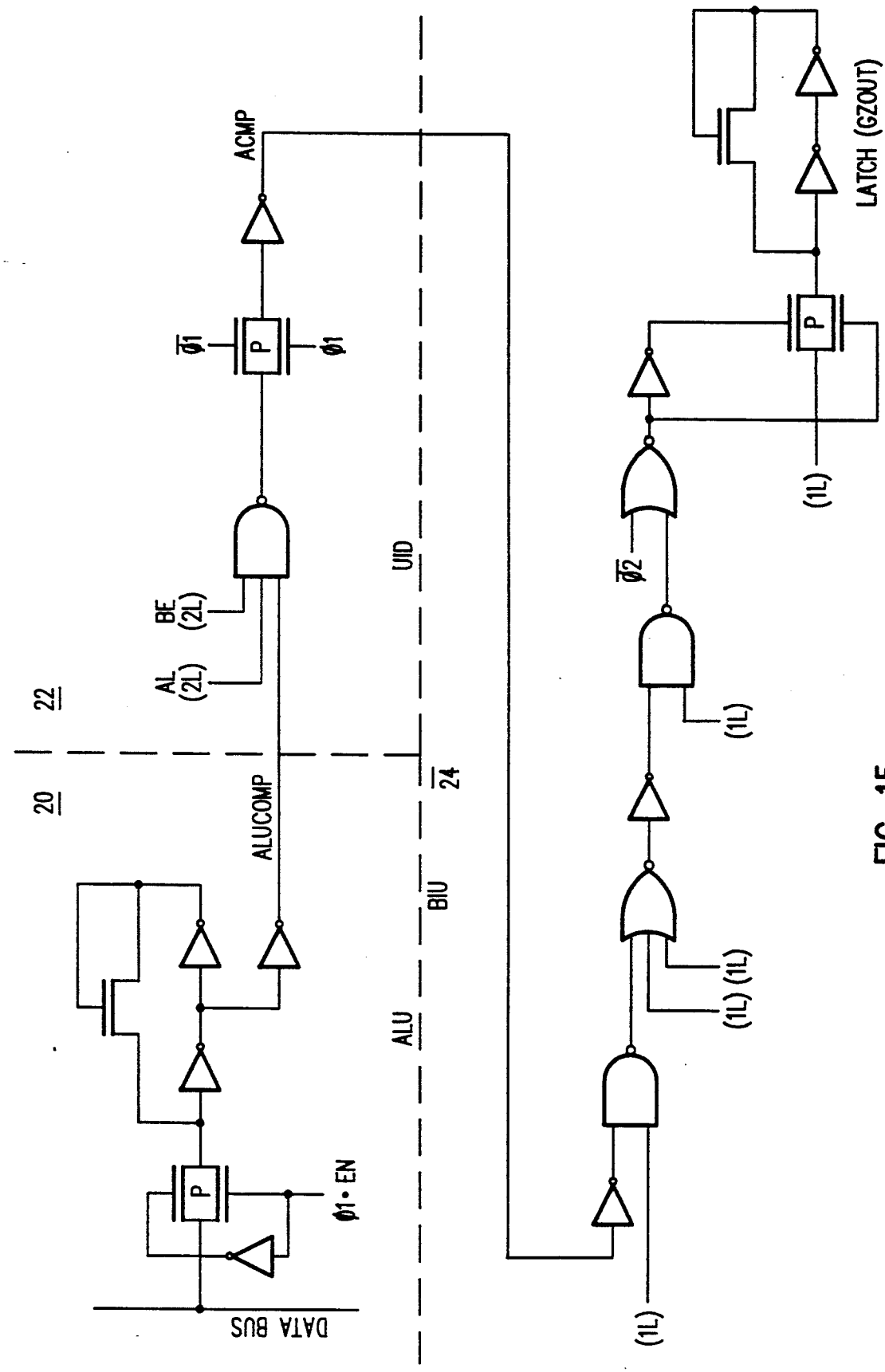
FIG. 15 is a logic diagram illustrating an example of how logic design problems can occur.

FIG. 15 provides an example of how a design problem can occur. Assume that a designer wishes to create a general purpose signal ALUCOMP which indicates that an arithmetic logic unit (ALU) 20 of a central processing unit (CPU) has completed its operation. As shown in FIG. 15, the signal ALUCOMP may then be used by other sections of the CPU to either inhibit or enable their operation, depending upon their respective algorithms. However, assume that the microinstruction decoder (UID) 22 wishes to qualify the ALUCOMP signal such that it can only go active at times AL and BE. Assume also that the AL and BE inputs to the UID 22 are both 2L signals types, as defined above. If the signal ALUCOMP is a 1L signal, then the desired net effect is UID output signal ACMP, which is subject to the following equation:

ACMP=(ALUC0MP * AL * BE)@PHI1

This is generally considered acceptable, since the AL and BE inputs are qualifying the signals to be used.

This may be true most of the time. However, assume that there is an exception where the signal ALUCOMP changes a half cycle after (AL * BE) becomes active. Assume also that the Bus Interface Unit (BIU) 24 uses this signal simultaneously with the UID 22 such that it can begin its cycle earlier rather than having to wait for response through the UID 22. If the BIU circuit 24 logically combines the ACMP output of the UID 22 with some other signals which take up six inversions, then the speed path is taxed and an unwanted spike can occur on the strobe to the latch GZOUT.

To avoid such problems, and as described in greater detail below, the method of the present invention establishes a set of rigorous constraints for avoiding the more error prone techniques of logic design. The philosophy can be stated as follows: Rather than assuming a circuit is correct unless proven incorrect, error prone circuits are not used.

IV. Synchronous Logic

Before discussing the method of sequential logic implementation in accordance with the present invention, a few examples are provided to illustrate the trade-offs encountered in logic design.

Figure 16A:
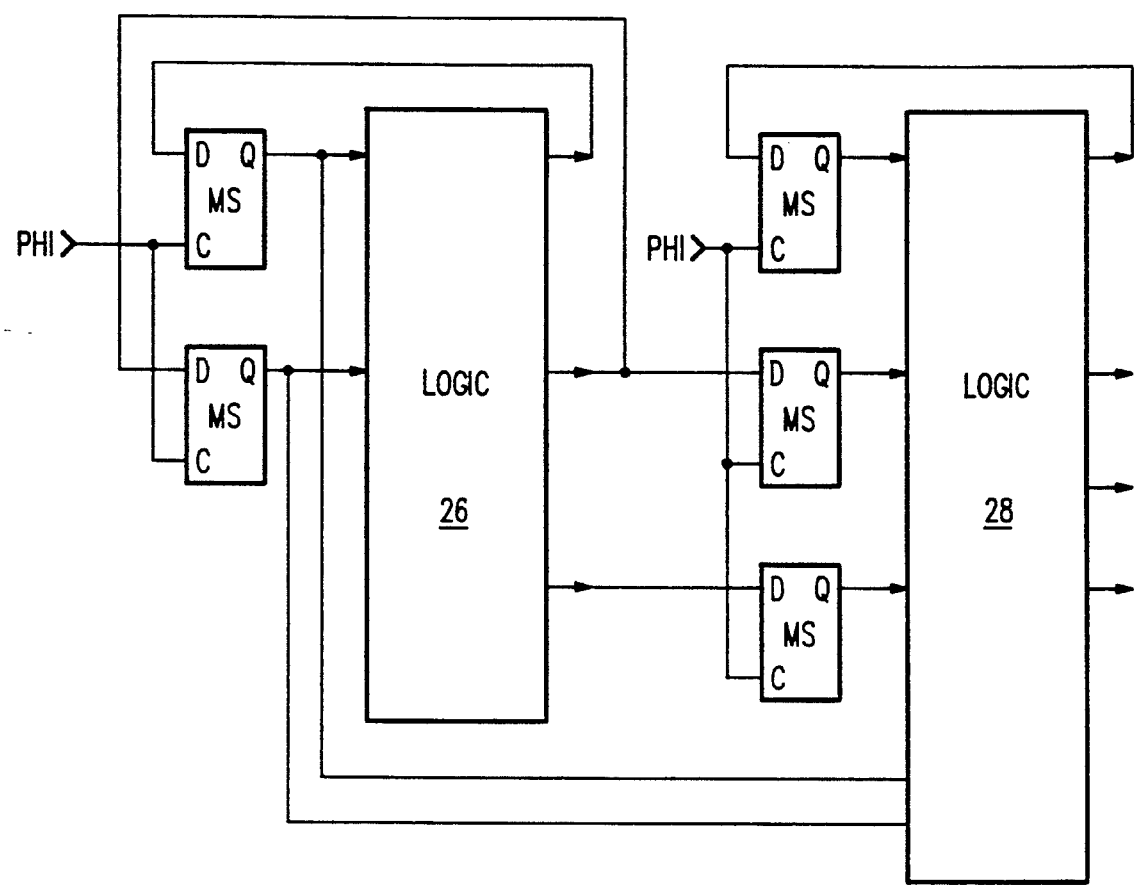
FIGS. 16A and 16B illustrate a classical implementation of single-phase, edge-triggered logic machines.
Figure 16B:
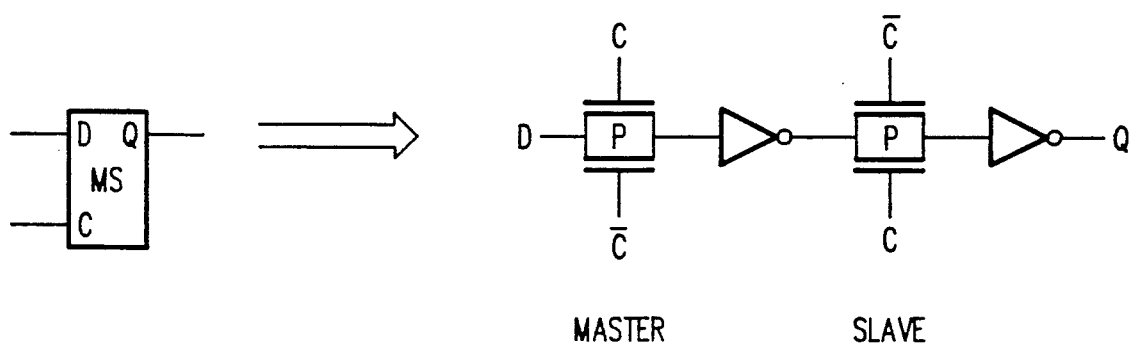

FIG. 16 shows a classical implementation of single-phase, edge-triggered logic machines 26 and 28. The memory elements MS are master-slaves, as shown in FIG. 16A, and the clocks are all driven by the same clock line PHI. Note that state transitions of the logic machines 26 and 28 are edge-triggered because of the master-slave memory elements MS.

Figure 17A:
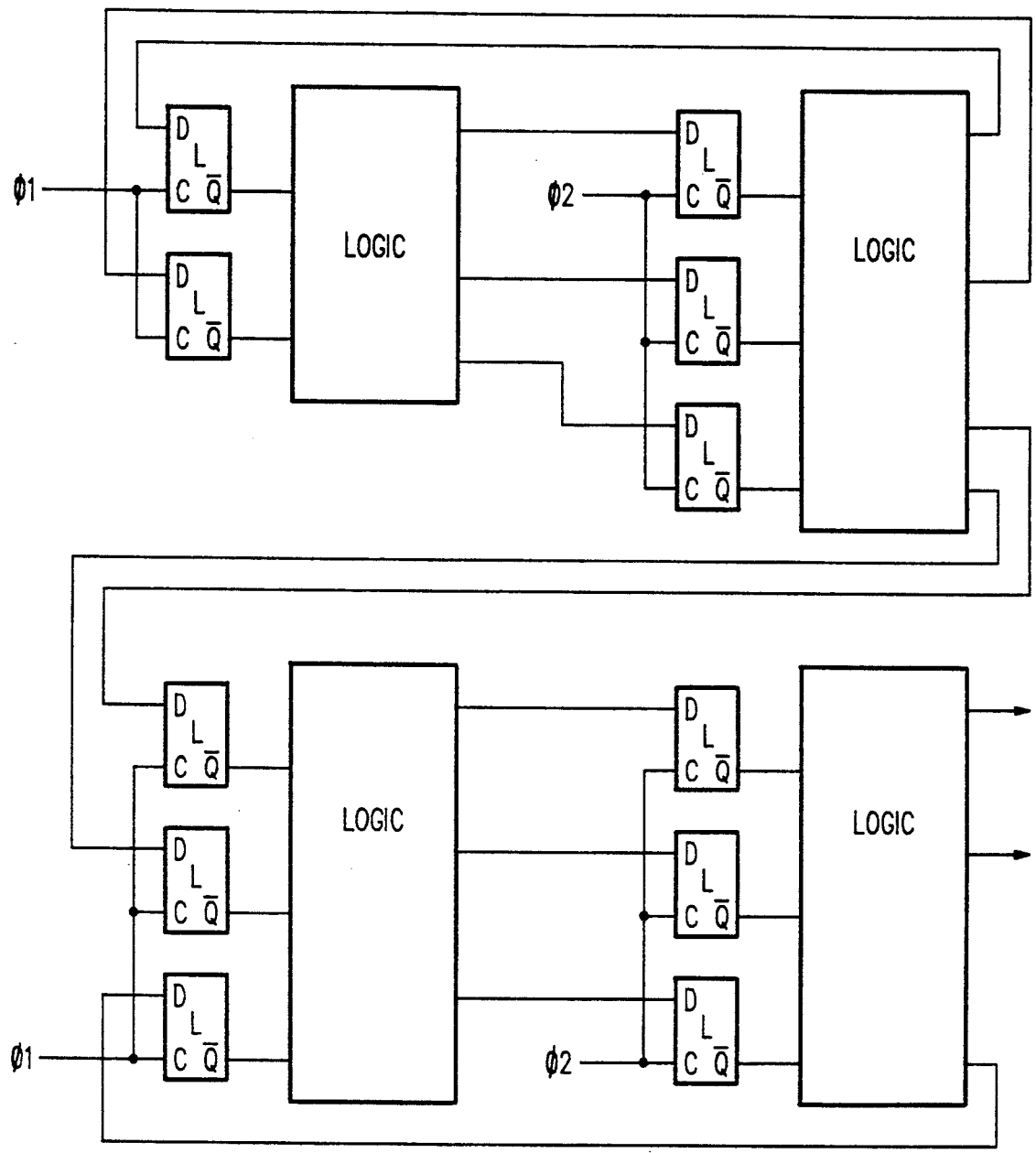
FIGS. 17A and 17B illustrate an implementation of two-phase logic using non-overlapping, symmetric clocks.
Figure 17B:
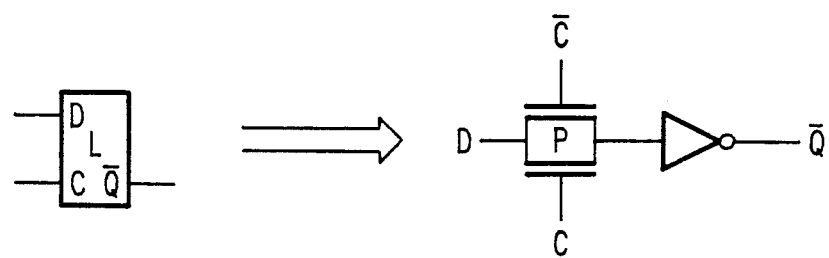

FIG. 17 shows an implementation of two-phase logic using non-overlapping, symmetric clocks PHI1 and PHI2. The distinction between the FIG. 17 implementation and the implementation shown in FIG. 16 can be thought of as merely moving the slave sections of the flip-flops past part of the random logic stages. However, there is advantage in the FIG. 17 implementation due to the flexibility provided by obtaining signals with 1L and 2L signal type timings, as opposed to the IL signal only timing of the FIG. 16 implementation.

Figure 18A:
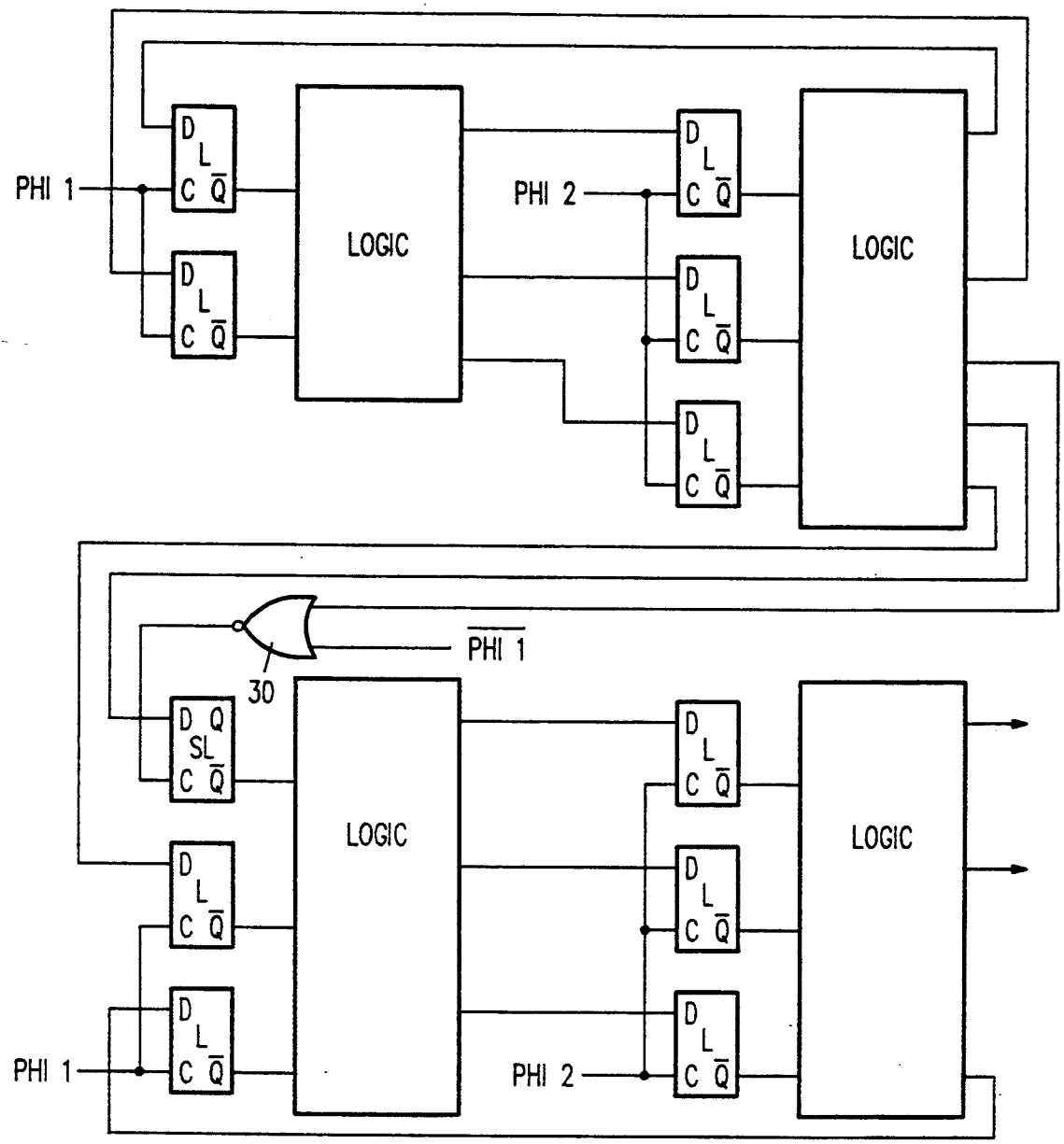
FIGS. 18A and 18B illustrate a circuit implementation similar to that shown in FIG. 17 with the addition of NOR gate 30 to illustrate techniques suitable to MOS circuit implementation.
Figure 18B:
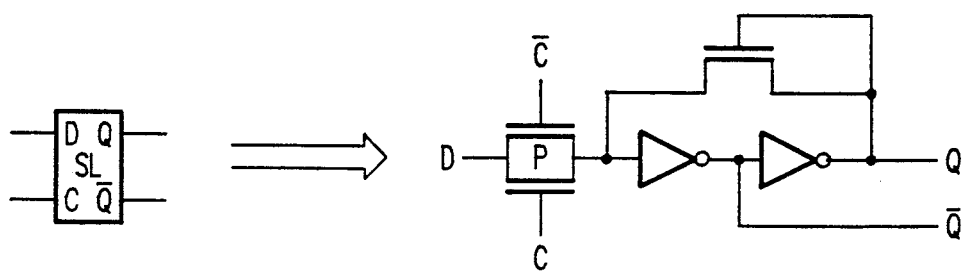

FIG. 18 shows an implementation similar to that shown in FIG. 17 with a single exception; in the FIG. 18 circuit, a NOR gate 30 is driven by one of the 2L signals and by a PHI1 clock. Though NOR gate 30 drives only a single static latch SL, the true advantage of using this conditional strobe circuit is that a great many latches L can be driven by a single strobe circuit, rather than creating the condition at the D input to each latch L separately. This ability to use strobe circuits 15 and 25 on data paths of 8, 16 and 32 bits is of significant area savings in MOS circuits.

However, there are dangers to this method. Thus, in accordance with the present invention, the following rules are created for its use:

(1) The signal types defined above, must be used.
(2) 1L and 2L signal types must not be mixed.
(3) The outputs from one block of logic (as shown in FIG. 18) must only feed latches, not another block of logic.
(4) The input to any block of logic must only come from signals of similar type.
(5) Only latches may be used as memory elements; RS flip-flops are not permitted.
(6) Latches must be driven by a PHI1 or PHI2 clock or 1S or 2S signal types. (Note: a multiplexer is not a latch and can be gated by a 1L or 2L signal type.)

V. Special Logic Implementations

In MOS technology, considerable savings can be obtained by using special logic implementations. The purpose of the following discussion is to introduce both the subtle potential problem areas of these implementations as well as their deceptively simple advantages.

Figure 19A:
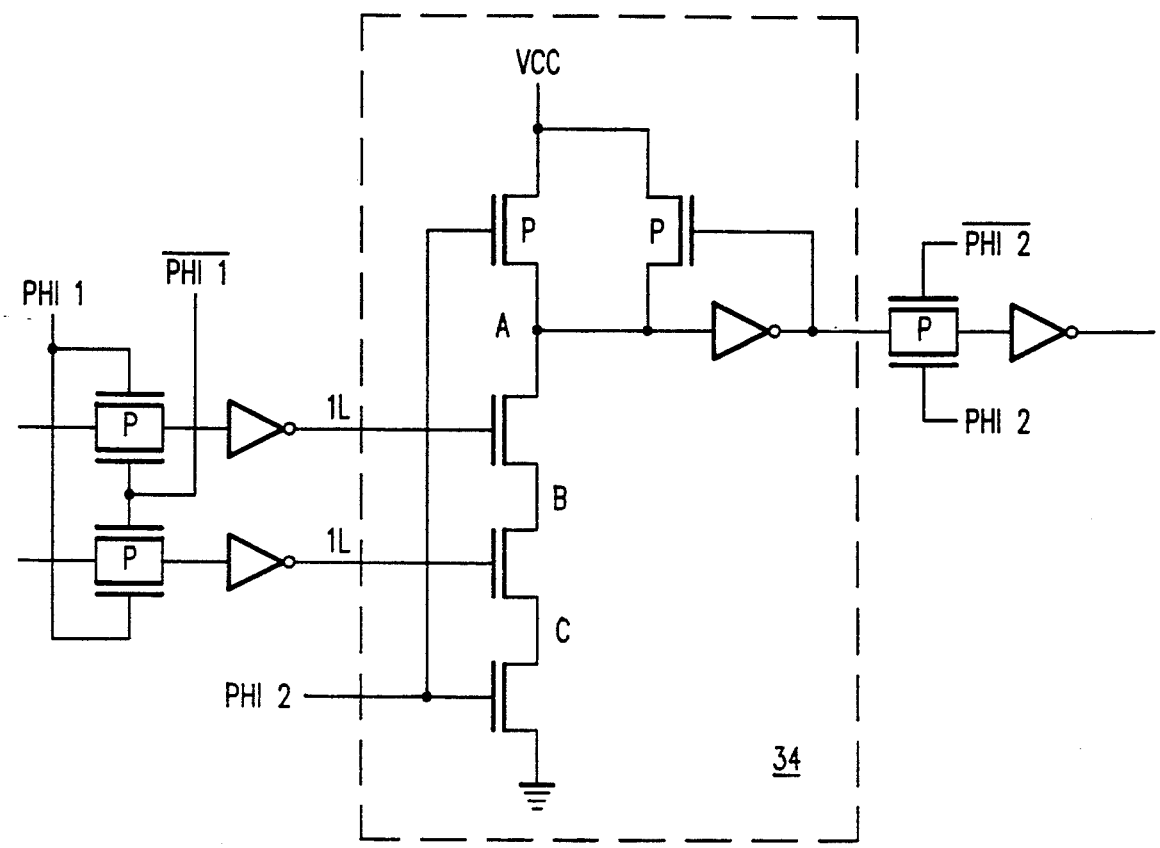
FIGS. 19A and 19B illustrate a conventional pre-charge circuit and equivalent logic replacement.

The circuit 34 shown enclosed in dotted lines in FIG. 19A is a conventional pre-charge circuit. During the time that clock PHI2 is low, node A is pulled (precharged) to VCC. During this period, the 1L input signals will become valid at the inputs. When clock PHI2 goes high, the pre-charge is off and node A transfers the logical condition to the output. The rules for using circuit 34 are the rules of the signal types as defined above.

Figure 19B:
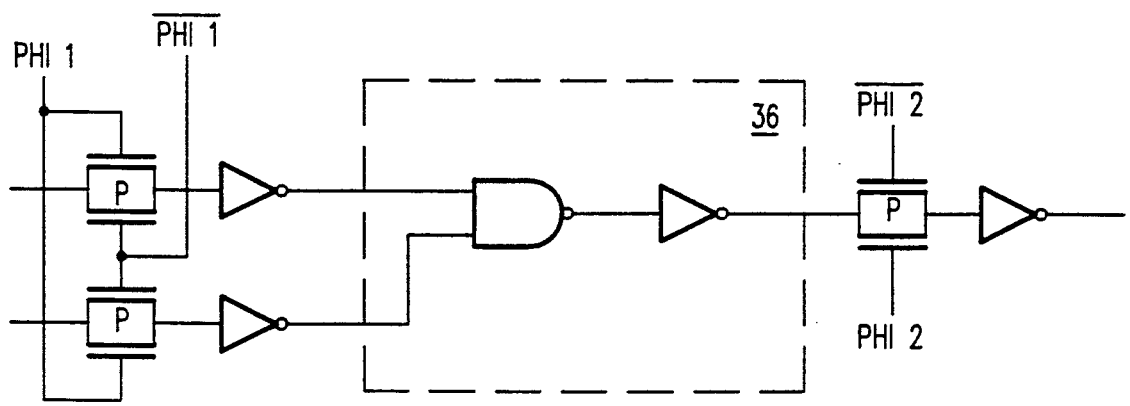

FIG. 19B shows an equivalent circuit 36 implemented in conventional logic gates.

At the output of the latch, the two circuits 34 and 36 will show very little difference, except perhaps for a short period when the output of the latch will be high for the pre-charged circuit. But this is not the problem of greatest concern.

Consider the inputs to the pre-charged gates, which are 1L signals. Each input is driven by an inverter rather than directly by the source of the corresponding transfer gate. If an inverter was not used, then, when the pre-charged stack consisting of nodes A, B, and C is discharged, the Miller capacitance from the source and drain to the gate will cause the gate voltage to lose the logic '1' it might have had.

Another problem can occur if the inverter following node A is omitted. If one of the inputs is a logic '0', then when the transfer gate driven by clock PHI2 opens, node A charge splits with the dynamic node and loses its charge.

Another problem occurs during the pre-charge time when node B is not able to charge completely to the positive supply VCC because of the threshold drop VT. When the pre-charge cycle ends, though the path between nodes B and C is off, node A will charge split with node B.

Still another problem is the danger of subthreshold leakage due to the ground of the inverter being unlike the ground of the pre-charge circuit. If the threshold is low and the temperature high, and noise exists between the two grounds, then the characteristic of the sub-threshold current is logarithmic and changes approximately by an order of magnitude for a gate/source voltage VGS of 0.1 V. The threshold VT is not actually the 0.5 V minimum that the parameter in the electrical specification indicates, since that parameter is given at room temperature, VDS=0.1 V, and for a device known as the reference device. Unfortunately, this reference device is often selected to be a long channel transistor, because it provides a consistent threshold reading. This approach is convenient for process engineers, but is not reflective of the device actually being used by the circuit designer.

Therefore the threshold voltage VT is determined as follows: Starting with the specified 0.5 V, the shorter channel length reduces the VT to 0.4 V. Then the temperature reduces it to 0.32 V. Next, since the drain/source voltage VDS is 5 V, the channel length modulates to reduce VT to an effective 0.24 V. Since the noise between the grounds measures 0.5 V, the transistors are actually barely on at times and very close to being on for much of the rest of the time. These conditions can cause discharge of the precharged node.

The list goes on, but the point is that even this relatively simple circuit has many potential problems.

Figure 20:
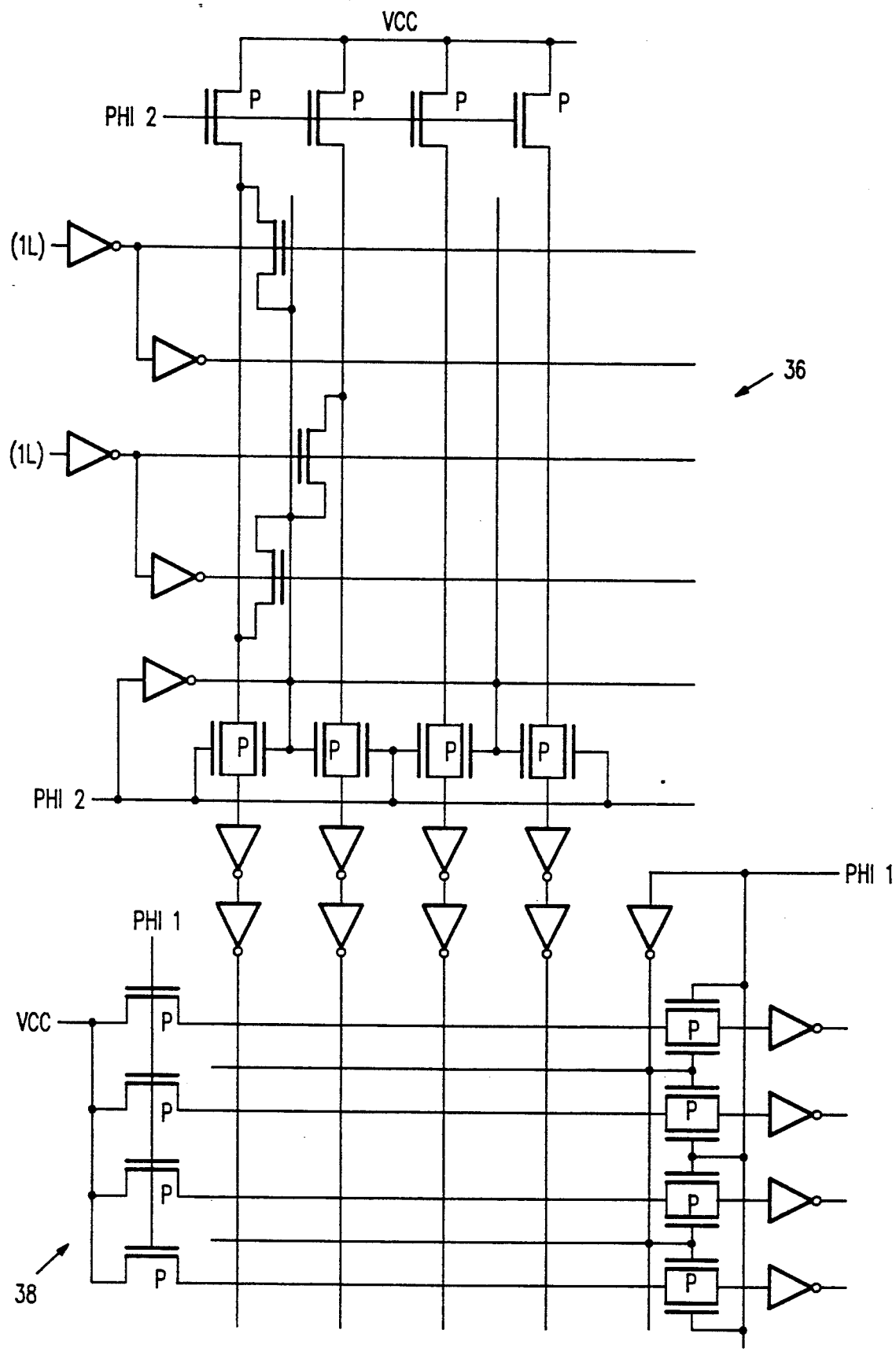
FIG. 20 illustrates two pre-charge circuits used to create a programmable logic array (PLA) representative of a master-slave implementation.

FIG. 20 shows two pre-charge circuits 36 and 38 used to create a programmable logic array (PLA). This PLA forms a NOR-feeding-NOR configuration, can be used to create any two level logic implementation, but requires two half cycles to perform its function. In addition to having all the problems cited earlier with respect to pre-charge circuits, it also has other problems, such as noise injection from adjacent nodes created by the parallel structuring. However, PLAs are relatively popular and are used generously in logic designs.

Figure 21:
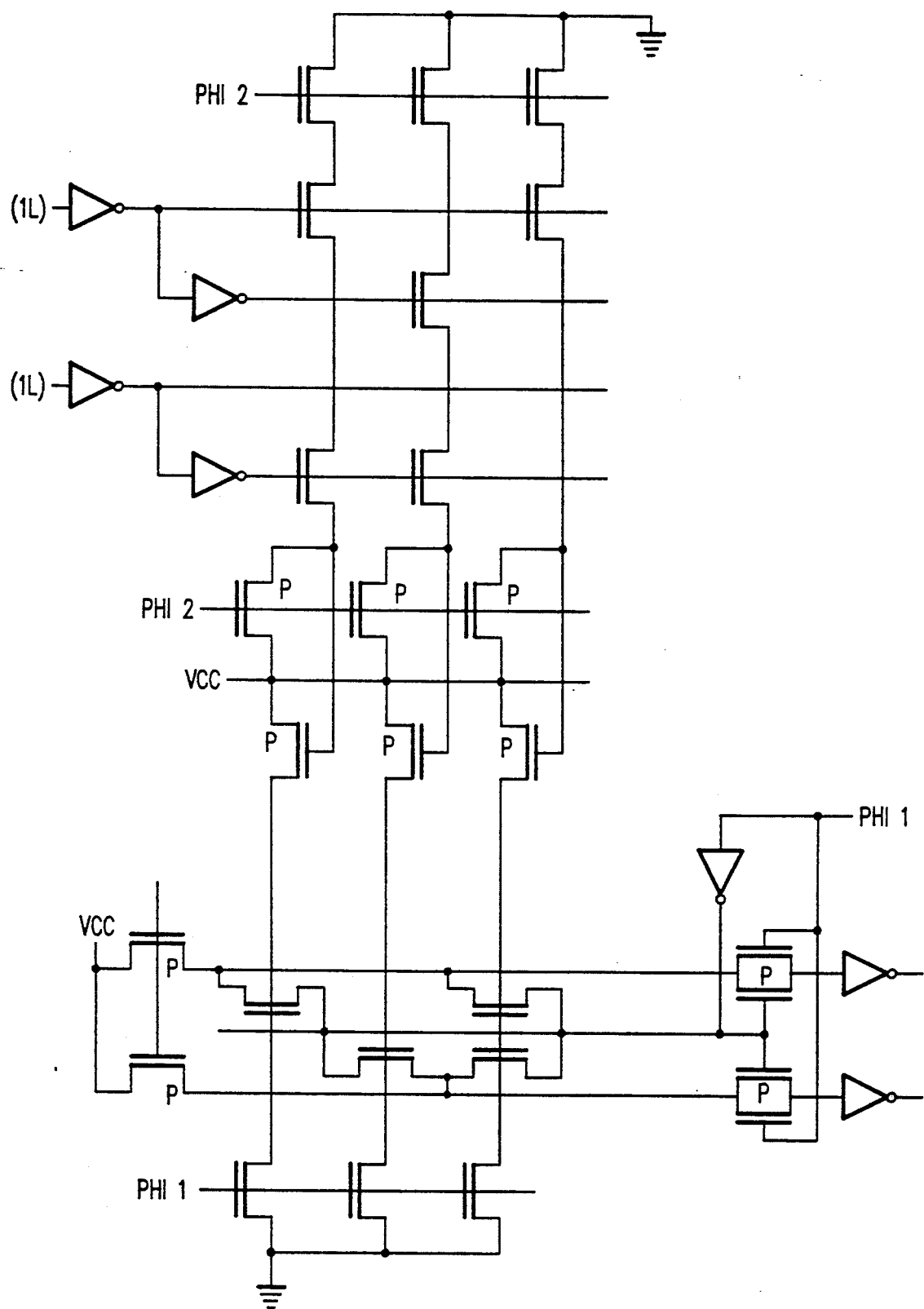
FIG. 21 illustrates a PLA using serial-to-parallel structure.
Figure 22:
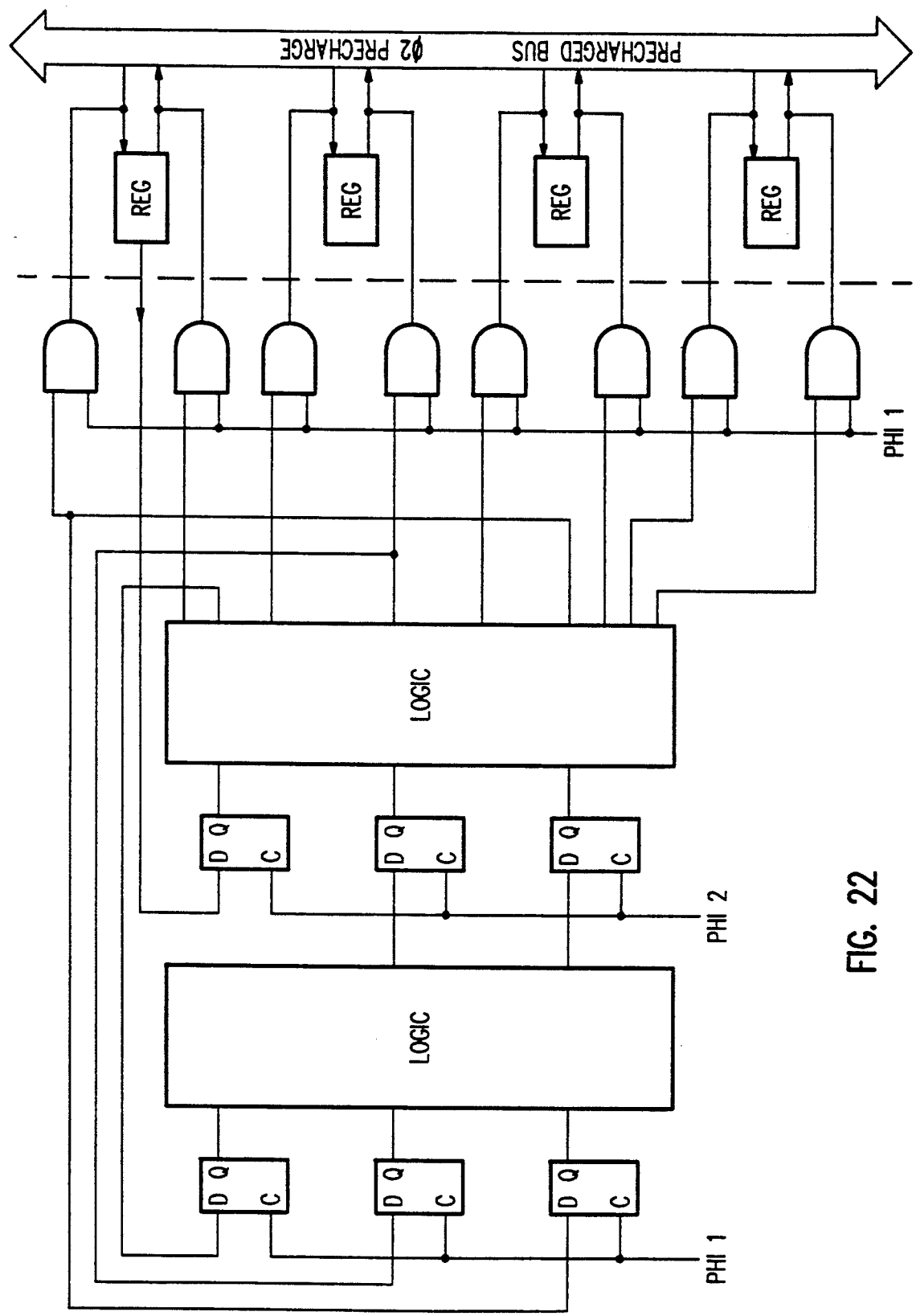
FIG. 22 illustrates a pre-charged bus structure.

FIG. 21 shows a PLA using series-to-parallel structure. While this structure allows the function to be performed in one half cycle, it should be use only with great care since the problems cited with respect to FIG. 19A are compounded for the PLA implementations The circuit shown in FIG. 22 is a pre-charged bus structure. It is similar to the pre-charged circuits discussed above in that the signal appearing on the bus is similar. However, the circuits differ both structurally and functionally. A further very important difference is that the rules of the signal types no longer hold and a special set must be created for the FIG. 22 structure.

FIG. 22 shows the bus structure along with a machine that drives it and the network of strobes. All rules created previously hold true from the left of the dotted line. To the right of the dotted line, however, new rules must be created. First, notice that all strobe lines crossing the dotted line into the bus structure are IS signal type lines. Note further that, for a particular register, the input is strobed in and the output is strobed out during IS time. This is not consistent with the signal type definitions provided above. This is taken care of by imposing the following restrictions: the read and write to the bus from a particular register must be mutually exclusive; all write strobes to the bus must be mutually exclusive; all read strobes must be mutually exclusive; and the output from the register crossing the dotted line is a 1L signal type and can be treated by the level 1 circuits as a standard 1L signal. With these conditions, and the bus being precharged during clock PHI2 time, the bus can be treated as a special case and interfaced to the rest of the circuit with the special conditions set at the dotted line.

Figure 23A:
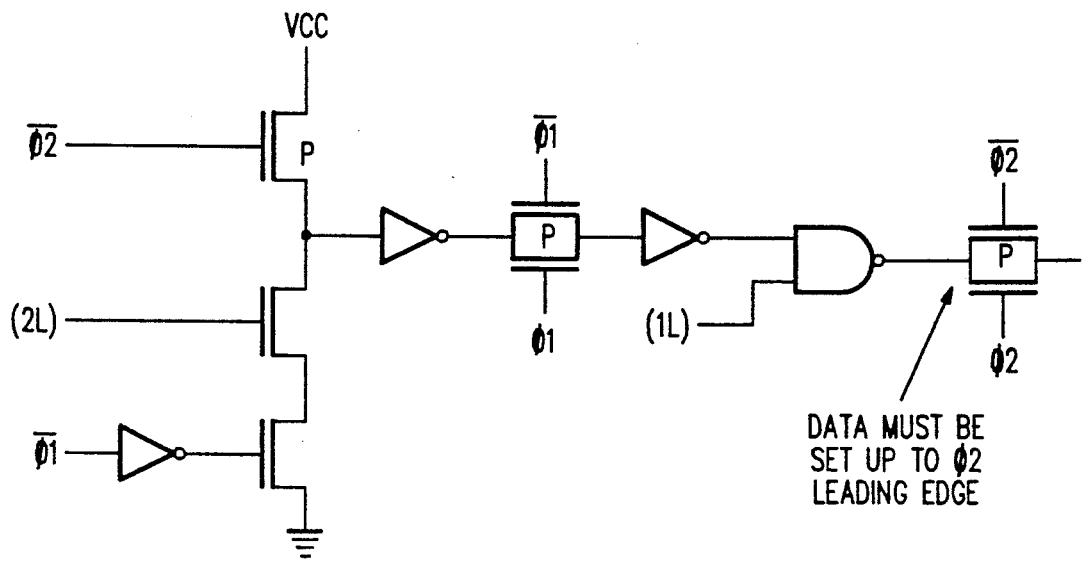
FIGS. 23A and 23 B illustrate a circuit wherein propagation delays are necessarily no longer than one half clock cycle.
Figure 23B:
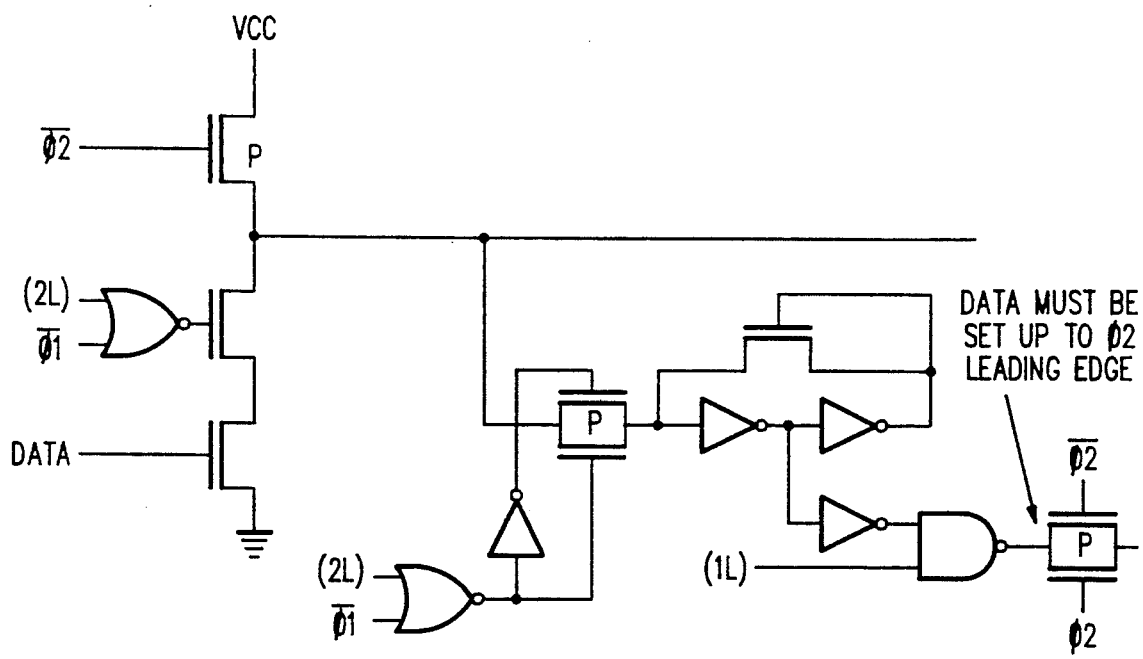

An added note of caution in all precharge networks is that, when speed considerations have been completed, the circuit designer implementing the precharge network will be responsible for the speed path interfacing to other circuits, to the point where the signal is set up at the second transmission device. The FIG. 23 circuit illustrates the rule by the arrows pointing to the second transmission gate.

VI. Introduction to Figures of Merit (FOM)

Aside from the just-described problems arising from special logic implementations, in MOS circuitry, and in particular MOS VLSI circuits, where, as described above, a large number of nodes must be considered for speed constraints, ample opportunity exists for creating design errors.

Errors can be created at the initial design stage by not accounting for proper loading or by discounting the routing. It is also possible to overlook some of the layout implementations on some nodes, or to overemphasize the importance of layout in other instances. While most of these errors are oversights, their magnitude can be very large.

Another aspect of the present invention provides a Figure of Merit (FOM) coarse speed estimate methodology for addressing this problem.

The following discussion introduces the FOM concept as applied to physical nodes of MOS circuits. The FOM value is directly proportional to speed, while being dependent only upon the drawn geometries of the circuit layout.

The FOM value is easily estimated, making it convenient for use by design engineers. It also acts as a convenient language for communication between logic design engineers and layout designers. Further closing the loop, the FOM concept can be used in the initial chip planning stages to predict device sizing.

A. Development

By making the initial assumption that a gross speed estimate will be sufficient, a simple saturation model can be used for an MOS device.

It is known that $$IDS = (W/L) * BETA * ((VGS - VT)**2)/2$$

and $$(DELV/DELT) = (IDS/C)$$

where
 DELV = Change in voltage
 DELT = Discharge time of node
 IDS = MOS device current
 C = Capacitance of node
The discharge time of a node can then be given as:

$$DELT = (DELV*C)/((W/L)*BETA*((VGS-VT)**2)/2)$$

Combining these terms gives $$DELT = PC/FOM$$

where $$PC = DELV/(BETA*((VGS-VT)**2)/(2*L))$$

$$FOM = W/C$$

In this form, the performance constant PC is dependent only upon parameters not controlled by circuit layout, and the FOM value is dependent only upon those parameters which are controlled by layout.

In a practical application, the performance constant PC is initially computed only for a given process condition, operating under a given supply voltage, operating at a given temperature.

The computation of the performance constant PC involves correlating it to a standard, such as an accurate circuit stimulator.

First, an initial "guess" is made based on worst case parameters. For example, if ---
DELV = 3.5 v
BETA = 17 microamp (at temp = 125 degrees)
Vgs = 4 v (for VCC of 4.5 v but input loss of .5 v)
Vt = 1 v
L = 3
then
PC = 3.5/(17*(9)/6) = 0.1373
---

However, since the MOS transister reduces in current in the linear region, the delay is increased about 30%. This brings the performance constant PC to approximately 0.18.

This is a reasonable start. But, since this result must be calibrated to a simulation, a constant K1 can be used in place of the 30%. A simulation with the same process conditions specified is run with a constant capacitor of, say, 100 ff. The time from 10% to 90% is measured and then K1 calibrated to provide an identical time.

In addition to the constant K1, there are two other constants which must be computed.

Constant K2 accounts for the non-linearity of the diffusion capacitance. After obtaining K1 for a proper performance constant PC, the diodes representing diffusion are added to the simulation; then K2 is varied to obtain calibration to the simulated value.

Constant K3 accounts for the non-linearity of the gate capacitance. A procedure similar to the computation of K2 is used, with the exception that the gate capacitance is used in place of diffusion capacitance. With the performance constant PC computed, the particular W and C will determine the FOM value and, thereby, the delay for that node, by dividing the performance constant PC by the FOM value.

Figure 24A:
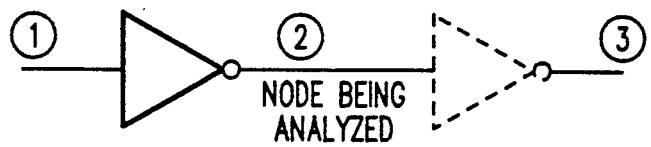
FIGS. 24A and 24B graphically illustrate computation of the discharge time DELT of a node and equal input to output DELT.
Figure 24B:
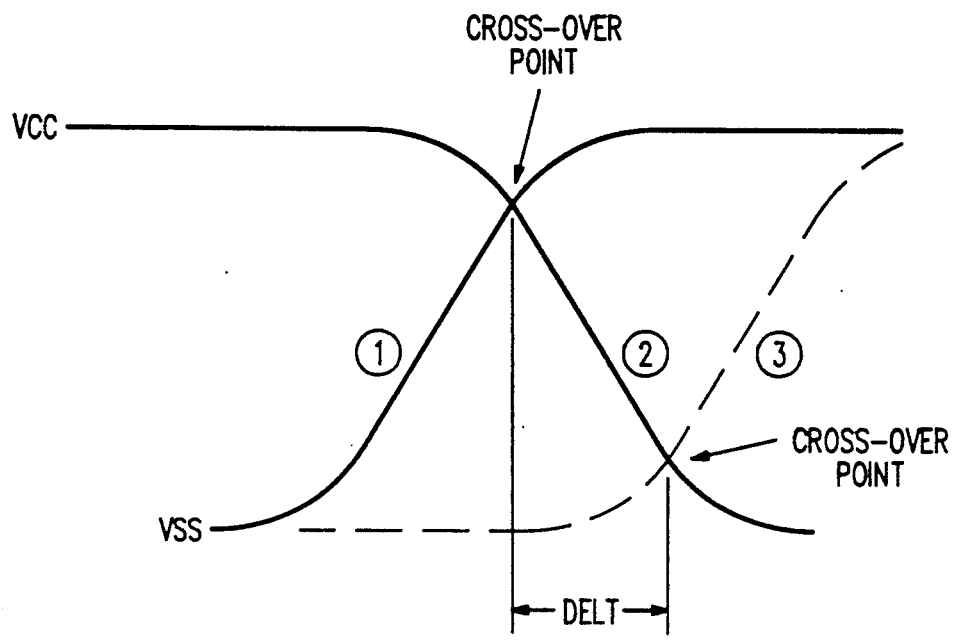

FIG. 24 graphically illustrates the DELT time being computed. The DELT time is the region between the cross-over points. These cross-over points are determined by the transition rate of the input relative to the potential rate of transition at the output. For a typical MOS process, the crossover points can be estimated at 10% to 90% of VCC, if all rise and fall times are designed to be relatively the same. Distributing delays evenly between the successive stages of a delay path optimizes the speed/area trade-off and reduces the influence of noise on delay.

B. A More Practical Equation

Though the equation developed above for node discharge time DELT is perfectly accurate, the form shown below lends itself to a more modular design technique.

$$DELT = PC((C_{diff}+C_{gate})/W)$$

$$DELT = PC((C_{diff}/W)+(C_{gate}/W))$$

In this form, the FOM value correlating to the $C_{diff}$ term relates to the self load of a device, while the FOM value correlating to $C_{gate}$ term represents the gate loads of devices that the node in question must drive. Consideration of these factors allows the delay computation to be made independently for the driver and each of its loads. Then the two are added together to obtain the total delay.

Tables II and III, which are provided at the end of this specification, list an assortment of standard logic elements and their associated FOM values and delays. Table II lists the FOM values for the self load portion (i.e. the $C_{diff}$ term) of the delay. Table III lists the delays associated with the gate loads (i.e. the $C_{gate}$ term)

Clearly, the information provided in Tables II and III can be easily loaded into a file for use by a computer program.

Tables II and III are created by initially defining the size of the logic components to be used as standards. The functions are listed under LOGIC TYPE and the strength is designated by alphabetic characters under the column DEVICE SIZE. The actual size of the transistors is given under the columns N CHAN WIDTH and P CHAN WIDTH. The relative sizes of the N and P device are chosen to produce equal drive in both directions. Note that the symbolic size of the logic gate is actually the strength capability and not the actual transistor size, as exemplified by a size C INV having an N transistor channel width of 4 microns, while a size C2 NAND has a N transistor channel width of 8 microns. The diffusion capacitances are computed as a function of the transistor widths, estimated from typical layout practices.

As an example, consider the diffusion capacitance DIFF CAP equation for a 2-input size C NAND gate.

---
| | |
|---|---|
| DIFF CAP = | (N+ CAP) + (P+ CAP) |
| where | |
| N+ CAP = | (Wn*NDL*NAC) + (2*(Wn + NDL)*NPC) |
| P+ CAP = | (Wp*PDL*PAC) + (2*(Wp + PDL)*PPC) |
| where | |
| NAC = | N+ area capacitance per sq. micron |
| NPC = | N+ perifery capacitance per micron |

-continued

| | |
|---|---|
| PAC = | P+ area capacitance per sq. micron |
| PPC = | P+ perifery capacitance per micron |
| NDL = | PDL = contact size + diff. overlap of contact + (n * separation between gates) |
| where | |
| n = | number of stacked gates − 1 |

With the diffusion capacitance obtained, and accounting for a reasonable amount of interconnect metal and poly capacitance under the column MTL/POL CAP, $$FOM = (Wn\ effective)/((DIFF\ CAP) + (MTL/POL\ CAP))$$

The term (Wn effective) is the strength of the N channel transistor. The Wn effective term is obtained by dividing N CHAN WIDTH by the number of stacked N transistors. The P channel transistor need not be considered because the strengths of the P channel and N channel transistors are equal. This means that the performance constant PC must be computed in terms of the N channel transistor parameters.

As an example of using Tables II and III in design, consider a 2-input size C NAND gate that drives a size C inverter and a 2-input size D NOR gate. Table II shows the self load of the NAND gate to be 2.697 ns. From Table III, we obtain 0.787 ns for a C size NAND gate (although only the size of the driver matters), driving a C size inverter and 1.35 ns for the same C size NAND gate driving a 2-input size C NOR gate.

Thus, the delay of the node equals 4.834 ns.

C. Complete Equation Development

Before actually defining the complete FOM equation, it will be useful to review some basic passive elements concepts.

Figure 25:
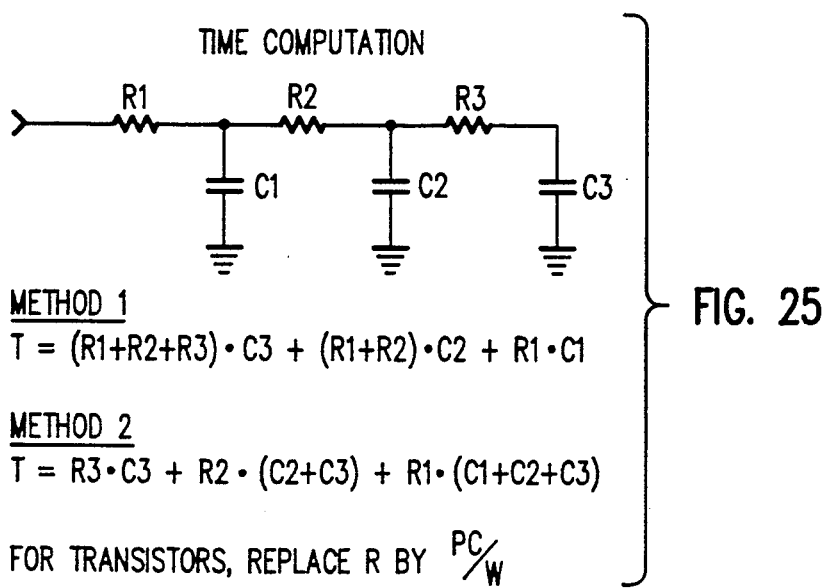
FIG. 25 provides the equations for obtaining time constants by applying current loop practices.

Referring to FIG. 25, the equation listed under the heading Method 1 shows the time constants obtained by applying current loop practices. Method 2 shows the equivalent equation after being reorganized. This restructuring applies the superposition principle to allow each resistance to be considered with only the capacitances to the right (or past) it.

Applying the principle of Method 2 as described above to the network shown in FIG. 26, the circuit 40 at the top of the FIG. 26 can be decomposed into the three networks 40a, 40b and 40c.

Figure 26:
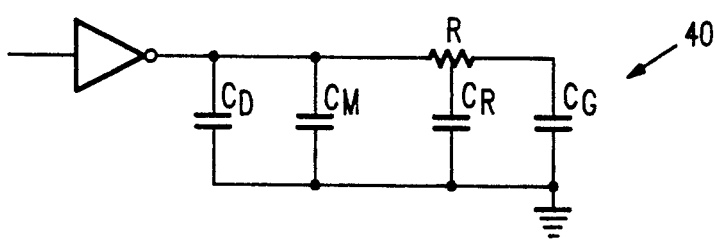
FIG. 26 illustrates the decomposition of a network for analytical purposes.
Figure 26:
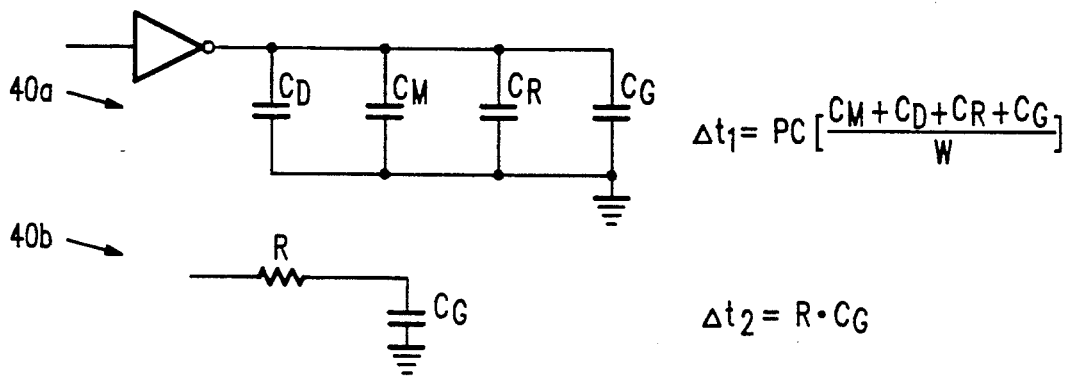
Figure 27:
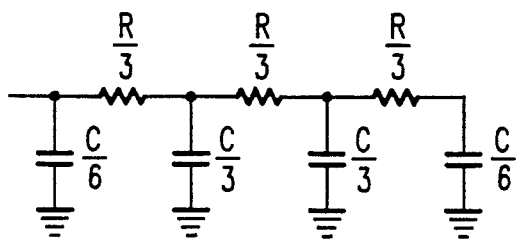
FIG. 27 illustrates the Pi network of $\Delta t3$.

The term Δt3 used in FIG. 26 represents a distributed capacitance along a resistor which, in turn, can be approximated by three Pi networks. When the time constant equation of Method I is applied to the Pi network of Δt3, shown schematically in FIG. 27, the equation reduces as follows:

$$\Delta t3 = ((R/3)*((C/3) + (C/3) + (C/6))) + ((R/3)*((C/3) + (C/6))) + ((R/3)*(C/6))$$
$$\Delta t3 = R*C/2$$

With the complete equation of node discharge time DELT (Δt) obtained, it is rewritten below in a convenient modular form.

$$DELT = (PC*(C_{diff} + C_m)/W) + (PC*C_g/W) (PC*C_r/W) + (R*(C_g + (C_r/2)))$$
or $$DELT = (SELF\ DELAY) + (LOAD\ DELAY) + (ROUTING\ DELAY) + (RC\ DELAY)$$
where
$$SELF\ DELAY = PC*((C_{diff} + C_m)/W)$$
$$LOAD\ DELAY = PC*C_g/W$$
$$ROUTING\ DELAY = PC*C_r/W$$
$$RC\ DELAY = R*(C_g + (C_r/2))$$

Figure 28:
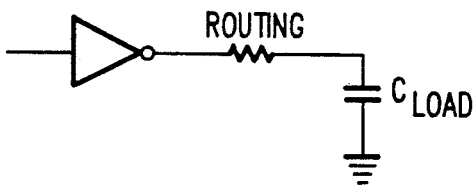
FIG. 28 provides a tabulation of delays for standard logic elements.
Figure 28:
Figure 28:
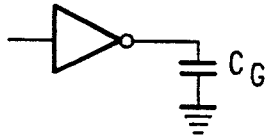
Figure 28:
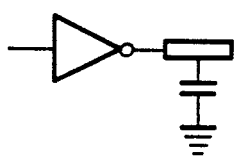
Figure 28:
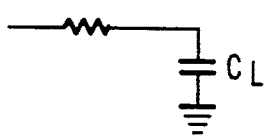

The delays for the standard logic elements have been tabulated by the four delay types listed above and are illustrated in FIG. 28. Tables IV–VII provided at the end of this specification are the tables identified in FIG. 28.

VII. Designing with FOM

Designing with FOM values involves more than computing the discharge time DELT of a node. As stated above, the object of the methodology of the present invention is that the final chip must work, and, in accordance with the concepts of the present invention, the underlying idea is the creation of techniques to minimize the chance of making errors. As stated above, the errors referred to are those caused by oversights, where the magnitude of the error is several times the expected node delay. The methodology of the present invention then is one which eliminates or reduces assumptions which might contribute to errors.

Initial preparations for using the FOM concept are: 1) determine the half cycle of the clock, 2) generate a standard node delay and default FOM, 3) define the beginning and end criteria for delay paths, and 4) create design rules.

The determination of a half cycle is done by taking the reciprocal of the operating frequency, dividing it by 2 to obtain a half cycle, and then taking 90% of that to account for dissymmetry. That is, $$Half\ Cycle = 0.9*(1/(2*Freq))$$

To determine the standard node delay, divide the half cycle by an expected high number of inversions within a phase partition. A phase partition is defined by the logic elements along a signal path contained between a PHI1 driven transmission gate and a PHI2 driven transmission gate. A reasonable number of inversions is 8.

$$Standard\ Node\ Delay = Half\ Cycle/8$$
$$Default\ FOM = PC/Standard\ Node\ Delay$$

If there are more than 8 inversions, then the Standard Node Delay cannot be used.

A delay path is a signal path traced through logic elements with the following criteria:
1. It must start at a PHI line.
2. It must end at:
   a) a transmission gate driven by the opposite PHI line or strobe line (xS line)
   b) an input to a pre-charge network of the opposite PHI
   c) an input to a strobe circuit of the opposite PHI type.

The rules for FOM circuit design are as follows:
1. All signal type rules as defined above must be followed.
2. All signal paths must be designed and checked.

3. All signals will be set up to the leading edge of the PHI line driving the latch.
4. Signal types will not be mixed at logic gates.
5. No R-S flip flops will be used.
6. Expected routing (from chip plan) must be included in design.
7. Schematics must contain FOM numbers for all nodes.
8. All nodes will be designated to meet the default FOM except with special waiver.

VIII. Design Example using FOM and Signal Types

Figure 29:
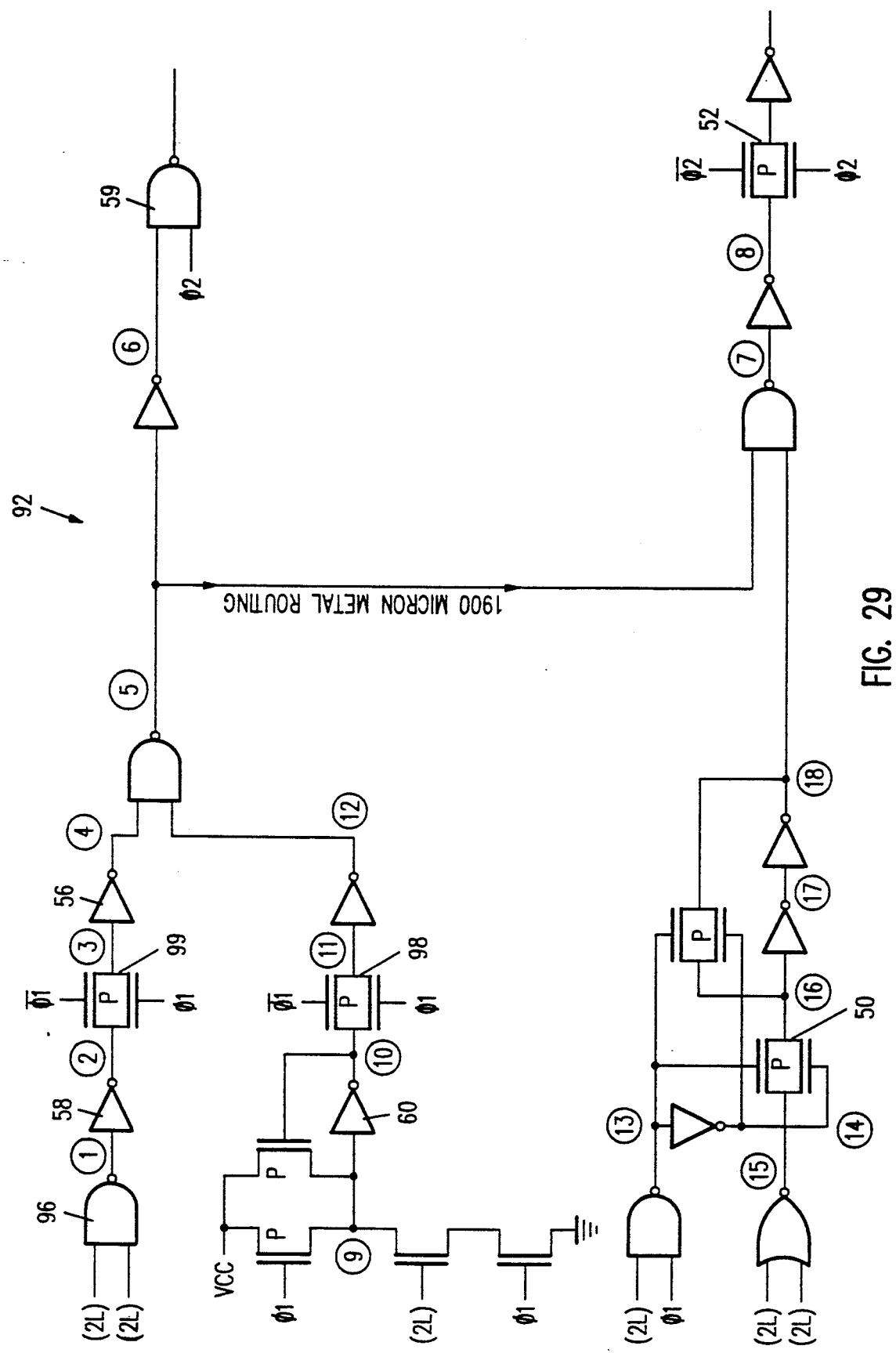
FIG. 29 provides a logic diagram utilized for analyzing a logic circuit for speed in accordance with the methodology of the present invention.

FIG. 29 shows an example of analysis of a logic circuit 42 for speed. The first step is to check the signal types for accuracy. At node 2, the dynamic latch 44 driven by PHI1 is a 2L input, because the NAND gate 46 of node 1 has inputs which are 2L; therefore, it is correct. Note that this input must be traced two stages back to be certain that it is not a 1P circuit. The node 10 is 1P, which inputs to a dynamic latch 48 driven by PHI1; therefore, it is also correct. Node 15 inputs to a static latch 50 which is driven by node 13, which is 1S. Since node is 2L, this input is also correctly structured, since 1Ps are not allowed to drive NOR gates, it is not necessary to trace back the otherwise necessary two stages. Quickly scanning, it can be seen that nodes 2, 4, 5, 11, 12, 6, 16, 17, 18, 7, and 8 are all 1L. This assures that the logic gates do not contain mixed signals (1L and 2L). Node 6 is 1L and drives a 2S circuit, while node 8 is a 1L input to a latch 52 driven by PHI2. Therefore, the signal types are all correct.

Assume that the procedure to obtain the PC has yielded a value of 0.18. Further, specify the frequency at 10 MHz to allow a half cycle time of 45 ns. Predicting a reasonable number of inversions to be 9, a standard delay is expected to average 5 ns, and a default FOM value will be 0.036. The units used will be W in microns, C in femtofarads, and time in nanoseconds.

Next, determine all delay paths to be considered. The seven delay paths are listed by their node numbers as follows:

| Path 1: | 3,4,5,6 |
| Path 2: | 3,4,5,7,8 |
| Path 3: | 9,10,11,12,5,6 |
| Path 4: | 9,10,11,12,5,7,8 |
| Path 5: | 11,12,5,6, |
| Path 6: | 11,12,5,7,8 |
| Path 7: | 13,14,16,17,18,7,8 |

Since paths 3 and 5 are subsets of paths 4 and 6, respectively, paths 3 and 5 can be ignored to leave only five paths. Since the longest path has only 7 nodes, the standard speed of 5 ns and default FOMs of 0.036 should cause no problems and all nodes will be designed to that number. The next step is to compute the transistor sizes. Here the question is where to start? In general, the answer is "at the node capacitance load of which will be effected least by the procedure of sizing". This will mean long interconnect routings, large parallel structures such as PLAs and busses, and output pads.

In the FIG. 29 example, one node exhibits a long routing interconnect. Beyond that, some assumptions must be made. Further, it is desirable to start at the end and work backward. Assume the load for node 6 by expecting the NAND gate 54 to be an F size since investigation showed it to drive 8 latches. At node 8, assume the transmission gate 52 presents a small diffusion load of 50 ff. Note, these assumptions should be written down such that when the total sizing is done, the assumptions can be checked and the sizing redone where the assumptions were wrong. This is an iterative process and should be done until correct.

With the aid of Table V, the load which is a 2 NAND gate is found along the left column under LOGIC TYPE. The load size of F is then found within the 2 NAND section of Table V. Following that row to the right, the values 6.99, 3.99, 2.59, 1.72 correspond to A, B, C, and D size drivers shown across the top of the table under DRIVER SIZES. A good choice is driver size D with 1.718 ns, since this will allow time for self loading of the inverter. Next, Table IV is checked for the self loading of a D size inverter, by finding INV under the column LOGIC TYPE. Then, by finding C under DEVICE SIZE, and tracing to the right, the value 2.094 ns under the TIME DELAY column. The total delay for this node is then 3.81 ns. Since this is under the standard delay, the default FOM should be acceptable for communicating to layout, so a FOM value will not be specified to indicate the default FOM.

Next we size node 8. Since we assumed a capacitance of 50 ff, we must find a W which will give us about 2 ns, again to leave some time for self delay.

$$W = PC*C/(DELT) = (0.18)*(50)/(2) = 4.5$$

This is approximately W=4, which is a C size. Referring to Table III for a C size inverter shows us 2.51 ns. This will give a total of approximately 4.5 ns, and again a default FOM will be adequate.

Node 7 can be computed similarly to node 6 to obtain a size of C with a delay of 4.4 ns and a default FOM.

Node 5 can now be computed since its loads are defined. In addition to the inverter and NAND gate, there is a routing capacitance which will be the significant load. To estimate the driver requirements for this load, refer to Graph 1 at the end of this detailed description. The routing length is given in Graph 1 in hundreds of microns along the X axis while the delay is given in nanoseconds along the Y axis. The various sizes of the drivers are given for the radial lines. For the case of 1900 microns of routing, 19 is found along the axis and, if a delay of 4 ns then the intersecting point indicates that a size somewhat larger than an F is needed. Or, given an F size, approximately 4.5 ns is obtained. Using an F size, the delays associated with the loading of the size D inverter and added on, the size & NAND and the size F self load, to give approximately 6 ns. This is larger than the standard speed, so the FOM value is computed as follows:

$$FOM = PC/6 \text{ ns} = 0.18/6 = 0.03$$

This is indicated on the schematic as a message to the layout designer that a leniency has been taken into account on this node.

The same procedure can be used to compute nodes 4, 12, 18, and 17. The sizes will be D, D, C, and C, respectively.

Node 3 will require a special technique to compute the sizes. Before computing this node, refer to FIG. 30 for a general consideration of this type of circuit.

Figure 30:
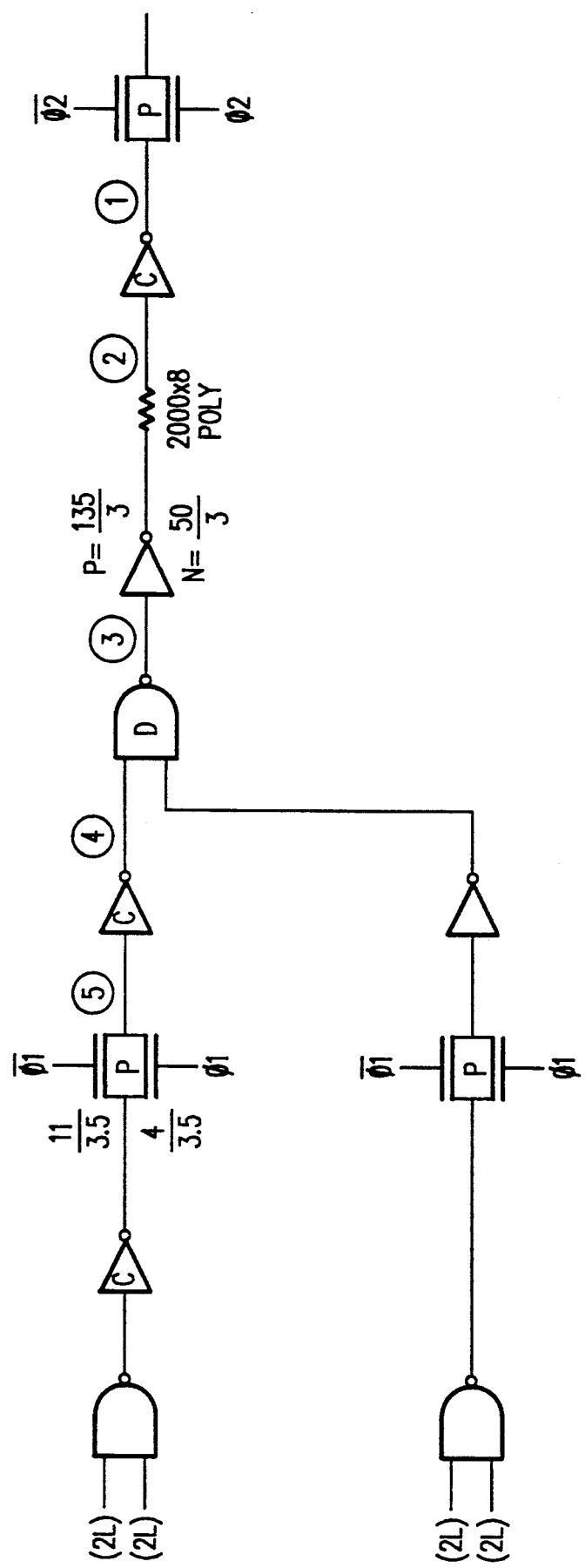
FIG. 30 provides two possible paths of consideration for node 3 in FIG. 29.

The circuit illustrated in FIG. 30 shows two possible paths of consideration. The first is if node 1 has already attained its value before PHI is enabled (node 1 is "set up" to PHI). In this case, the path from PHI being enabled to drive node 3 must be computed. Only the drive to switch capacitor C3 must be considered, since node 2 has already switched. However, since the path to ground consists of two transistors (WN1 and WN2), their net effect must be considered. If they were the same size, then the effective W would be WN1/2. In general, however, the effective W would be:

W effective=(WN1*WN2)/(WN1+WN2)

The net effect to compute DELT is

DELT=PC/((W effective)/C3)

Consider the case where PHI is enabled before node 2 changes (node 2 is not "set up"). Then the component of C2 must be added to the time taken to switch C3 alone. The DELT for this would be DELT=PC/(Wn1/C2)=PC*(C2/Wn1)

The use of this scheme allows C3 to be computed consistently and independently regardless of whether node 2 is set up, then add the value of node 2 if it is not.

To continue the evaluation of node 3 of FIG. 29, since the node 2 is set up to PHI1, the load set up by the inverter 56 being driven by node 3 must be considered and the W effective necessary. To compute the size of the transmission gate 44, either double the W effective and specify the inverter 58 of node 2 the same, or if WNI (size of the node 2 inverter) is specified solve for WN1 from the W effective equation shown above.

The evaluation of node 11 will be done in the same way as node 3. However, since node 10 will not be set up, node 10 must also be computed. The inverter 60 driving node 12 had previously been computed to a size D. The sizes of the inverter 60 and coupler 48 are made equal to obtain maximum drive capability. This being true, the combination of inverter 60 and coupler 48 are stacked devices and behave very similarly to a 2 input NOR gate. The reason for a NOR gate, as opposed to a NAND gate, is that the NOR gate used stacked P channel transistors which create the larger diffusion capacitance to approximate the inverter 60 and transmission gate 48 more closely. With this, and referring to both Table II and Table III, it can be seen that the self load delay is much larger than that driving the load, for the case of a 2 input NOR driving a size D inverter. Compromising size for speed, a size C under 2 input NOR is selected to give a 4.12 ns self delay and a load delay of 1.19 ns, to give a total of 5.3 ns. Notice that although a size C was selected, both the size of the inverter 60 and transmission gate 48 will be doubled, providing a size E selection. Node 10 can be computed as the self load of a size E inverter to be 1.09 ns. The total between nodes 10 and 11 will be 7.4 ns. Should this be compared to a simulation, node 10 will have a delay of 7.4 ns and not 5.3 ns.

Node 9 can be computed as a 2 input NAND gate by the same reasoning as the computation for node 11. The P channel retention device should be selected to be small such that it does not interfere with the speed. A more general case of precharged structures will be covered below.

Node 16 can be designed similarly to node 3, while node 13 and 14 can be designed similarly to node 8 by estimating the loading capacitance.

IX. Sizing to Optimize Speed Using FOM

The ability of the FOM value to break the delay time into modular elements enables a convenient means of analyzing and improving speed paths. The fact that the actual elements contributing to the delay are visible will allow efforts to be focused on the proper problem area. A theory that speed is optimized when the FOMs of the nodes contributing to the speed path are equal helps considerably.

Figure 31:
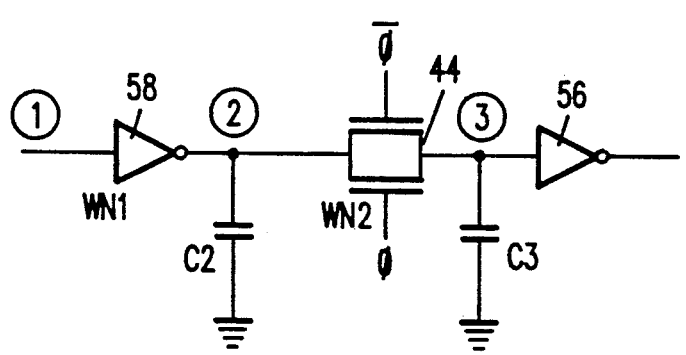
FIG. 31 provides a logic diagram utilized for speed analysis in accordance with the methodology of the present invention.

Consider the circuit in FIG. 31 and refer to Table VIII at the end of this specification. The top section of Table VII computes the speed for the circuit of FIG. 31. The node numbers are given along the left column, while the four columns to the right of it insert the parameters of the network. The other four columns compute the FOM and delay times, while the rows at the bottom provide the total times. Notice that the Active FOM column shows node 3 to be very low, while the others are very high. This will almost certainly prove to be a poorly designed circuit. In an effort to average the FOMs of nodes 2 and 3, we decrease the size of the inverter driving node 2. The lower section of Table VIII reflects the results, as the speed has improved with smaller devices.

A side issue to this example is the use of the spreadsheet in design. As can be seen from Table VIII, the spreadsheet can be used to output clean copies of the design analysis. It does more, however, since the diffusion capacitance is automatically calculated by selecting an equation similar to that which was used to create the FOM tables associated with FIG. 28 (i.e., Tables IV—VII). Further, the gate capacitance of the load stage is computed automatically. Of course, the FOM values and the delay time are automatically calculated as well. This means that the designer can make changes interactively and receive instant feedback as to the net effect. As an example, the size for the node 2 inverter was determined by changing the value of its DRIVER WIDTH while watching the value of TOTAL T. The value 21 is an optimal value; as it is decreased or increased, the value of TOTAL T will rise.

X. Applying FOM to PLAs and Busses

The commonality between PLAs, ROMs, and busses is that they have many parallel devices driving a common line. In most cases, this feature causes the design of these structures to be done as a pre-charged circuit (discussed in detail above). Therefore, this discussion will be limited to pre-charged PLAs, ROMs, and busses.

The following discussion will not attempt to cover all variations of these structures, but rather to cover one implementation while exposing the reasoning such that the theory can be applied to any structure.

The significant difference for the circuit speed consideration of these parallel structures is that it has a multitude of diffusion nodes and connections, while the drivers are most often mutually exclusive. This means that one small drive transistor must drive the multitude of nodes. This being the case, the discharge time DELT equation will be modified slightly to reflect this condition.

DELT=PC/FOM where

FOM=W/((n*($C_{diff}$+$C_{metal}$))+$C_{gate}$)

The $C_{gate}$ is generally much smaller than the sum of $C_{diff}+C_{metal}$, and can be disregarded. $C_{diff}$ is generally the dominant capacitance, but this depends on the specific application. The structures are generally regular; therefore, a single node and segment can be calculated and multiplied by n. Rewriting the equation:

DELT = (PC * n)/FOM

Or, in other words, given a performance constant PC and the number of nodes n that it is desired to design with, the FOM value will limit the speed. Or given a PC, FOM and frequency, the number of parallel structures is limited. So why not make the FOM increasingly larger by increasing W?

```
FOM = W/C_diff
where
C_diff = (CP*2*(W + MNDFWD)) + (CA*W*MNDFWD)
MNDFWD = minimum diffusion width
then
FOM = W/((CP*2*(W + MNDFWD)) + (CA*W*MNDFWD))
dividing through by W
FOM = 1/((CP*2) + (CP*2*(MNDFWD/W) +
(CA*MNDFWD))
FOM = 1/((CP*2*(1 + (MNDFWD/W))) + (CA*MNDFWD))
```

Since the term MNDFWD is generally small compared to W, and becomes even less significant as W becomes larger, increasing W does not help. However, if the shape of the diffusion can be changed for a given W, then there would indeed be a speed increase.

An example would be to sandwich one piece of diffusion between two gates such that the sharing of diffusion cuts that capacitance to one-half. Another example would be to create the W in a circle to minimize the diffusion for a given W. Any geometric configuration to achieve an increase in the FOM will increase the speed of the structure.

XI. Layout With FOM

Much of the FOM method is created with layout in mind. This is a key element in FOM, since the performance (or speed) is directly related to the physical geometries created in the layout.

The object of FOM for the layout designer is, of course, to be able to reasonably predict the FOM while planning his layout. This planning stage is where the freedom of choice is still available. But, before the layout designers can get to a stage where FOM is intuitive, we must use some aids to show how it needs to be done. There are only two things to show here. One is how to calculate the effective W, and the other is how to calculate the capacitance.

A. How to Calculate Weff

Weff (W effective) is the effective N channel width given a standard length. This effective width is the W of a transistor with length L, which is equivalent in drive capability to all N transistors connected in series from the node with respect to ground.

To compute this value of two transistors W1 and W2.

WEFF = (W1*W2)/(W1+W2)

For multiple nodes, each successive transistor Wn can be included in the computation by using the same equation form.

WEFF = (WEF'*Wn)/(WEFF'+Wn)

where WEFF' is previous WEFF

If the transistors are of the same width W, then the computation simplifies to:

WEFF = W/n where n is the number of N channel transistors to ground

B. How to Calculate Capacitance

Experience has shown that the easiest way to determine capacitance is by use of tables. By using a table for diffusion capacitance, metal routing capacitance, poly routing capacitance, and gate capacitance, the approximate capacitance can quickly be estimated from layout. The values are generally close enough to allow for accurate layout. A copy of the values used are contained in Tables IX-XII at the end of this specification. It is important to note that the values in these tables reflect the correction constants for factors such as non-linearity of gate capacitances, as with respect to FIG. 26.

XII. Measuring FOM on an Existing Layout

Figure 32A:
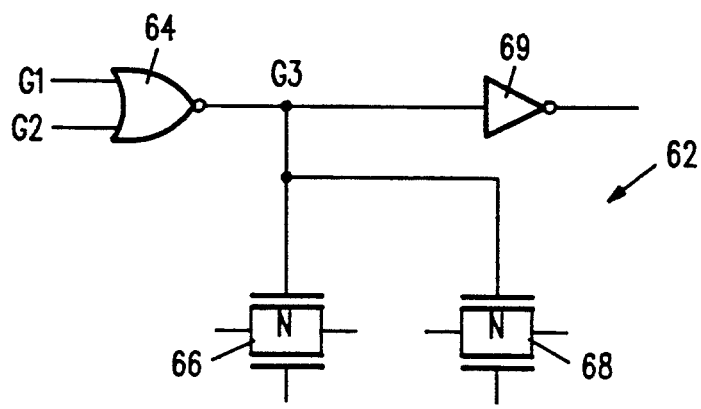
FIGS. 32A and 32B provide a CMOS circuit and corresponding layout, respectively.
Figure 32B:
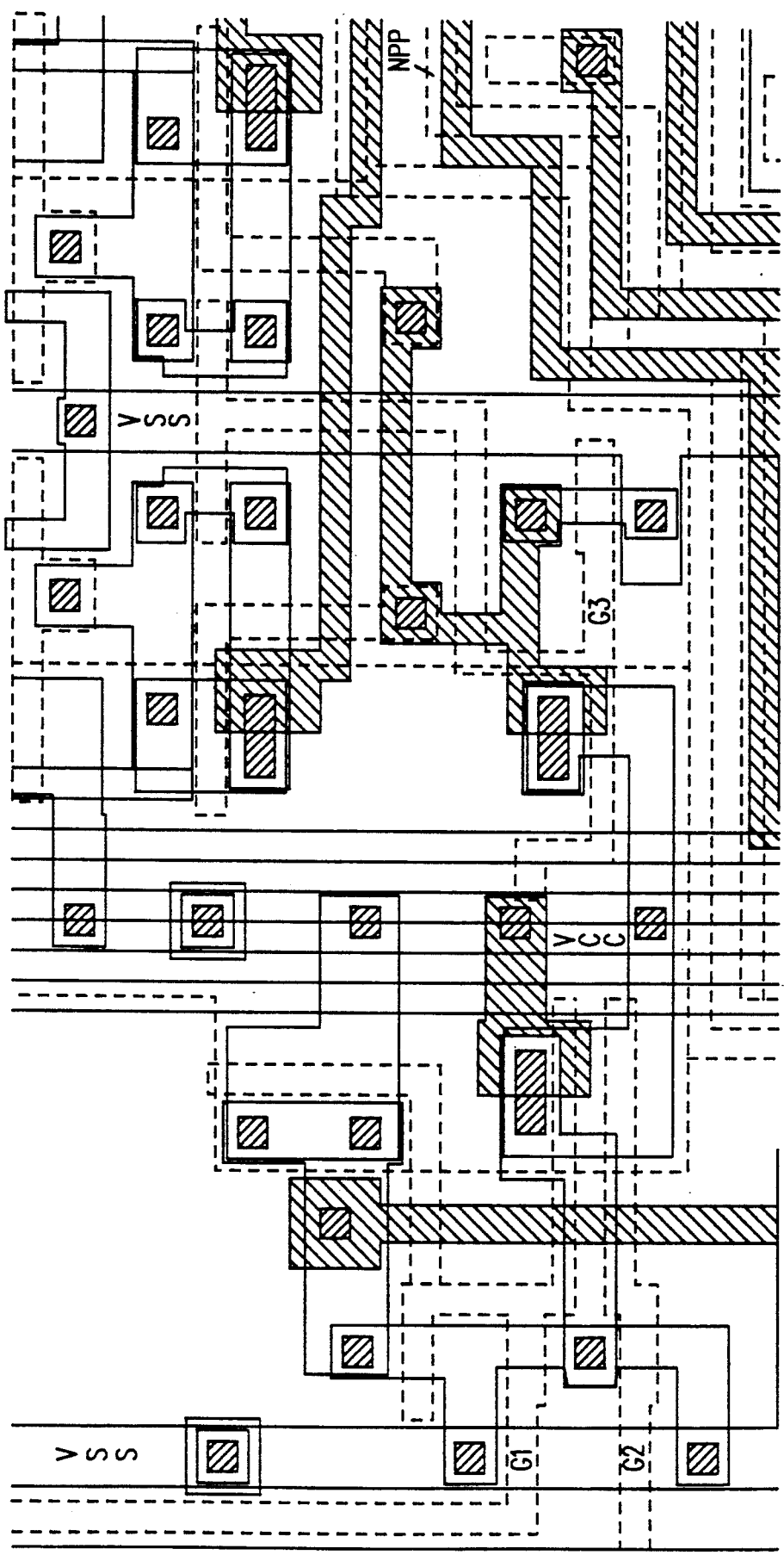

Consider the CMOS circuit 62 shown in FIG. 32A. A 2 input NOR gate 64 drives an inverter 64 and the N CHANNEL transistor of two transfer gates 66, 68. The layout for this circuit is shown in FIG. 32B.

We observe the following capacitances on node G3:
1. Diffusion junction capacitance
2. Four transistor gates.
3. Metal routing capacitance.
4. Poly routing capacitance.

A set of tables for the layout in FIG. 27B is given in Tables IX-XII. The first step is to measure the geometries on the layout. For example, looking at the plot in FIG. 30B, we measure the following size:

| DESCRIPTION | SIZE |
|---|---|
| P+ Diffusion | 14 × 6.5 |

Table XIII shows the capacitance for diffusion. A 14×6.5 diffusion would be approximately 29.5 femptofarads (FF). Similarly, the N+ diffusion, gates, poly and metal routing can be measured and converted to capacitance using the appropriate table. When a geometry has a non-rectangular shape, the geometry can be broken up into sub-blocks of rectangles. For example, the N+ diffusion can be viewed as two 4×3 pieces and one 5×5 piece. With practice, one will be able to approximate the size by imagining it formed into a perfect rectangle. The rest of the geometries are measured and listed in Table XII along with their capacities found from the corresponding capacitance tables. Once the total capacitance on the node is known, the width of the N-channel driver can be divided by the total capacitance to arrive at the FOM for the node.

XII. SUNFLOW FLOWCHART PROGRAM

The flowcharting method described above may be implemented by a digital computer system executing a corresponding flowchart application program, hereinafter referred to as "sunflow."

Sunflow allows the computer system user to graphically create a structured logic design via a flowchart. The program is written in "C" from the SUN 3.5 operating system. It utilizes many of the Sun View, SUN Visual/Integrated Environment routines to create a mouse-controlled window environment for the user to work in while creating a flowchart. Sunflow is specifically tailored to two-phase logic, which, as discussed above, is difficult to document with a state diagram.

In accordance with the Sunflow program, as a flowchart is graphically created on the screen, each symbol and/or element used is also added to a data structure. This produces an object oriented environment where each flowchart element has its own identity within the data structure. The flowchart structure can be selected and then graphically placed to produce the desired machine flow. Input and output names, state assignments and state names are then added to define the flowchart function. The data structure holds all the information about types and number of elements used, locations, names, parameters and node connections for the entire flowchart. This data structure can then be output as a text file to be used by other software.

Flowcharts can be created, modified, labeled, saved, and then reloaded for later use. A raster file containing the flowchart is created so that a hard copy of the flowchart can be printed.

Once the flowchart is created and saved, it can be converted into logic equations and/or simulated. As stated above, this conversion can be either a direct implementation or a coded state assignment implementation and the output can be either a net list in conventional format (e.g., z, oct, or synopsys) or a simulation.

Figure 33:
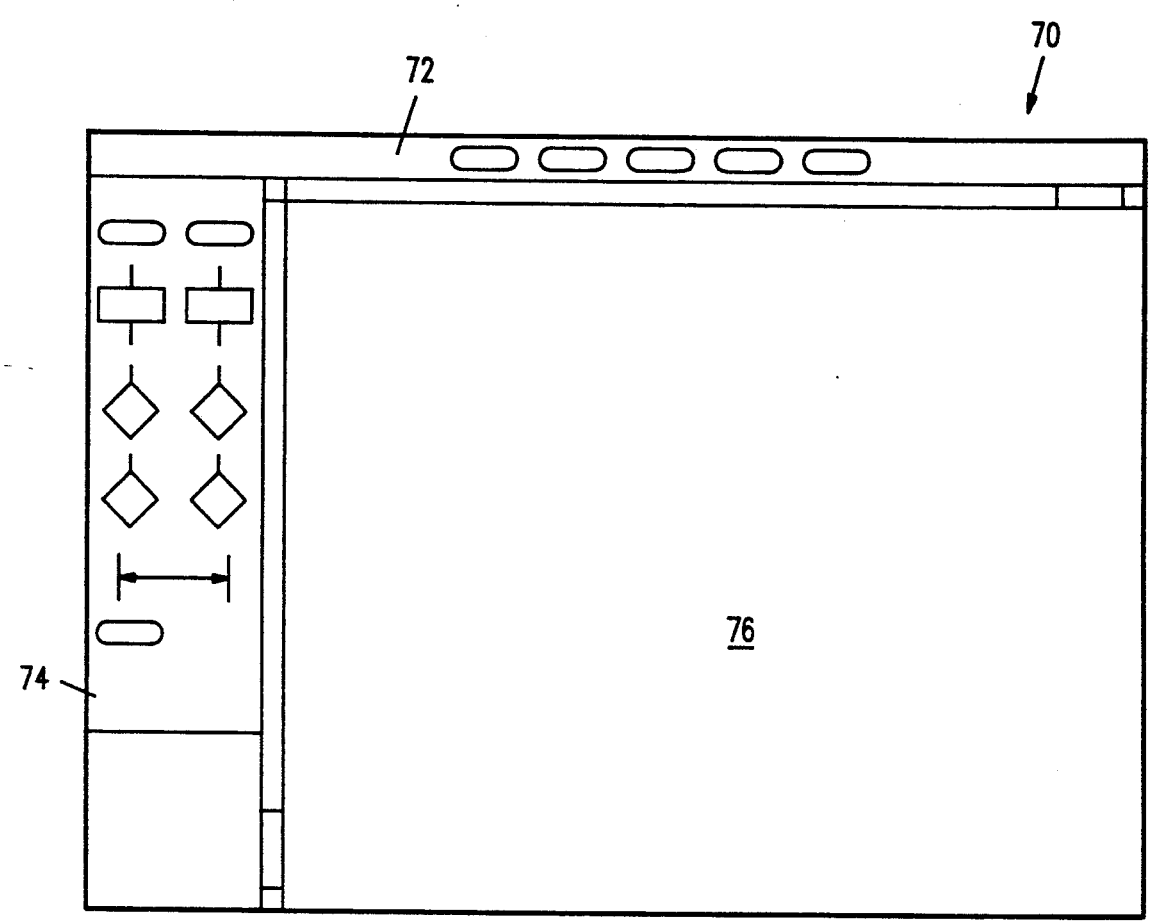
FIG. 33 provides a representation of a window screen display for the Sunflow program in accordance with the present invention.

Upon logging onto the computer system and selecting the Sunflow application, the window 70 shown in FIG. 33 opens and fills the entire screen of an associated display.

The window 70 is subdivided into three primary panels: a Control Panel 72, a Block Panel 74 and Canvas 76.

The Control Panel 72 contains a listing of a directory the user is in, a space for entering file names to be saved or loaded, and control buttons for saving, loading, redrawing, quitting and compiling.

The Block Panel contains all of the flow chart symbols and controls needed for creating a flowchart.

The Canvas is where the user creates a flowchart. The Canvas displays only part of a larger virtual window and scroll bars are used to move around within it.

The black bar at the top of the window 70 states the version and release date of Sunflow. If the cursor is moved into this area and then the right mouse button held down, the standard SUN window menu pops up. This allows the user to move, resize, hide, close, etc. the window.

The left mouse button is used for selecting all buttons and controls in the panels. Thus, when the user wishes to select something, the mouse cursor is moved to the desired region and the left mouse button is pressed.

The cursor is then moved into the Canvas region of the Sunflow window. The cursor is a cross hair. This is the default cursor and shows that no block symbol has been selected. If the user selects one of the flowchart symbols from the Block Panel, then the cursor used in the Canvas will change and contain a small symbol corresponding to the type of block symbol it is ready to place. To place the object on the canvas, the user moves the cursor to the desired location and presses the left mouse button. The cursor will remain as this symbol until a different symbol is chosen.

To erase a symbol, the user selects the ZAP button. The cursor is moved into the Canvas and a new cursor image, a lightening bolt, appears. This cursor is moved into the middle of the symbol to be removed and the left button is pressed. The object will disappear.

To draw lines connecting the symbols, the user selects the WIRE button. This causes the cursor to become a pencil image which can now be used to draw lines. To start a line, the user presses and holds the left mouse button. As the user holds down this button, the mouse is dragged to where the user wants the line to end, and the button is then released. The lines will only draw horizontally or vertically, so each change in direction requires beginning a new line segment.

The cursor definition may also be changed via a system keyboard instead of mouse selections. This saves time because the user does not have to move into the Block Panel every time it is desired to place a different type of symbol.

Figure 34:
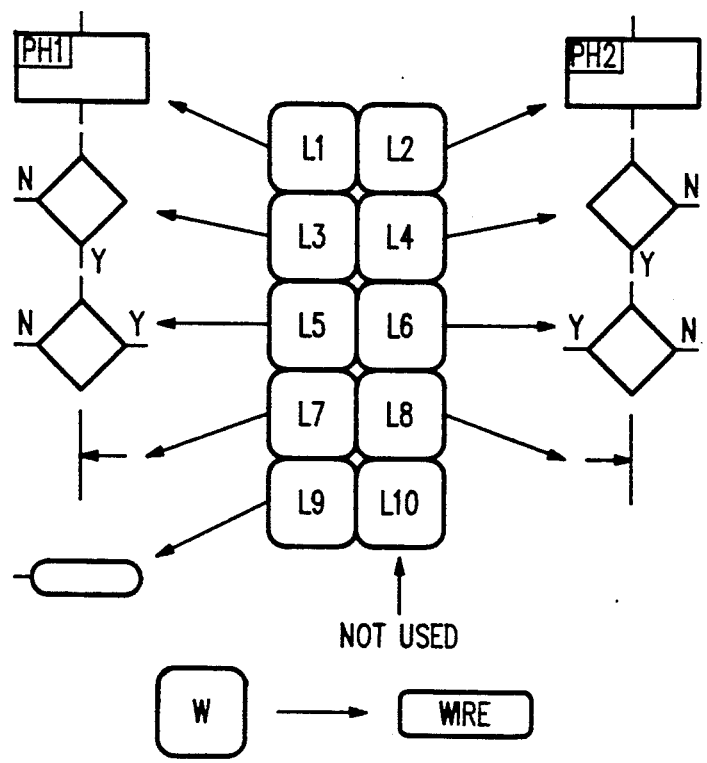
FIG. 34 is a diagram illustrating the key functions of the Sunflow program in accordance with the present invention.

The keys used for the Block Panel symbols are the left function keys. The "W" key is used for WIRE and the "Z" key is used for ZAP. The user must be in the Canvas for these keys to be active. A diagram showing the function of each key is provided in FIG. 34.

As the user interconnects the flowchart by either placing one symbol under another or connecting symbols with lines, the Sunflow program logically connects them together via node names. To observe and verify the node interconnect, the user can toggle the Nodes switch at the top of the Block Panel. These node names should be checked periodically to verify that Sunflow has indeed connected the symbols as desired. If an error is found, the user zaps the line or symbol which is in error and replaces it. On large flowcharts, with more than 50 symbols, leaving the node names on slows down the program. Thus, it is a good idea to leave them off except when checking the interconnection of the flowchart.

Phase 1 and phase 2 state blocks have default names, while their outputs and state assignments are blank. To change or enter any of these parameters, the user moves the cursor to the center of an already placed state symbol and clicks the middle mouse button. A window will pop-up below the Block Panel and allow the user to modify and enter parameters for that symbol. When done, the user selects the DONE button and the changes will appear on the appropriate state.

The external inputs for decision symbols and the outputs for output symbols can also be added in this way via the middle mouse button and the popup window under the Block Panel. After opening one of these popup windows and making the desired changes, the user must close the popup window with the DONE button before proceeding.

The first step to saving a new flowchart is to give it a name. To do so, the user moves the cursor into the Control Panel and clicks the left mouse button near the right of the word "File:" The user then types in a file name and moves the cursor over the name just typed and selects it by pressing the left mouse button. The name will be displayed in reverse video.

The user can now select the SAVE button and the file will be saved. The Sunflow program saves three files for each flowchart: .flow, .text and .rast. The .flow file is the stored data structures needed for the Sunflow program to reload the flowchart again. The .text file is the text file containing the netlist information needed by other software tools and the .rast file is a raster file containing the picture of the flowchart. This .rast file will be the one used to print a hard copy of the flowchart.

When the Sunflow program is entered again at a latter time and the user wants to load an old file, the file name is typed and then selected as before. The LOAD button is then selected and the flowchart will be loaded back on the Canvas.

Also in the Control Panel are REDRAW and QUIT buttons. The REDRAW button will refresh the Canvas. This button is used in the event that a new image is superimposed over an old image. The QUIT button is used when the user wants to quit; the user will be prompted to make a decision about saving the file before the quit.

Figure 35:
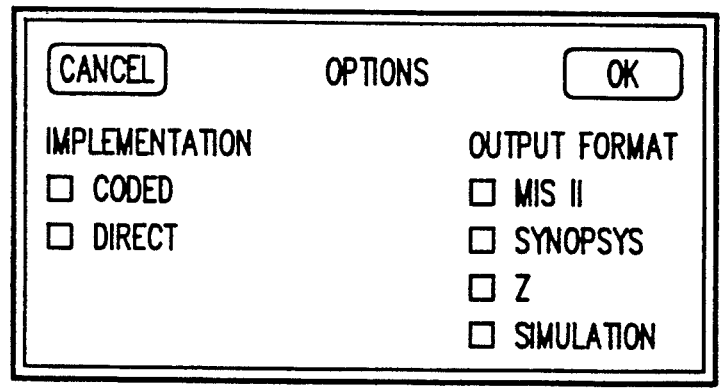
FIG. 35 is a diagram illustrating a Sunflow popup window for selecting compile options in accordance with the present invention.

The last button in the Control Panel of the Sunflow window is COMPILE. It opens a popup window which lets the user select compile options. With this window, the user may specify the type of implementation and the type of output files desired. The COMPILE window is shown in FIG. 35.

Either method of implementation (i.e., coded or direct) can create any of four output formats, explained below:

| | |
|---|---|
| Coded | Produces a coded implementation of the state machine represented by the flowchart. For this type of compile, the user must specify state assignments for all states. The files produced with this option will have a "_c" suffix. |
| Direct | Produces a direct implementation of the state machine represented by the flowchart. The files produced with this option will have a "_d" suffix. For a simulation of this type of machine to work, the user must provide a preset signal in the flowchart. |
| misII | Produces an OCT language formatted netlist to be used with the OCT tool, misII. It creates two files, a .mis which contains the logic equations and a .hdr which contains the header information. |
| Synopsys | Produces a synopsys formatted netlist. It creates two files; a .sys which contains the logic equations and a .hdr which contains the header information. |
| z | Produces a znet formatted netlist. It creates a .z file containing logic equations. |
| simulation | Produces an output file which contains the logic simulation of the flowchart. A logic simulation stimulus file called "inputfil" will be created by the Sunflow program if it does not already exist. This file is required as an input to the simulation program. It is a text file and has the following syntax. There are three fields per line, separated by a space. These three fields are, signal name, clock cycle and logic value. |

EXAMPLE

| | | |
|---|---|---|
| creset 3 1 | ← | creset signal is set to a '1' at clock cycle 3 |
| ads 4 0 | ← | ads signal is reset to '0' at clock cycle 4 |
| creset 17 0 | ← | creset signal is reset to '0' at clock |

-continued

| |
|---|
| cycle 17 |

Clock Phi1 occurs during the odd number clock cycles, while clock Phi2 occurs during the even. Each simulation is 100 clock cycles in duration.

The Sunflow software is divided into three sections: definitions of images, variables and structures, creation of the window environments; and definitions of routines and functions resulting from user interaction with the window).

The first section consists of include statements and type declarations. All the global images, variables and structures used through-out the program are defined here. First, all libraries used and all bit field files defining the flowchart images are included. Next, all variable names and types are declared. Then the data structures used to hold all the information about the flowchart are defined.

The #define statements define identifiers that establish some size limitations. These statements are as follows, ---
define MAX_FILENAME_LEN 20 - Maximum length of the user defined file name.
define MAX_STRING_LEN 9 - Maximum length used for all node, state and output name character strings.
define MAX 500 - Maximum number of data structure elements.
define MAX_LINES 3000 - Maximum number of line and node data structure elements.

---

There are seven types of data structures used in the Sunflow program and they are shown below.

```
struct state 1 {
    int x;
    int y;
    char name[MAX_STRING_LEN];
    char inpt[MAX_STRING_LEN];
    char flot[MAX_STRING_LEN];
    int num;
    char out[9][MAX_STRING_LEN];
    char stass[MAX_STRING_LEN];
} st1[MAX];
struct state 2 {
    int x;
    int y;
    char name[MAX_STRING_LEN];
    char inpt[MAX_STRING_LEN];
    char flot[MAX_STRING_LEN];
    int num;
    char out[9][MAX_STRING_LEN];
    char stass[MAX_STRING_LEN];
} st2[MAX];
struct decision {
    int x;
    int y;
    int type;
    char flowin[MAX_STRING_LEN];
    char extin[MAX_STRING_LEN];
    char yes[MAX_STRING_LEN];
    char no[MAX_STRING_LEN];
} dec[MAX];
struct mealyout {
    int x;
    int y;
    char flow[MAX_STRING_LEN];
    int num;
    char out[2][MAX_STRING_LEN];
} mout[MAX];
struct merge {
    int x;
    int y;
```

```
        int type;
        char in1[MAX_STRING_LEN];
        char in2[MAX_STRING_LEN];
        char out[MAX_STRING_LEN];
} mrg[MAX];
struct lines {
    int x1;
    int y1;
    int x2;
    int y2;
    char name[MAX_STRING_LEN];
} line[MAX_LINES];
struct nodes {
    int x;
    int y;
} node[MAX_LINES];
```

The next section, the "main()" procedure of the Sunflow program, establishes and defines the window environment. It creates a window environment with a Canvas for drawing and two panels for controlling flowchart creation; Block Panel and Control Panel. Also, the many cursors and subwindows used during different portions of operation are defined here. Below is a list of all the procedures pertaining to this section.

| | |
|---|---|
| main (argc, argv) - | Set up the window environment. The arguments "argc" and "argv" are used to pass user declared command line arguments to the Sunflow main frame. In setting up the environment, main ( ) calls the following nine procedures. |
| init_list ( ) - | Initialize the data structures by setting all of the x variables to NULL. |
| create_control_panel ( ) - | Create and define the Control Panel. |
| create_block_panel ( ) - | Create and define the Block Panel. |
| create_canvas ( ) - | Create and define the Canvas. |
| define_cursors ( ) - | Define the seven different cursors to be used in the canvas. |
| create_state_popup ( ) - | Create and define the popup window used for state symbol data entry. |
| create_decision_popup ( ) - | Create and define the popup window used for decision symbol data entry. |
| create_output_popup ( ) - | Create and define the popup window used for output symbol data entry. |
| create_compile_popup ( ) - | Create and define the popup window used for compile option selection. |

The last section of the Sunflow software consists of all the functions and routines called by the window environment in the process of flowchart creation. This is the largest portion of the program and it contains three sections; functions and procedures initiated by the Block Panel, functions and procedures initiated by the Control Panel, and routines initiated by Canvas events. Each of these three sections is explained in more detail on the following pages.

Figure 36:
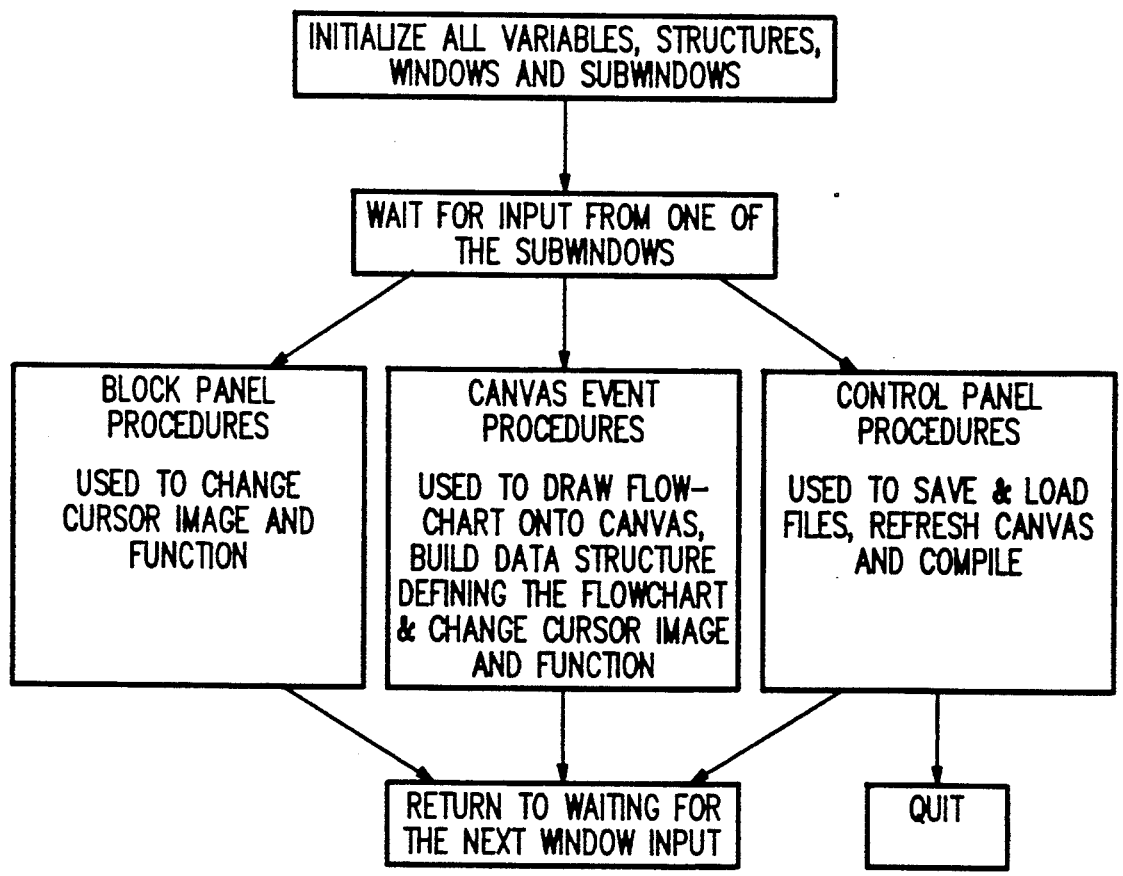
FIG. 36 provides a flow diagram of the Sunflow program.

The basic flow of the Sunflow program is shown in FIG. 36.

The Block Panel is used to select the function performed by the cursor and also to toggle the displaying of node names on and off. For each button in the panel, there is a short procedure that redefines the cursor image and sets the global integer variable "block_type" to a value that defines the function the cursor will have in the Canvas.

| cursor function | value assigned to "block_type" |
|---|---|
| state1 | 1 |
| state2 | 2 |
| output | 3 |
| decision dl | 4 |
| decision dr | 5 |
| decision rl | 6 |
| decision lr | 7 |
| merge r | 9 |
| merge l | 10 |
| zap | 20 |
| line | 21 |

The procedures executed by the Block Panel are as follows.

format_notify_proc(format_item,value,event)—This procedure monitors the toggle switch used for displaying node names. It is a panel notify procedure. Sun View requires all panel notify procedures to have three arguments. Although only the "value" argument is used in this case, the other two arguments must be passed as well.

zap_proc()—Set Canvas cursor to a lightning bolt and "block_type" to 20.

line_proc()—Set Canvas cursor to a pencil and "block_type" to 21.

st1_oroc()—Set Canvas cursor to a small state block symbol and "block_type" to 1.

st2 proc()—Set Canvas cursor to a small state block symbol and "block_type" to 2.

out_proc()—Set Canvas cursor to a small output symbol and "block_type" to 3.

dec1_proc()—Set Canvas cursor to a small decision symbol and "block_type" to 4.

dec2_proc()—Set Canvas cursor to a small decision symbol and "block_type" to 5.

dec3_proc()—Set Canvas cursor to a small decision symbol and "block_type" to 6.

dec4_proc()—Set Canvas cursor to a small decision symbol and "block_type" to 7.

merge_r_proc()—Set Canvas cursor to a small right merge symbol and "block_type" to 9.

merge_l_proc()—Set Canvas cursor to a small left merge symbol and "block_type" to 10.

The cursor definition can also be changed via Canvas events. This change is accomplished through the keyboard and uses the procedures identified above to redefine cursor function. See Canvas Event Procedures in the following section for further details.

The canvas is defined to accept a limited number of event types and to execute "my_event_proc" when any of these events occur. The procedure "my_event_proc" tests the type of event and value of "block_type" and then performs the appropriate function. These functions include, limiting placement positions to a 20×20 pixel grid handling keyboard events for defining cursor function handling left mouse button events for adding and deleting flow-chart elements to the data structures increasing canvas size if needed handling middle mouse button events for opening popup windows for variable name entry.

After each event is processed, the routine "draw" is called. This routine reads the data structures and draws the defined flowchart to the Canvas window.

The following is a list of all the procedures pertaining to this section of the program. my_event_proc(junkcanvas, event)—This is the window event procedure for the canvas. It determines how the events accepted by the Canvas are handled. The argument "junkcanvas" is not used, but it is a required argument for window event procedures. The argument "event" specifies the type of event received. In handling these events the following procedures are periodically called.

search_structures(x,y,dx,dy)—Search the state1 and state2 data structures for an entry residing at the location x, y, plus or minus dx, dy.

search_decisions(x,y,dx,dy)—Search the decision data structure for an entry residing at the location x, y, plus or minus dx, dy.

search_mouts(x,y,dx,dy)—Search the mealyout data structure for an entry residing at the location x, y, plus or minus dx, dy.

search_merges(x,y,dx,dy)—Search the merge data structure for an entry residing at the location x, y, plus or minus dx, dy.

search_line_bodies(x,y)—Search the lines data structure for a line with a body that includes the point x, y.

search_lines(x,y)—Search the lines data structure for a line with an end point at location x, y.

add_block(x,y)—Add a block structure of type "block type" at the location x, y.

add_line(x1,y1,x2,y2)—Add a line to the lines structure with end points x1, y1 & x2, y2.

add_node(x,y)—Add a node dot to the nodes structure with the location x, y.

open_state_popup()—Open the state popup window used for entry of state1 and state2 symbol parameters.

open_decision_popup()—Open the decision popup window used for naming external inputs of decision blocks.

open_output_popup()—Open the output popup window for entering names in output symbols.

close_state_popup_proc()—Close and retrieve input from the state popup window.

close_decision_popup_proc()—Close and retrieve input from the decision popup window.

close_output_popup_proc()—Close and retrieve input from the output popup window.

rename_entire_node(old name,new name,x,y)—Rename an entire node from "old_name" to "new_name". The arguments x and y are the position of the beginning of the node. This position is updated and moved along the node from one line segment to the next as the node is renamed.

delete_structure(type,num)—Delete an entry from one of the data structures. The arguments "type" and "number" specify the structure and element to be deleted.

delete_node(x1,y1,x2,y2)—Search the nodes data structure for a node that is located between the points x1, y1 & x2, y2. If found, delete the node.

In the Control Panel, there are five buttons and a field for entering file names. The procedures supporting this panel are as follows.

save_proc()—Save the data structures into a file called filename .flow. This file is used for loading the flowchart again at a later time. This procedure in turn calls the following two procedures which create filename.text and filename.rast. The filename.text file is used by the implementation software which compiles the machine. The filename.rast file is used to print a hard copy of the flowchart.

dump_text_file(prefix)—Create the fllename.text file. The argument "prefix" passes the file name.

dump_raster_fiie(prefix)—Create the filename.rast file. The argument "prefix" passes the file name.

load_proc()—Load a previously saved flowchart back into the Sunflow environment.

redraw_proc()—Clear the Canvas and then redraw the flowchart, effectively refreshing the screen.

quit_proc()—Quit Sunflow. This procedure uses the following three procedures to open a confirmation window. This window asks the user whether they want to save before quitting. The user must then select one of three choices; yes, no or cancel.

confirm_quit()—Open confirmer window by calling init_confirmer, wait for an answer and then close the confirmer window.

init_confirmer()—Create and define the confirmer window.

yes_no_cancel(item,event)—This is the panel notify procedure called when an answer is given by the user. It returns the integer value of the choice selected.

compile_proc()—This procedure is invoked after selections have been made in the compile popup window. Depending on what selections were made, it will invoke the system software required to implement the state machine and produce the required output files. The following seven procedures are used in this process.

open_compile_popup_proc()—This procedure is invoked by the compile button in the Control Panel. It opens the compile popup window.

cancel_proc()—Cancel compile and close popup window.

compile_impl_proc(implam_item,value,event)—Receives compile implementation selections from the compile popup window. The arguments "implam_item" and "event" are not used but are required arguments for panel notify procedures.

compile_output_proc(output item,value,event)—Receivescompile output selections from the compile popup window. The arguments "output_item" and "event" are not used but are required arguments for panel notify procedures.

create_junk2(prefix)—Copy the prefix.text file into a file called junk2. This new file will be used by the implementation software.

create_synop_file(prefix)—Create a synopsys formatted netlist from the mis2net file. The file created will be called prefix.syn.

split_mis2net(prefix,out_suffix)—Read the mis2net file created by the implementation software and split it up into two files; prefix.hdr which contains the header information, and prefix.out_suffix which contains the logic equations.

get_selection()—This procedure is used by save_proc, load_proc and compile_proc to receive a file name from the "file:" field in the Control Panel.

stat_file(filename)—Check if the file "filename" exists. Return 1 if it exists, display an error message and return if it does not.

msg(msg)—Display a message in the control panel.

Listed below are the possible messages that may occur in the Block Panel and why they were displayed.

"filename not found"—Displayed by stat_file (filename) if the file name specified can not be found.

"Please select a file name."—Displayed when save_proc, load_-proc, or compile_proc call get_selection and it can not receive the file name from the "File:" field of the Control Panel.

"Can not open file"—Displayed when save_proc, load_proc, dump_text_file, or dump_raster_file can not open the required file.

"File is saved"—Displayed by save_proc if it completes successfully.

"File is loaded"—Displayed by load_proc if it completes successfully.

"You have not saved that file yet."—Displayed by compile_proc when the user selects the compile button before saving the specified file.

"Can not create junk2."—Displayed by compile_proc if the file "junk2", needed by the implementation software, can not be opened for writing.

"Can not read or create inputfil."—Displayed by compile_proc if the file "inputfil", needed by the simulation software, can not be opened for read/write.

"Please wait!"—Displayed when compiling is in progress.

"Compilation error!"—Displayed by compile_proc if the simulation software could not compile because of an error in the flowchart.

"There is nothing to save!"—Displayed by save_proc when the user tries to save a blank canvas.

"Please select an Implementation type."—Displayed by compile_proc if an implementation type was not selected.

"Please select an Output Format type."—Displayed by compile_proc if no output file type was selected.

"Can not read simoutput file."—Displayed by compile_proc if the file "simoutput", produced by the simulation software, could not be opened for read.

"Can not create *.sim file."—Displayed by compile_proc if the simulation output file could not be created.

"Can not read znet file."—Displayed by compile_proc if the file "znet", produced by the z implementation software, could not be opened for read.

"Can not create *.z file."—Displayed by compile_proc if the z formatted netlist file could not be created.

"Can not read .temp file."—Displayed by create_synop_file if it can not find the .temp file create by split mis2net.

"Can not create .syn file."—Displayed by create_synop_file if it can not create the synopsys formatted netlist.

"Can not read mis2net file."—Displayed by split mis2net if it can not find the "mis2net" file created by the implementation software.

"Can not create .hdr file."—Displayed by split_mis2net if it can not create the header file.

"Can not create equations file."—Displayed by split_mis2net if it can not create the equations file.

The following are some miscellaneous procedures that are used by other procedures in the program.

find_free(type)—Find the lowest empty slot in a structure. The argument "type" is an integer value that specifies which of the several data structures to search. The procedure returns an integer specifying the free slot value.

clear_pw()—Clear the Canvas.

clear_structures()—Clear the data structures by initializing the list, clearing the node count variables, and clearing the canvas. This deletes the present flowchart.

draw()—Draw the flowchart that is defined by the data structures. This is done using Sun View pixwin commands for drawing to a canvas.

pack(type)—Pack a data structure so that it fills the lowest of its slots. The argument "type" specifies which of the structures to pack.

pack_outputs(type,number)—Pack a list of output names for either a state block or an output block. The arguments "type" and "number" specify which structure and which slot within that structure to use.

shift_flowchart(x,y)—Shift every element in the data structures by x,y. This is used when the canvas must grow up or to the left.

print_proc()—Cut canvas up into smaller raster files that can be printed, one at a time, to an 8.5"×11" page.

It should be understood that various alternatives to the embodiments of the invention described herein may be employed in practicing the invention. It is intended that the following claims define the scope of the invention and that methods within the scope of these claims and their equivalents be covered thereby.

TABLE 1

PHI 1 TO PHI 2 TRANSITION TABLE

| INPUTS | | | PRESENT STATE | | | STATE | | | NEXT OUTPUTS | | |
|---|---|---|---|---|---|---|---|---|---|---|---|
| R1 | R2 | TY | A | B | C | a | b | c | RD | WR | DR |
| d | d | d | 0 | 0 | 0 | 0 | 0 | 0 | 0 | 0 | 0 |
| d | d | d | 0 | 1 | 1 | 0 | 1 | 1 | 0 | 0 | 1 |
| d | d | d | 1 | 1 | 1 | 1 | 1 | 1 | 0 | 1 | 1 |
| d | d | d | 1 | 0 | 1 | 1 | 0 | 1 | 0 | 0 | 1 |
| d | d | d | 0 | 1 | 0 | 0 | 1 | 0 | 0 | 0 | 0 |
| d | d | d | 1 | 1 | 0 | 1 | 1 | 0 | 1 | 0 | 0 |
| d | d | d | 1 | 0 | 0 | 1 | 0 | 0 | 0 | 0 | 0 |

PHI 2 TO PHI 1 TRANSITION TABLE

| INPUTS | | | PRESENT STATE | | | STATE | | | NEXT OUTPUTS | | |
|---|---|---|---|---|---|---|---|---|---|---|---|
| R1 | R2 | TY | a | b | c | A | B | C | RD | WR | DR |
| 0 | 0 | 0 | 0 | 0 | 0 | 0 | 0 | 0 | | | |
| 0 | 0 | 1 | 0 | 0 | 0 | 0 | 0 | 0 | | | |
| 0 | 1 | 0 | 0 | 0 | 0 | 0 | 1 | 0 | | | |
| 0 | 1 | 1 | 0 | 0 | 0 | 0 | 1 | 0 | | | |
| 1 | 0 | 0 | 0 | 0 | 0 | 0 | 1 | 0 | | | |
| 1 | 0 | 1 | 0 | 0 | 0 | 0 | 1 | 1 | | | |
| 1 | 1 | 0 | 0 | 0 | 0 | 0 | 1 | 0 | | | |
| 1 | 1 | 1 | 0 | 0 | 0 | 0 | 1 | 1 | | | |
| d | d | d | 0 | 1 | 1 | 1 | 1 | 1 | | | |
| d | d | d | 1 | 1 | 1 | 1 | 0 | 1 | | | |
| d | d | d | 1 | 0 | 1 | 0 | 0 | 0 | | | |
| d | d | d | 0 | 1 | 0 | 1 | 1 | 0 | | | |
| d | d | d | 1 | 1 | 0 | 1 | 0 | 0 | | | |
| d | d | d | 1 | 0 | 0 | 0 | 0 | 0 | | | |

TABLE II

| N CHAN WIDTH | P CHAN WIDTH | DIFF CAP | MTL/POL CAP | LOGIC TYPE | DEVICE SIZE | FOM | TIME DELAY |
|---|---|---|---|---|---|---|---|
| 1.481481 | 4 | 27.25185 | 10.87 | INV | A | .0388617 | 3.859838 |
| 2.592593 | 7 | 37.94074 | 10.87 | | B | .0531152 | 2.82405 |
| 4 | 11 | 52 | 10.87 | | C | .0636233 | 2.357625 |
| 6 | 16 | 70.2 | 10.87 | | D | .0740101 | 2.02675 |
| 8 | 22 | 91 | 10.87 | | E | .0785315 | 1.910063 |
| 10 | 28 | 111.8 | 10.87 | | F | .0815195 | 1.84005 |

TABLE II-continued

| N CHAN WIDTH | P CHAN WIDTH | DIFF CAP | MTL/POL CAP | LOGIC TYPE | DEVICE SIZE | FOM | TIME DELAY |
|---|---|---|---|---|---|---|---|
| 4 | 4 | 33.8 | 10.87 | 2 NAND | A | .0331650 | 4.522838 |
| 5 | 7 | 44.2 | 10.87 | | B | .0470781 | 3.186193 |
| 8 | 11 | 62.4 | 10.87 | | C | .0556036 | 2.697668 |
| 12 | 16 | 85.8 | 10.87 | | D | .0613006 | 2.446959 |
| 16 | 22 | 111.8 | 10.87 | | E | .0664233 | 2.258243 |
| 20 | 28 | 137.8 | 10.87 | | F | .0697543 | 2.150405 |
| 5 | 4 | 53.3 | 10.87 | 3 NAND | A | .0230868 | 6.497213 |
| 8 | 7 | 76.7 | 10.87 | | B | .0296059 | 5.066550 |
| 12 | 11 | 107.9 | 10.87 | | C | .0343022 | 4.372895 |
| 18 | 16 | 149.5 | 10.87 | | D | .0369516 | 4.059366 |
| 24 | 22 | 196.3 | 10.87 | | E | .0393307 | 3.813811 |
| 30 | 28 | 243.1 | 10.87 | | F | .0408331 | 3.673495 |
| 6 | 4 | 55.9 | 10.87 | 4 NAND | A | .0221878 | 6.760463 |
| 10 | 7 | 81.9 | 10.87 | | B | .0279465 | 5.367407 |
| 16 | 11 | 118.3 | 10.87 | | C | .0315404 | 4.755805 |
| 24 | 16 | 165.1 | 10.87 | | D | .0336758 | 4.454241 |
| 32 | 22 | 217.1 | 10.87 | | E | .0357422 | 4.196720 |
| 40 | 28 | 269.1 | 10.87 | | F | .0370410 | 4.049566 |
| 1.481481 | 8 | 37.88889 | 10.87 | 2 NOR | A | .0303838 | 4.936838 |
| 2.592593 | 14 | 56.55556 | 10.87 | | B | .0384512 | 3.901050 |
| 4 | 22 | 81.25 | 10.87 | | C | .0434216 | 3.4545 |
| 6 | 32 | 112.75 | 10.87 | | D | .0485358 | 3.0905 |
| 8 | 44 | 149.5 | 10.87 | | E | .0498846 | 3.006938 |
| 10 | 56 | 186.25 | 10.87 | | F | .0507305 | 2.9568 |
| 1.481481 | 12 | 58.77778 | 10.87 | 3 NOR | A | .0212711 | 7.051838 |
| 2.592593 | 21 | 88.23611 | 10.87 | | B | .0261598 | 5.733996 |
| 4 | 33 | 127.125 | 10.87 | | C | .0289866 | 5.174813 |
| 6 | 48 | 177 | 10.87 | | D | .0319370 | 4.69675 |
| 8 | 66 | 234.75 | 10.87 | | E | .0325706 | 4.605375 |
| 10 | 84 | 292.5 | 10.87 | | F | .0329630 | 4.55055 |
| 1.481481 | 16 | 69.27778 | 10.87 | 4 NOR | A | .0184844 | 8.114963 |
| 2.592593 | 28 | 106.6111 | 10.87 | | B | .0220682 | 6.797121 |
| 4 | 44 | 156 | 10.87 | | C | .0239708 | 6.257625 |
| 6 | 64 | 219 | 10.87 | | D | .0261017 | 5.746750 |
| 8 | 88 | 292.5 | 10.87 | | E | .0263704 | 5.688188 |
| 10 | 112 | 366 | 10.87 | | F | .0265343 | 5.65305 |

TABLE III

| LOGIC TYPE | DEVICE SIZE | 1.481481 A | 2.222222 B | 4 C | 6 D | 8 E | 10 F |
|---|---|---|---|---|---|---|---|
| INV | A | 1.72125 | 1.147500 | .6375000 | .4250000 | .3187500 | .2550000 |
| | B | 1.873125 | 1.248750 | .6937500 | .4625000 | .3468750 | .2775000 |
| | C | 2.126250 | 1.4175 | .7875 | .525 | .39375 | .315 |
| | D | 3.341250 | 2.2275 | 1.2375 | .825 | .61875 | .495 |
| | E | 4.556250 | 3.0375 | 1.6875 | 1.125 | .84375 | .675 |
| | F | 5.619375 | 3.74625 | 2.08125 | 1.3875 | 1.040625 | .8325 |
| 2 NAND | A | 1.366875 | .9112500 | .50625 | .3375 | .253125 | .2025 |
| | B | 1.822500 | 1.215 | .675 | .45 | .3375 | .27 |
| | C | 2.733750 | 1.8225 | 1.0125 | .675 | .50625 | .405 |
| | D | 4.252500 | 2.835 | 1.575 | 1.05 | .7875 | .63 |
| | E | 5.771250 | 3.8475 | 2.1375 | 1.425 | 1.06875 | .855 |
| | F | 7.138125 | 4.75875 | 2.64375 | 1.7625 | 1.321875 | 1.0575 |
| 3 NAND | A | 1.366875 | .9112500 | .50625 | .3375 | .253125 | .2025 |
| | B | 1.974375 | 1.31625 | .73125 | .4875 | .365625 | .2925 |
| | C | 3.341250 | 2.2275 | 1.2375 | .825 | .61875 | .495 |
| | D | 5.163750 | 3.4425 | 1.9125 | 1.275 | .95625 | .765 |
| | E | 6.986250 | 4.6575 | 2.5875 | 1.725 | 1.29375 | 1.035 |
| | F | 8.656875 | 5.77125 | 3.20625 | 2.1375 | 1.603125 | 1.2825 |
| 4 NAND | A | 1.215 | .8100000 | .45 | .3 | .225 | .18 |
| | B | 2.278125 | 1.51875 | .84375 | .5625 | .421875 | .3375 |
| | C | 3.948750 | 2.6325 | 1.4625 | .975 | .73125 | .585 |
| | D | 6.075000 | 4.05 | 2.25 | 1.5 | 1.125 | .9 |
| | E | 8.201250 | 5.4675 | 3.0375 | 2.025 | 1.51875 | 1.215 |
| | F | 10.17563 | 6.78375 | 3.76875 | 2.5125 | 1.884375 | 1.5075 |
| 2 NOR | A | 2.32875 | 1.552500 | .8625000 | .5750000 | .4312500 | .3450000 |
| | B | 2.93625 | 1.957500 | 1.087500 | .7250000 | .5437500 | .4350000 |
| | C | 3.645000 | 2.43 | 1.35 | .9 | .675 | .54 |
| | D | 5.771250 | 3.8475 | 2.1375 | 1.425 | 1.06875 | .855 |
| | E | 7.897500 | 5.265 | 2.925 | 1.95 | 1.4625 | 1.17 |
| | F | 9.720000 | 6.48 | 3.6 | 2.4 | 1.8 | 1.44 |
| 3 NOR | A | 2.93625 | 1.957500 | 1.087500 | .7250000 | .5437500 | .4350000 |
| | B | 3.999375 | 2.666250 | 1.481250 | .9875000 | .7406250 | .5925000 |
| | C | 5.163750 | 3.4425 | 1.9125 | 1.275 | .95625 | .765 |
| | D | 8.201250 | 5.4675 | 3.0375 | 2.025 | 1.51875 | 1.215 |
| | E | 11.23875 | 7.4925 | 4.1625 | 2.775 | 2.08125 | 1.665 |
| | F | 13.82063 | 9.21375 | 5.11875 | 3.4125 | 2.559375 | 2.0475 |
| 4 NOR | A | 3.543750 | 2.362500 | 1.312500 | .8750000 | .6562500 | .5250000 |

TABLE III-continued

| LOGIC TYPE | DEVICE SIZE | 1.481481 A | 2.222222 B | 4 C | 6 D | 8 E | 10 F |
|---|---|---|---|---|---|---|---|
| | B | 5.062500 | 3.375000 | 1.875000 | 1.250000 | .9375000 | .7500000 |
| | C | 6.682500 | 4.455 | 2.475 | 1.65 | 1.2375 | .99 |
| | D | 10.63125 | 7.0875 | 3.9375 | 2.625 | 1.96875 | 1.575 |
| | E | 14.58000 | 9.72 | 5.4 | 3.6 | 2.7 | 2.16 |
| | F | 17.92125 | 11.94750 | 6.6375 | 4.425 | 3.31875 | 2.655 |

TABLE IV

PER CAP .4  PC = .18
AREA CAP .15

| N+ DIF CAP | P+ DIF CAP | DIFF CAP | MTL/POL CAP | LOGIC TYPE | DEVICE SIZE | 1/FOM | TIME DELAY |
|---|---|---|---|---|---|---|---|
| 9.36 | 14.4 | 23.76 | 13 | | A | 24.83784 | 4.470811 |
| 11.6 | 20.4 | 32 | 13 | | B | 17.30769 | 3.115385 |
| 14.4 | 28.4 | 42.8 | 13 | INV | C | 13.95 | 2.511 |
| 18.4 | 38.4 | 56.8 | 13 | | D | 11.63333 | 2.094000 |
| 22.4 | 50.4 | 72.8 | 13 | | E | 10.725 | 1.9305 |
| 26.4 | 62.4 | 88.8 | 13 | | F | 10.18 | 1.8324 |
| 16.052 | 15.8 | 31.852 | 13 | | A | 30.27510 | 5.449518 |
| 21.05 | 22.25 | 43.3 | 13 | | B | 21.71571 | 3.908829 |
| 28.4 | 30.85 | 59.25 | 13 | 2 NAND | C | 17.73409 | 3.192136 |
| 38.2 | 41.6 | 79.8 | 13 | | D | 15.66 | 2.8188 |
| 48 | 54.5 | 102.5 | 13 | | E | 14.175 | 2.5515 |
| 57.8 | 67.4 | 125.2 | 13 | | F | 13.32643 | 2.398757 |
| 25.7 | 31.6 | 57.3 | 13 | | A | 47.45250 | 8.541450 |
| 34.4 | 44.5 | 78.9 | 13 | | B | 35.44714 | 6.380486 |
| 46 | 61.7 | 107.7 | 13 | 3 NAND | C | 29.62636 | 5.332745 |
| 63.4 | 83.2 | 146.6 | 13 | | D | 26.93250 | 4.84785 |
| 80.8 | 109 | 189.8 | 13 | | E | 24.88909 | 4.480036 |
| 98.2 | 134.8 | 233 | 13 | | F | 23.72143 | 4.269857 |
| 33.7 | 31.6 | 65.3 | 13 | | A | 52.85250 | 9.513450 |
| 47.1 | 44.5 | 91.6 | 13 | | B | 40.34571 | 7.262229 |
| 67.2 | 61.7 | 128.9 | 13 | 4 NAND | C | 34.83000 | 6.269400 |
| 94 | 83.2 | 177.2 | 13 | | D | 32.09625 | 5.777325 |
| 120.8 | 109 | 229.8 | 13 | | E | 29.79818 | 5.363673 |
| 147.6 | 134.8 | 282.4 | 13 | | F | 28.48500 | 5.1273 |
| 10.382 | 28.4 | 38.782 | 13 | | A | 34.98784 | 6.297811 |
| 12.79 | 43.1 | 55.89 | 13 | | B | 26.49615 | 4.769308 |
| 15.8 | 62.7 | 78.5 | 13 | 2 NOR | C | 22.875 | 4.1175 |
| 20.1 | 87.2 | 107.3 | 13 | | D | 20.05 | 3.609 |
| 24.4 | 116.6 | 141 | 13 | | E | 19.25 | 3.465 |
| 28.7 | 146 | 174.7 | 13 | | F | 18.77 | 3.3786 |
| 20.764 | 46 | 66.764 | 13 | | A | 53.89459 | 9.701027 |
| 25.58 | 72.1 | 97.68 | 13 | | B | 42.56923 | 7.662462 |
| 31.6 | 106.9 | 138.5 | 13 | 3 NOR | C | 37.875 | 6.8175 |
| 40.2 | 150.4 | 190.6 | 13 | | D | 33.93333 | 6.108000 |
| 48.8 | 202.6 | 251.4 | 13 | | E | 33.05 | 5.949 |
| 57.4 | 254.8 | 312.2 | 13 | | F | 32.52 | 5.8536 |
| 20.764 | 67.2 | 87.964 | 13 | | A | 68.21892 | 12.27941 |
| 25.58 | 107.4 | 132.98 | 13 | | B | 56.14615 | 10.10631 |
| 31.6 | 161 | 192.6 | 13 | 4 NOR | C | 51.4 | 9.252 |
| 40.2 | 228 | 268.2 | 13 | | D | 46.86667 | 8.436000 |
| 48.8 | 308.4 | 357.2 | 13 | | E | 46.275 | 8.3295 |
| 57.4 | 388.8 | 446.2 | 13 | | F | 45.92 | 8.2656 |

TABLE V

DRIVER SIZES

| LOGIC TYPE | LOAD SIZE | * | A 1.481481 | B 2.592593 | C 4 | D 6 | E 8 | F 10 |
|---|---|---|---|---|---|---|---|---|
| | A | * | 1.6524 | .9442286 | .6120000 | .4080000 | .3060000 | .2448000 |
| | B | * | 1.7982 | 1.027543 | .6660000 | .4440000 | .3330000 | .2664000 |
| INV | C | * | 2.187000 | 1.249714 | .81 | .54 | .405 | .324 |
| | D | * | 3.207600 | 1.832914 | 1.188 | .792 | .594 | .4752 |
| | E | * | 4.374000 | 2.499429 | 1.62 | 1.08 | .81 | .648 |
| | F | * | 5.540400 | 3.165943 | 2.052 | 1.368 | 1.026 | .8208 |
| | A | * | 1.1664 | .6665143 | .432 | .288 | .216 | .1728 |
| | B | * | 1.7496 | .9997714 | .648 | .432 | .324 | .2592 |
| 2 NAND | C | * | 2.770200 | 1.582971 | 1.026 | .684 | .513 | .4104 |
| | D | * | 4.082400 | 2.3328 | 1.512 | 1.008 | .756 | .6048 |
| | E | * | 5.540400 | 3.165943 | 2.052 | 1.368 | 1.026 | .8208 |
| | F | * | 6.998400 | 3.999086 | 2.592 | 1.728 | 1.296 | 1.0368 |
| | A | * | 1.3122 | .7498286 | .486 | .324 | .243 | .1944 |
| | B | * | 2.187000 | 1.249714 | .81 | .54 | .405 | .324 |
| 3 NAND | C | * | 3.353400 | 1.916229 | 1.242 | .828 | .621 | .4968 |
| | D | * | 4.957200 | 2.832686 | 1.836 | 1.224 | .918 | .7344 |

TABLE V-continued

| | | | DRIVER SIZES | | | | | |
|---|---|---|---|---|---|---|---|---|
| LOGIC TYPE | LOAD SIZE | * | A 1.481481 | B 2.592593 | C 4 | D 6 | E 8 | F 10 |
| | E | * | 6.706800 | 3.832457 | 2.484 | 1.656 | 1.242 | .9936 |
| | F | * | 8.456400 | 4.832229 | 3.132 | 2.088 | 1.566 | 1.2528 |
| | A | * | 1.458 | .8331429 | .54 | .36 | .27 | .216 |
| | B | * | 2.478600 | 1.416343 | .918 | .612 | .459 | .3672 |
| 4 NAND | C | * | 3.936600 | 2.249486 | 1.458 | .972 | .729 | .5832 |
| | D | * | 5.832000 | 3.332571 | 2.16 | 1.44 | 1.08 | .864 |
| | E | * | 7.873200 | 4.498971 | 2.916 | 1.944 | 1.458 | 1.1664 |
| | F | * | 9.914400 | 5.665371 | 3.672 | 2.448 | 1.836 | 1.4688 |
| | A | * | 2.235600 | 1.277486 | .8280000 | .5520000 | .4140000 | .3312000 |
| | B | * | 2.818800 | 1.610743 | 1.044000 | .6950000 | .5220000 | .4176000 |
| 2 NOR | C | * | 3.790800 | 2.166171 | 1.404 | .936 | .702 | .5616 |
| | D | * | 5.540400 | 3.165943 | 2.052 | 1.368 | 1.026 | .8208 |
| | E | * | 7.581600 | 4.332343 | 2.808 | 1.872 | 1.404 | 1.1232 |
| | F | * | 9.622800 | 5.498743 | 3.564 | 2.376 | 1.782 | 1.4256 |
| | A | * | 2.818800 | 1.610743 | 1.044000 | .6960000 | .5220000 | .4176000 |
| | B | * | 3.839400 | 2.193943 | 1.422000 | .9480000 | .7110000 | .5688000 |
| | C | * | 5.394600 | 3.082629 | 1.998 | 1.332 | .999 | .7992 |
| | D | * | 7.873200 | 4.498971 | 2.916 | 1.944 | 1.458 | 1.1664 |
| | E | * | 10.78920 | 6.165257 | 3.996 | 2.664 | 1.998 | 1.5984 |
| | F | * | 13.70520 | 7.831543 | 5.076 | 3.384 | 2.538 | 2.0304 |
| | A | * | 3.402000 | 1.944 | 1.260000 | .8400000 | .6300000 | .5040000 |
| | B | * | 4.860000 | 2.777143 | 1.800000 | 1.200000 | .9000000 | .7200000 |
| 4 NOR | C | * | 6.998400 | 3.999086 | 2.592 | 1.728 | 1.296 | 1.0368 |
| | D | * | 10.20600 | 5.832000 | 3.78 | 2.52 | 1.89 | 1.512 |
| | E | * | 13.99680 | 7.998171 | 5.184 | 3.456 | 2.592 | 2.0736 |
| | F | * | 17.78760 | 10.16434 | 6.588 | 4.392 | 3.294 | 2.6352 |

TABLE VI

PV INTC .18
WIDT 4
CAP/U2 .033 (MTL 1)

| INTER-CONNECT LENGTH | DRIVER SIZES | | | | | | |
|---|---|---|---|---|---|---|---|
| | C 4 | D 6 | E 8 | F 10 | 20 | 40 | 60 |
| 100 | .594 | .396 | .297 | .2376 | .1188 | .0594 | .0396 |
| 200 | 1.188 | .792 | .594 | .4752 | .2376 | .1188 | .0792 |
| 300 | 1.782 | 1.188 | .891 | .7128 | .3564 | .1782 | .1188 |
| 400 | 2.376 | 1.584 | 1.188 | .9504 | .4752 | .2376 | .1584 |
| 500 | 2.97 | 1.98 | 1.485 | 1.188 | .594 | .297 | .198 |
| 600 | 3.564 | 2.376 | 1.782 | 1.4256 | .7128 | .3564 | .2376 |
| 700 | 4.158 | 2.772 | 2.079 | 1.6632 | .8316 | .4158 | .2772 |
| 800 | 4.752 | 3.168 | 2.376 | 1.9008 | .9504 | .4752 | .3168 |
| 900 | 5.346 | 3.564 | 2.673 | 2.1384 | 1.0692 | .5346 | .3564 |
| 1000 | 5.94 | 3.96 | 2.97 | 2.376 | 1.188 | .594 | .396 |
| 1100 | 6.534 | 4.356 | 3.267 | 2.6136 | 1.3068 | .6534 | .4356 |
| 1200 | 7.128 | 4.752 | 3.564 | 2.8512 | 1.4256 | .7128 | .4752 |
| 1300 | 7.722 | 5.148 | 3.861 | 3.0888 | 1.5444 | .7722 | .5148 |
| 1400 | 8.316 | 5.544 | 4.158 | 3.3264 | 1.6632 | .8316 | .5544 |
| 1500 | 8.91 | 5.94 | 4.455 | 3.564 | 1.782 | .891 | .594 |
| 1600 | 9.504 | 6.336 | 4.752 | 3.8016 | 1.9008 | .9504 | .6336 |
| 1700 | 10.098 | 6.732 | 5.049 | 4.0392 | 2.0196 | 1.0098 | .6732 |
| 1800 | 10.692 | 7.128 | 5.346 | 4.2768 | 2.1384 | 1.0692 | .7128 |
| 1900 | 11.286 | 7.524 | 5.643 | 4.5144 | 2.2572 | 1.1286 | .7524 |

TABLE VII

| RC | .00006 | | | | | | |
|---|---|---|---|---|---|---|---|
| SUM | .025 | | | | | | |
| = | 4 | | | | | | |
| | | | CAP LOAD | | | | |
| R LENGTH | .025 | .05 | .075 | .1 | .15 | .2 | .3 |
| 100 | .023125 | .03875 | .054375 | .07 | .10125 | .1325 | .195 |
| 200 | .06125 | .0925 | .12375 | .155 | .2175 | .28 | .405 |
| 300 | .114375 | .16125 | .208125 | .255 | .34875 | .4425 | .63 |
| 400 | .1825 | .245 | .3075 | .37 | .495 | .62 | .87 |
| 500 | .265625 | .34375 | .421875 | .5 | .65625 | .8125 | 1.125 |
| 600 | .36375 | .4575 | .55125 | .645 | .8325 | 1.02 | 1.395 |
| 700 | .476875 | .58625 | .695625 | .805 | 1.02375 | 1.2425 | 1.68 |
| 800 | .605 | .73 | .855 | .98 | 1.23 | 1.48 | 1.98 |
| 900 | .748125 | .88875 | 1.029375 | 1.17 | 1.45125 | 1.7325 | 2.295 |
| 1000 | .90625 | 1.0625 | 1.21875 | 1.375 | 1.6875 | 2 | 2.625 |
| 1100 | 1.079375 | 1.25125 | 1.423125 | 1.595 | 1.93875 | 2.2825 | 2.97 |
| 1200 | 1.2675 | 1.455 | 1.6425 | 1.83 | 2.205 | 2.58 | 3.33 |
| 1300 | 1.470625 | 1.67375 | 1.876875 | 2.08 | 2.48625 | 2.8925 | 3.705 |
| 1400 | 1.68875 | 1.9075 | 2.12625 | 2.345 | 2.7825 | 3.22 | 4.095 |
| 1500 | 1.921875 | 2.15625 | 2.390625 | 2.625 | 3.09375 | 3.5625 | 4.5 |
| 1600 | 2.17 | 2.42 | 2.67 | 2.92 | 3.42 | 3.92 | 4.92 |
| 1700 | 2.433125 | 2.69875 | 2.964375 | 3.23 | 3.76125 | 4.2925 | 5.355 |
| 1800 | 2.71125 | 2.9925 | 3.27375 | 3.555 | 4.1175 | 4.68 | 5.805 |
| 1900 | 3.004375 | 3.30125 | 3.598125 | 3.895 | 4.48875 | 5.0825 | 6.27 |

TABLE VIII

| PC = .18 | | | | | | | | |
|---|---|---|---|---|---|---|---|---|
| NODE # | DRIVER WIDTH (MCRN) | CAP DIFF (FF) | RESIST (OHMS) | CAP LOAD (FF) | RC TIME (NS) | ACTIVE FOM | ACTIVE TIME (NS) | DELAY TIME (NS) |
| 1 | 4 | 31.47 | | 30 | 0 | .0650724 | 2.76615 | 2.76615 |
| 2 | 50 | 333.575 | 5000 | 337.76 | 1.6888 | .0744785 | 2.416806 | 4.105606 |

TABLE VIII-continued

| | | | | | | | | |
|---|---|---|---|---|---|---|---|---|
| 3 | 6 | 55.255 | 222 | 0 | .0216407 | 8.317650 | 8.317650 | |
| 4 | 4 | 31.47 | 33.84 | 0 | .0612464 | 2.93895 | 2.93895 | |
| 5 | 2 | 36.67 | 17.76 | 0 | .0367444 | 4.8987 | 4.8987 | |
| | | | SBTTL T = | 1.6888 | NS | 21.33826 | 23.02706 | |
| | | | TOTAL T = | | | | 23.02706 | NS |

PC = .18

| NODE # | DRIVER WIDTH (MCRN) | CAP DIFF (FF) | RESIST (OHMS) | CAP LOAD (FF) | RC TIME (NS) | ACTIVE FOM | ACTIVE TIME (NS) | DELAY TIME (NS) |
|---|---|---|---|---|---|---|---|---|
| 1 | 4 | 31.47 | | 30 | 0 | .0650724 | 2.76615 | 1.76615 |
| 2 | 21 | 143.1175 | 5000 | 337.76 | 1.6888 | .0436702 | 5.810607 | 5.810607 |
| 3 | 6 | 55.255 | | 93.24 | 0 | .0404054 | 4.454850 | 4.454850 |
| 4 | 4 | 31.47 | | 33.84 | 0 | .0612464 | 2.93895 | 2.93895 |
| 5 | 2 | 36.67 | | 17.76 | 0 | .0367444 | 4.8987 | 4.8987 |
| | | | SBTTL T = | 1.6888 | NS | | 19.18046 | 20.86926 |
| | | | TOTAL T = | | | | 20.86926 | NS |

TABLE IX

*ALL CAPACITANCE IN FEMPTO FARADS
"MICRONS" IS ABBREVIATED "U"

DIFFUSION CAPACITANCE AREA = .14FF/UU
PERI = .4FF/U
LENGTH

| (MICRONS) | 3 | 4 | 5 | 6 | 7 | 8 | 9 | 10 | 12 | 14 |
|---|---|---|---|---|---|---|---|---|---|---|
| WIDTH | | | | | | | | | | |
| 1 | 4 | 5 | 6 | 6 | 7 | 8 | 9 | 10 | 12 | 14 |
| 2 | 5 | 6 | 7 | 8 | 9 | 10 | 11 | 12 | 15 | 17 |
| 3 | 6 | 7 | 9 | 10 | 11 | 12 | 13 | 15 | 17 | 19 |
| 4 | 7 | 9 | 10 | 11 | 13 | 14 | 15 | 17 | 20 | 22 |
| 5 | 9 | 10 | 12 | 13 | 15 | 16 | 18 | 19 | 22 | 25 |
| 6 | 10 | 11 | 13 | 15 | 16 | 18 | 20 | 21 | 24 | 28 |
| 7 | 11 | 13 | 15 | 16 | 18 | 20 | 22 | 23 | 27 | 31 |
| 8 | 12 | 14 | 16 | 18 | 20 | 22 | 24 | 26 | 29 | 33 |
| 9 | 13 | 15 | 18 | 20 | 22 | 24 | 26 | 28 | 32 | 36 |
| 10 | 15 | 17 | 19 | 21 | 23 | 26 | 28 | 30 | 34 | 39 |
| 11 | 16 | 18 | 21 | 23 | 25 | 28 | 30 | 32 | 37 | 42 |
| 12 | 17 | 20 | 22 | 24 | 27 | 29 | 32 | 34 | 39 | 44 |
| 13 | 18 | 21 | 24 | 26 | 29 | 31 | 34 | 37 | 42 | 47 |
| 14 | 19 | 22 | 25 | 28 | 31 | 33 | 36 | 39 | 44 | 50 |
| 15 | 21 | 24 | 27 | 29 | 32 | 35 | 38 | 41 | 47 | 53 |

TABLE X

GATE CAPACITANCE
CAP/UU = .4FF

| (MICRONS) | 3 | 3.5 | 4 | 4.5 | 5 | 5.5 | 6 | 8 | 10 | 12 | 15 |
|---|---|---|---|---|---|---|---|---|---|---|---|
| WIDTH | | | | | | | | | | | |
| 4 | 5 | 6 | 6 | 7 | 8 | 9 | 10 | 13 | 16 | 19 | 24 |
| 5 | 6 | 7 | 8 | 9 | 10 | 11 | 12 | 16 | 20 | 24 | 30 |
| 6 | 7 | 8 | 10 | 11 | 12 | 13 | 14 | 19 | 24 | 29 | 36 |
| 7 | 8 | 10 | 11 | 13 | 14 | 15 | 17 | 22 | 28 | 34 | 42 |
| 8 | 10 | 11 | 13 | 14 | 16 | 18 | 19 | 26 | 32 | 38 | 48 |
| 9 | 11 | 13 | 14 | 16 | 18 | 20 | 22 | 29 | 36 | 43 | 54 |
| 10 | 12 | 14 | 16 | 18 | 20 | 22 | 24 | 32 | 40 | 48 | 60 |
| 11 | 13 | 15 | 18 | 20 | 22 | 24 | 26 | 35 | 44 | 53 | 66 |
| 12 | 14 | 17 | 19 | 22 | 24 | 26 | 29 | 38 | 48 | 58 | 72 |
| 13 | 16 | 18 | 21 | 23 | 26 | 29 | 31 | 42 | 52 | 62 | 78 |
| 14 | 17 | 20 | 22 | 25 | 28 | 31 | 34 | 45 | 56 | 67 | 84 |
| 15 | 18 | 21 | 24 | 27 | 30 | 33 | 36 | 48 | 60 | 72 | 90 |
| 16 | 19 | 22 | 26 | 29 | 32 | 35 | 38 | 51 | 64 | 77 | 96 |
| 17 | 20 | 24 | 27 | 31 | 34 | 37 | 41 | 54 | 68 | 82 | 102 |
| 18 | 22 | 25 | 29 | 32 | 36 | 40 | 43 | 58 | 72 | 86 | 108 |

TABLE XI

*ALL CAPACITANCE IN FEMPTO FARADS
METAL ROUTING CAPACITANCE
CAP/UU = .036FF

| (MICRONS) | 3 | 4 | 5 | 6 | 7 | 8 | 9 | 10 | 11 | 12 |
|---|---|---|---|---|---|---|---|---|---|---|
| LENGTH | | | | | | | | | | |
| 10 | 1 | 1 | 2 | 2 | 3 | 3 | 3 | 4 | 4 | 4 |
| 25 | 3 | 4 | 5 | 5 | 6 | 7 | 8 | 9 | 10 | 11 |
| 50 | 5 | 7 | 9 | 11 | 13 | 14 | 16 | 18 | 20 | 22 |
| 75 | 8 | 11 | 14 | 16 | 19 | 22 | 24 | 27 | 30 | 32 |
| 100 | 11 | 14 | 18 | 22 | 25 | 29 | 32 | 36 | 40 | 43 |
| 150 | 16 | 22 | 27 | 32 | 38 | 43 | 49 | 54 | 59 | 65 |
| 200 | 22 | 29 | 36 | 43 | 50 | 58 | 65 | 72 | 79 | 86 |
| 250 | 27 | 36 | 45 | 54 | 63 | 72 | 81 | 90 | 99 | 108 |
| 300 | 32 | 43 | 54 | 65 | 76 | 86 | 97 | 108 | 119 | 130 |
| 350 | 38 | 50 | 63 | 76 | 88 | 101 | 113 | 126 | 139 | 151 |
| 400 | 43 | 58 | 72 | 86 | 101 | 115 | 130 | 144 | 158 | 173 |
| 450 | 49 | 65 | 81 | 97 | 113 | 130 | 146 | 162 | 178 | 194 |
| 500 | 54 | 72 | 90 | 108 | 126 | 144 | 162 | 180 | 198 | 216 |
| 550 | 59 | 79 | 99 | 119 | 139 | 158 | 178 | 198 | 218 | 238 |
| 600 | 65 | 86 | 108 | 130 | 151 | 173 | 194 | 216 | 238 | 259 |

TABLE XII

POLY ROUTING CAPACITANCE
CAP/UU = .08FF

| (MICRONS) | 3 | 4 | 5 | 6 | 7 | 8 | 9 | 10 | 11 | 12 |
|---|---|---|---|---|---|---|---|---|---|---|
| LENGTH | | | | | | | | | | |
| 10 | 2 | 3 | 4 | 5 | 6 | 6 | 7 | 8 | 9 | 10 |

TABLE XII-continued

POLY ROUTING CAPACITANCE
CAP/UU = .08FF

| (MICRONS) | WIDTH | | | | | | | | | |
|---|---|---|---|---|---|---|---|---|---|---|
| | 3 | 4 | 5 | 6 | 7 | 8 | 9 | 10 | 11 | 12 |
| 25 | 6 | 8 | 10 | 12 | 14 | 16 | 18 | 20 | 22 | 24 |
| 50 | 12 | 16 | 20 | 24 | 28 | 32 | 36 | 40 | 44 | 48 |
| 75 | 18 | 24 | 30 | 36 | 42 | 48 | 54 | 60 | 66 | 72 |
| 100 | 24 | 32 | 40 | 48 | 56 | 64 | 72 | 80 | 88 | 96 |
| 150 | 36 | 48 | 60 | 72 | 84 | 96 | 108 | 120 | 132 | 144 |
| 200 | 48 | 64 | 80 | 96 | 112 | 128 | 144 | 160 | 176 | 192 |
| 250 | 60 | 80 | 100 | 120 | 140 | 160 | 180 | 200 | 220 | 240 |
| 300 | 72 | 96 | 120 | 144 | 168 | 192 | 216 | 240 | 264 | 288 |
| 350 | 84 | 112 | 140 | 168 | 196 | 224 | 252 | 280 | 308 | 336 |
| 400 | 96 | 188 | 160 | 192 | 224 | 256 | 288 | 320 | 352 | 384 |
| 450 | 108 | 144 | 180 | 216 | 252 | 288 | 324 | 360 | 396 | 432 |
| 500 | 120 | 160 | 200 | 240 | 280 | 320 | 360 | 400 | 440 | 480 |
| 550 | 132 | 176 | 220 | 264 | 308 | 352 | 396 | 440 | 484 | 528 |
| 600 | 144 | 192 | 240 | 288 | 336 | 384 | 432 | 480 | 528 | 576 |

TABLE XIII

| DESCRIPTION | SIZE | CAPACITANCE | TABLE |
|---|---|---|---|
| P+ DIFFUSION | 14 × 6.5 | 29.5 | 7.3 |
| N+ DIFFUSION | 4 × 3 | 7 | 7.3 |
| | 4 × 3 | 7 | 7.3 |
| | 5 × 5 | 12 | 7.3 |
| GATES | 4 × 4 | 6 | 7.4 |
| | 7 × 3 | 8 | 7.4 |
| | 4 × 3 | 5 | 7.4 |
| | 4 × 3 | 5 | 7.4 |
| METAL ROUTING | 19 × 6 | 4 | 7.5 |
| | 14 × 6 | 3.5 | 7.5 |
| | 8.5 × 4 | 1 | 7.5 |
| POLY ROUTING | 11 × 8 | 6 | 7.6 |
| | 13 × 6 | 6.5 | 7.6 |
| | 15 × 3 | 3 | 7.6 |
| | 48 × 3 | 12 | 7.6 |
| | 45 × 3 | 11 | 7.6 |
| | 15 × 3 | 3 | 7.6 |
| | 6 × 4 | 2 | 7.6 |
| TOTAL = | | 131.5FF | |

Effective driver channel width = 2.6 microns $POM = \frac{W}{C} => POM = \frac{2.6}{131.5} => .0197719$

We claim:

1. A computer implemented method of creating a flow chart of a two-phase logic circuit that responds to both high and low non-overlapping phases of a clock signal for data transfer by the logic circuit, wherein the computer comprises a data processing system having a memory associated therewith for storing data utilizable by the data processing system, the method comprising:
    defining a plurality of logic circuit functional elements, each logic circuit functional element being responsive to the high phase of the clock signal, the low phase of the clock signal, or both the high and the low phases of the clock signal for transfer of data by said logic circuit functional element;
    storing in the memory of the data processing system signal type data that define a plurality of signal types that categorize a signal by its timing characteristics relative to the high and low phases of the clock signal and by the logic circuit functional element that generates said signal;
    storing in the memory of the data processing system utilization data that define a set of rules for utilizing the signal types in conjunction with the logic circuit functional elements such that each logic circuit functional element generates an output signal corresponding to one of the signal types in response to permissible input signal types selected from the plurality of signal types;
    defining a plurality of flow chart symbols that are interconnected in accordance with the utilization data to provide a behavioral flow chart of the two-phase logic circuit, each flow chart symbol corresponding to a logic circuit functional element.

2. A digital computer implemented method as in claim 1 and including the further step of converting the behavioral flow chart to a corresponding set of Boolean equations.

3. A digital computer implemented method as in claim 2 and including the further step of converting the Boolean equations to a corresponding logic diagram.

4. A method of designing an integrated circuit that includes a plurality of functional elements and that implements a two-phase logic functions by responding to both high and low non-overlapping phases of a clock signal, the method comprising:
    defining a plurality of signal types that categorize a signal by its timing characteristics relative to the high and low phases of the clock signal and by the functional element that generates said signal;
    defining a set of utilization rules for utilizing the signal types in conjunction with the functional elements such that each functional element generates an output signal corresponding to one of the signal types in response to permissible input signal types selected from the plurality of signal types;
    defining a technical specification for the two-phase logic function;
    defining a plurality of flow chart symbols that are interconnected in accordance with the utilization rules to provide a behavioral flow chart of the two-phase logic circuit, each flow chart symbol corresponding to a functional element of the integrated circuit;
    converting the behavioral flow chart into a corresponding set of Boolean equations;
    converting the set of Boolean equations into a corresponding logic diagram comprising a plurality of interconnected logic elements; and
    converting the interconnected logic elements into corresponding interconnected device networks utilizing Figures of Merit such that the interconnected device networks provide a schematic circuit diagram that implements the two-phase logic function in accordance with the technical specification.

5. A method as in claim 4 and wherein the step of converting the logic elements into corresponding device networks includes utilization of predefined performance constants for sizing the at least one integrated circuit device to optimize the speed of the two-phase logic function.

* * * * *